(12) United States Patent
Yabu et al.

(10) Patent No.: US 10,842,010 B2
(45) Date of Patent: Nov. 17, 2020

(54) EXTREME ULTRAVIOLET LIGHT GENERATION SYSTEM

(71) Applicant: Gigaphoton Inc., Tochigi (JP)

(72) Inventors: Takayuki Yabu, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 26 days.

(21) Appl. No.: 16/434,196

(22) Filed: Jun. 7, 2019

(65) Prior Publication Data

US 2019/0313519 A1    Oct. 10, 2019

Related U.S. Application Data

(63) Continuation of application No. PCT/JP2017/000845, filed on Jan. 12, 2017.

(51) Int. Cl.
*H05G 2/00* (2006.01)
*G02B 26/08* (2006.01)
*G03F 7/20* (2006.01)

(52) U.S. Cl.
CPC ......... *H05G 2/008* (2013.01); *G02B 26/0816* (2013.01); *G03F 7/20* (2013.01); *H05G 2/00* (2013.01)

(58) Field of Classification Search
CPC . H05G 2/008; H05G 2/00; G03F 7/20; G02B 26/0816; G02B 26/105

See application file for complete search history.

(56) References Cited

U.S. PATENT DOCUMENTS

| 8,242,472 B2 * | 8/2012 | Moriya | H01S 3/1305 250/504 R |
| 2007/0001130 A1 * | 1/2007 | Bykanov | H05G 2/001 250/493.1 |

(Continued)

FOREIGN PATENT DOCUMENTS

| JP | 2012-178534 A | 9/2012 |
| JP | 2012-199512 A | 10/2012 |

(Continued)

OTHER PUBLICATIONS

International Search Report issued in PCT/JP2017/000845; dated Mar. 28, 2017.

(Continued)

*Primary Examiner* — Marcus H Taningco
(74) *Attorney, Agent, or Firm* — Studebaker & Brackett PC

(57) ABSTRACT

An extreme ultraviolet light generation system includes: a target supply unit configured to output a target toward a predetermined region; a drive laser configured to output a drive laser beam in a first duration; a guide laser configured to output a guide laser beam; a beam combiner configured to substantially align the optical path axes of the drive and guide laser beams and output the laser beams; a laser beam focusing optical system configured to focus the laser beams output from the beam combiner to the predetermined region; an actuator configured to change the focusing positions of the laser beams through the laser beam focusing optical system; an optical sensor configured to detect reflected light of the guide laser beam from the target; and a control unit configured to control the actuator so that the light amount of the reflected light thus detected increases in a second duration.

15 Claims, 32 Drawing Sheets

(56) References Cited

U.S. PATENT DOCUMENTS

| | | | |
|---|---|---|---|
| 2010/0140512 A1* | 6/2010 | Suganuma | G03F 7/70033 |
| | | | 250/504 R |
| 2011/0141865 A1* | 6/2011 | Senekerimyan | G01J 1/429 |
| | | | 369/47.15 |
| 2012/0228525 A1 | 9/2012 | Moriya et al. | |
| 2013/0037693 A1 | 2/2013 | Moriya et al. | |
| 2013/0043401 A1 | 2/2013 | Graham et al. | |
| 2013/0119232 A1 | 5/2013 | Moriya et al. | |
| 2015/0041659 A1* | 2/2015 | Graham | G01J 1/0448 |
| | | | 250/348 |
| 2015/0334814 A1* | 11/2015 | Moriya | G03F 7/70033 |
| | | | 250/504 R |

FOREIGN PATENT DOCUMENTS

| | | | | |
|---|---|---|---|---|
| JP | 2013-513929 A | 4/2013 | | |
| JP | 2013-105725 A | 5/2013 | | |
| JP | 2014-531743 A | 11/2014 | | |
| WO | WO-2016147910 A1 * | 9/2016 | | H05G 2/00 |

OTHER PUBLICATIONS

International Preliminary Report on Patentability and Written Opinion issued in PCT/JP2017/000845; dated Jul. 16, 2019.

* cited by examiner

EXTREME ULTRAVIOLET LIGHT GENERATION SYSTEM

CROSS-REFERENCE TO RELATED APPLICATIONS

The present application is a continuation application of International Application No. PCT/JP2017/000845 filed on Jan. 12, 2017. The content of the application is incorporated herein by reference in its entirety.

BACKGROUND

1. Technical Field

The present disclosure relates to an extreme ultraviolet light generation system.

2. Related Art

Recently, miniaturization of semiconductor processes has involved increasing miniaturization of transfer patterns for use in photolithography of the semiconductor processes. In the next generation, microfabrication at 70 nm to 45 nm and further microfabrication at 32 nm or less will be required. Thus, to satisfy the requirement for the microfabrication at, for example, 32 nm or less, development of an exposure apparatus is expected including a combination of an extreme ultraviolet light generation apparatus configured to generate an extreme ultraviolet (EUV) light having a wavelength of about 13 nm and reduced projection reflection optics.

Three types of EUV light generation apparatuses have been proposed: a laser produced plasma (LPP) apparatus using plasma generated by irradiating a target substance with a pulse laser beam, a discharge produced plasma (DPP) apparatus using plasma generated by discharge, and a synchrotron radiation (SR) apparatus using synchrotron radiation light.

LIST OF DOCUMENTS

Patent Documents

Patent Document 1: US Published Patent Application No. 2013/119232

SUMMARY

An extreme ultraviolet light generation system according to an aspect of the present disclosure includes a target supply unit, a drive laser, a guide laser, a beam combiner, a laser beam focusing optical system, an actuator, an optical sensor, and a control unit. The target supply unit outputs a target toward a predetermined region. The drive laser outputs a drive laser beam in a duration in which a burst signal input from an external device is in a first state. The guide laser outputs a guide laser beam. The beam combiner substantially aligns the optical path axis of the drive laser beam output from the drive laser and the optical path axis of the guide laser beam output from the guide laser, and outputs the drive laser beam and the guide laser beam. The laser beam focusing optical system focuses the drive laser beam and the guide laser beam output from the beam combiner to the predetermined region. The actuator changes the focusing positions of the drive laser beam and the guide laser beam through the laser beam focusing optical system. The optical sensor detects reflected light of the guide laser beam from the target. The control unit controls the actuator so that the light amount of the reflected light detected by the optical sensor increases in a duration in which the burst signal is in a second state different from the first state.

BRIEF DESCRIPTION OF THE DRAWINGS

Some embodiments of the present disclosure will be described below merely by way of example with reference to the accompanying drawings.

DESCRIPTION OF EMBODIMENTS

Figure 1:
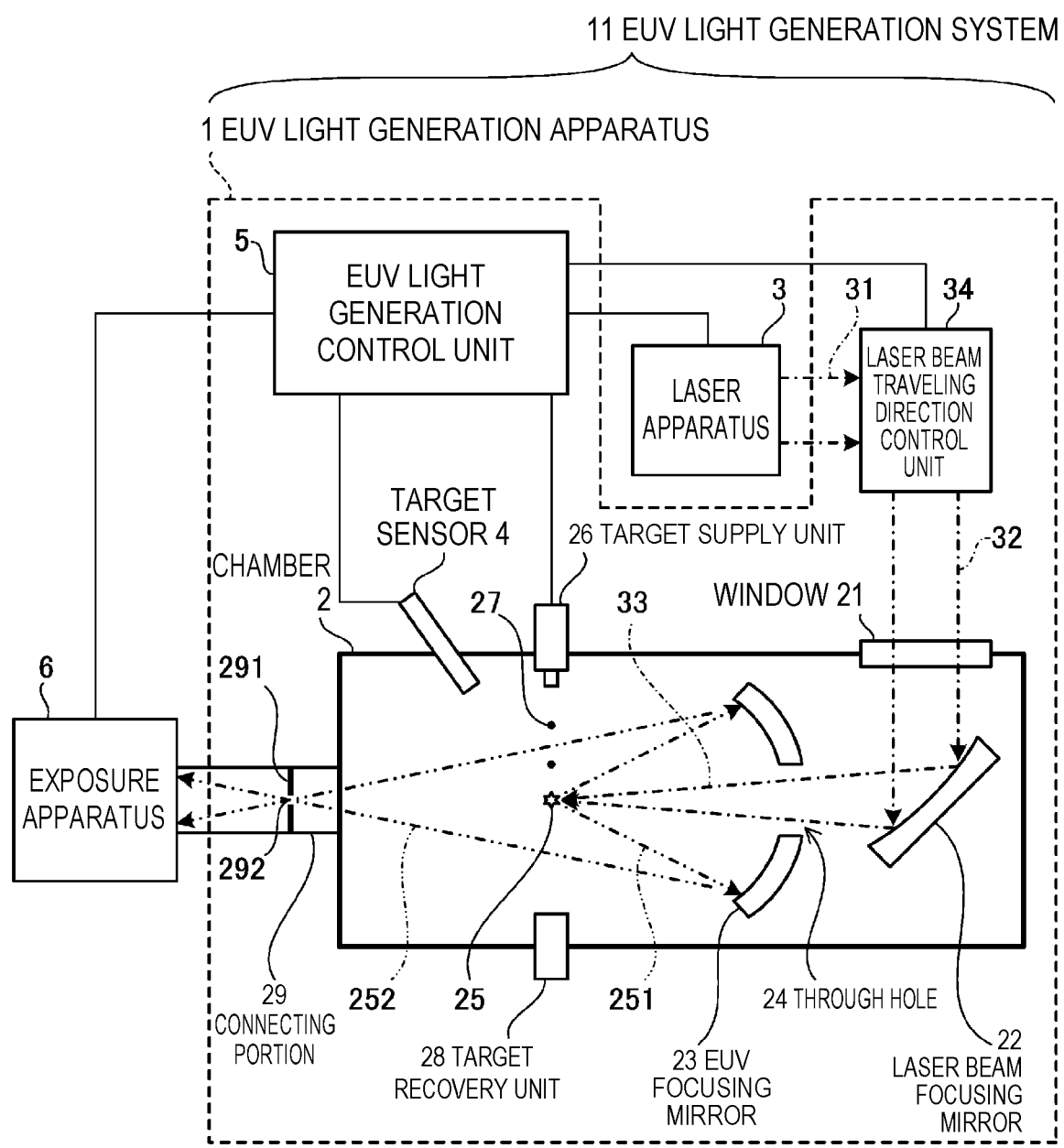
FIG. 1 schematically illustrates the configuration of an exemplary LPP EUV light generation system.

<Contents>
1. General description of extreme ultraviolet light generation system
  1.1 Configuration
  1.2 Operation
2. EUV light generation system according to comparative example
  2.1 Configuration
    2.1.1 Target supply unit
    2.1.2 Laser apparatus
    2.1.3 Laser beam traveling direction control unit
    2.1.4 Laser beam focusing optical system and EUV focusing mirror
    2.1.5 EUV optical sensor
  2.2 Operation
    2.2.1 Target outputting
    2.2.2 Pulse laser beam outputting
    2.2.3 Pulse laser beam transmission
    2.2.4 Pulse laser beam focusing
    2.2.5 Control of laser beam optical path axis based on EUV barycenter position
  2.3 Problem
3. EUV light generation system including optical sensor 80
  3.1 Configuration
  3.2 Operation
    3.2.1 Main process
    3.2.2 Processing of controlling focusing position in X direction to maximize light amount of reflected light
  3.3 Effect
4. EUV light generation system in which warning is issued early
  4.1 Processing of controlling focusing position in X direction to maximize light amount of reflected light
5. EUV light generation system in which stage step width is changeable
  5.1 Processing of controlling focusing position in X direction to maximize light amount of reflected light
    5.1.1 Processing of controlling stage in X direction in which light amount L of reflected light increases
    5.1.2 Processing of scanning stage in X direction to search for focusing position at which reflected light can be detected
  5.2 Effect
6. EUV light generation system in which focusing position in Y direction is controlled
  6.1 Main process
    6.1.1 Processing of controlling focusing position in Y direction so that bright spot position of reflected light approaches target position
  6.2 Effect
7. EUV light generation system in which control of focusing position in X direction is skipped
  7.1 Main process
8. EUV light generation system in which mirror of laser beam traveling direction control unit is controlled
  8.1 Configuration
  8.2 Operation
    8.2.1 Processing of controlling focusing position in X direction to maximize light amount of reflected light
      8.2.1.1 Processing of controlling mirror tilt angle in θx direction in which light amount L of reflected light increases
      8.2.1.2 Processing of scanning mirror tilt angle in θx direction to search for focusing position at which reflected light can be detected
  8.3 Effect
9. EUV light generation system in which focusing position in Y direction is controlled by mirror of laser beam traveling direction control unit 9.1 Operation
9.1.1 Processing of controlling focusing position in Y direction so that bright spot position of reflected light approaches target position
10. EUV light generation system in which stage of laser beam focusing optical system and mirror of laser beam traveling direction control unit are controlled
   10.1 Configuration
   10.2 Operation
   10.2.1 Processing of controlling focusing position in X direction to maximize light amount of reflected light
      10.2.1.1 Processing of controlling mirror tilt angle in θx direction in which light amount L of reflected light increases and then controlling stage in X direction
         10.2.1.1.1 Stage control subroutine
   10.3 Effect
11. EUV light generation system in which decrease of light amount L of reflected light is monitored
   11.1 Configuration
   11.2 Operation
   11.3 Effect
12. EUV light generation system in which focusing position in Y direction is controlled when control of focusing position in X direction is skipped
   12.1 Main process
   12.2 Effect
13. EUV light generation system in which target sensor used in burst-on duration is also used as optical sensor used in burst-off duration
   13.1 Configuration
   13.2 Operation
      13.2.1 Main process
   13.3 Effect
14. Supplementation Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. General Description of EUV Light Generation system
1.1 Configuration

FIG. 1 schematically illustrates the configuration of an exemplary LPP EUV light generation system. This EUV light generation apparatus 1 is used together with at least one laser apparatus 3. In the present application, a system including the EUV light generation apparatus 1 and the laser apparatus 3 is referred to as an EUV light generation system 11. As illustrated in FIG. 1 and described below in detail, the EUV light generation apparatus 1 includes a chamber 2 and a target supply unit 26. The chamber 2 is sealable. The target supply unit 26 is attached through, for example, the wall of the chamber 2. The material of a target substance output from the target supply unit 26 may include tin, terbium, gadolinium, lithium, xenon, or any combination of any two or more thereof, but is not limited thereto.

The wall of the chamber 2 has at least one through hole. The through hole is provided with a window 21. A pulse laser beam 32 output from the laser apparatus 3 transmits through the window 21. For example, an EUV focusing mirror 23 having a reflected surface with a spheroidal shape is disposed inside the chamber 2. The EUV focusing mirror 23 has first and second focal points. For example, a multi-layer reflective film including alternately stacked molybdenum and silicon is formed on the surface of the EUV focusing mirror 23. The EUV focusing mirror 23 is disposed so that, for example, the first focal point is positioned in a plasma generation region 25 and the second focal point is positioned at an intermediate focus point (IF) 292. A through hole 24 is provided at a central part of the EUV focusing mirror 23. A pulse laser beam 33 passes through the through hole 24.

The EUV light generation apparatus 1 includes an EUV light generation control unit 5 and a target sensor 4. The target sensor 4 has an image capturing function, and detects the existence, locus, position, speed, and the like of a target 27.

The EUV light generation apparatus 1 includes a connecting portion 29 through which the inside of the chamber 2 and the inside of an exposure apparatus 6 are communicated with each other. A wall 291 through which an aperture is formed is provided inside the connecting portion 29. The wall 291 is disposed so that the aperture is positioned at the second focal position of the EUV focusing mirror 23.

In addition, the EUV light generation apparatus 1 includes a laser beam traveling direction control unit 34, a laser beam focusing mirror 22, and a target recovery unit 28 for collecting the target 27. The laser beam traveling direction control unit 34 includes an optical element for defining the traveling direction of a laser beam, and an actuator for adjusting the position, posture, or the like of the optical element.

1.2 Operation

As illustrated in FIG. 1, a pulse laser beam 31 output from the laser apparatus 3 passes through the laser beam traveling direction control unit 34 and enters the chamber 2 through the window 21 as the pulse laser beam 32. The pulse laser beam 32 travels along at least one laser beam path in the chamber 2, and is reflected by the laser beam focusing mirror 22 and incident on the at least one target 27 as the pulse laser beam 33.

The target supply unit 26 outputs the target 27 toward the plasma generation region 25 inside the chamber 2. The target 27 is irradiated with at least one pulse included in the pulse laser beam 33. Plasma is generated from the target 27 irradiated with the pulse laser beam, and radiation light 251 is radiated from the plasma. The EUV focusing mirror 23 reflects EUV light included in the radiation light 251 at a reflectance higher than that for light in another wavelength band. Reflected light 252 including the EUV light reflected by the EUV focusing mirror 23 is focused at the intermediate focus point 292 and output to the exposure apparatus 6. One target 27 may be irradiated with a plurality of pulses included in the pulse laser beam 33.

The EUV light generation control unit 5 collectively controls the entire EUV light generation system 11. The EUV light generation control unit 5 processes, for example, image data of the target 27 captured by the target sensor 4. The EUV light generation control unit 5 controls, for example, the output timing of the target 27 and the output direction of the target 27. In addition, the EUV light generation control unit 5 controls, for example, the oscillation timing of the laser apparatus 3, the traveling direction of the pulse laser beam 32, and the focusing position of the pulse laser beam 33. These various kinds of control are merely exemplary, and other control may be added as necessary.

2. EUV Light Generation System According to Comparative Example

2.1 Configuration

Figure 2:
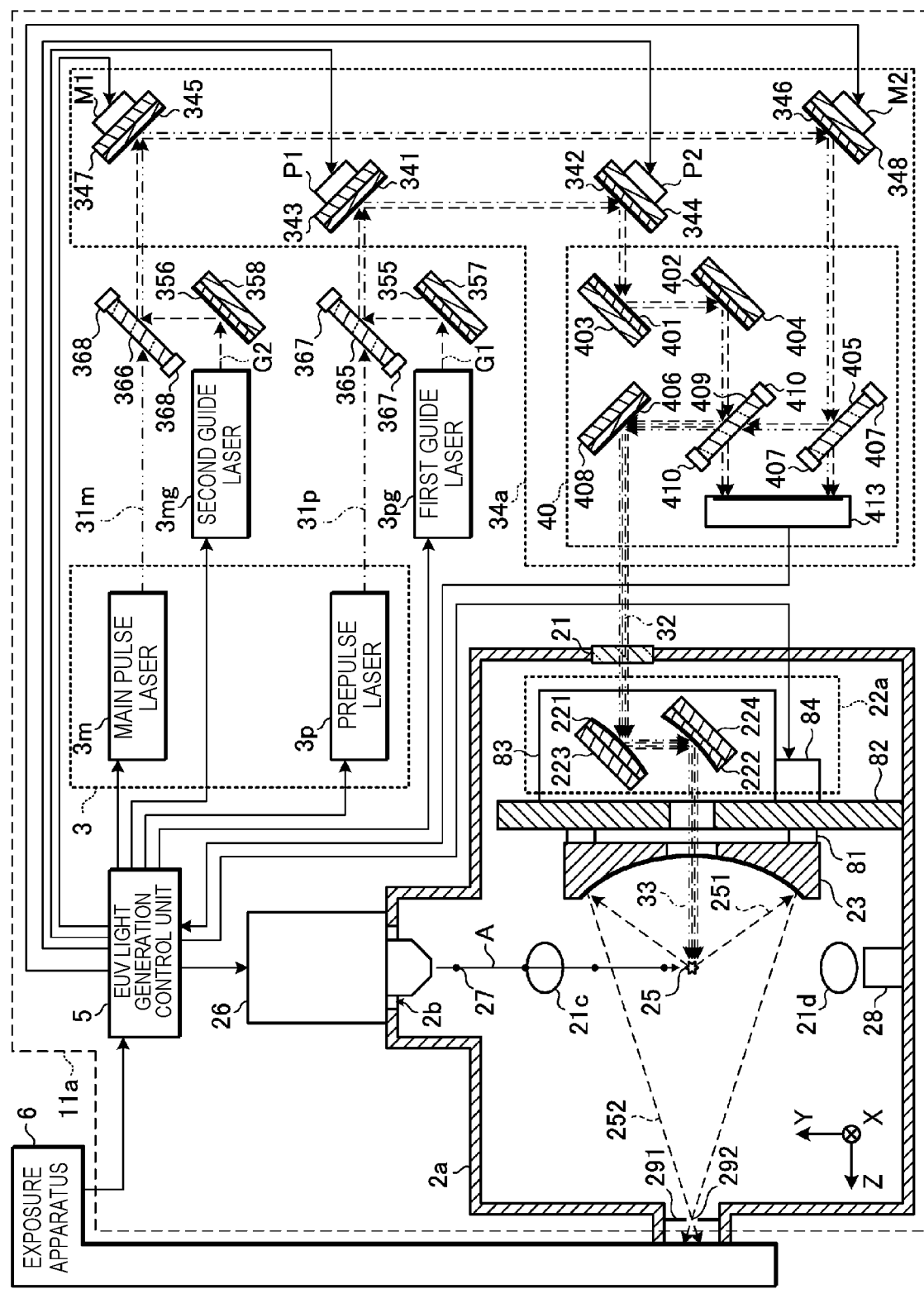
FIG. 2 is a partially cross-sectional view illustrating the configuration of an EUV light generation system 11a according to a comparative example.
Figure 3:
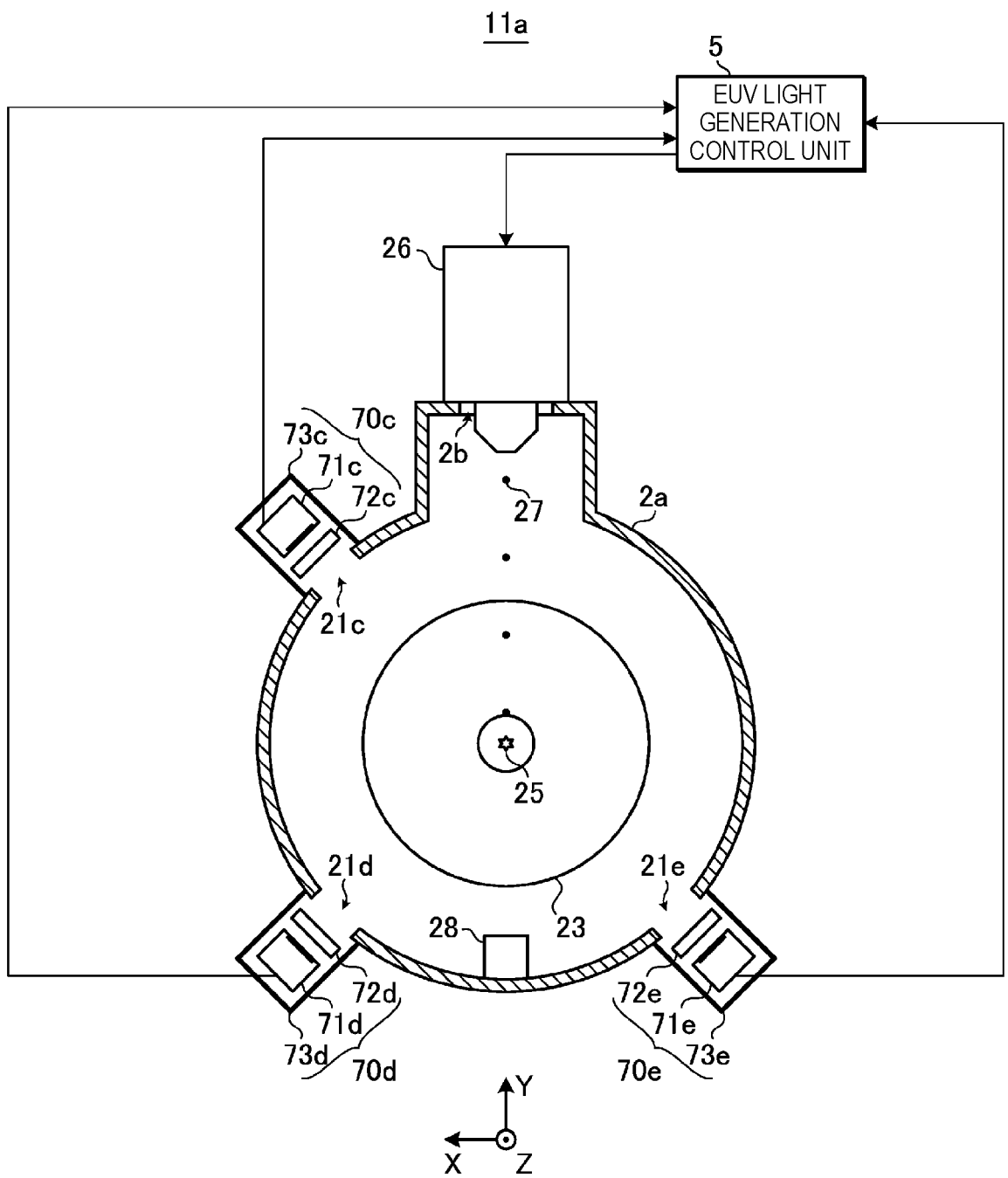
FIG. 3 is a partially cross-sectional view illustrating the configuration of the EUV light generation system 11a according to the comparative example.

FIGS. 2 and 3 are each a partially cross-sectional view illustrating the configuration of an EUV light generation system 11a according to a comparative example. As illustrated in FIGS. 2 and 3, a positive Z direction is defined to be the output direction of EUV light. A positive Y direction is defined to be a direction opposite to the output direction of a target. A positive X direction is defined to be a direction orthogonal to the Z direction and the Y direction. FIG. 2 illustrates the EUV light generation system 11a when viewed in the positive X direction from a position in the negative X direction. FIG. 3 illustrates the EUV light generation system 11a when viewed in the negative Z direction from a position in the positive Z direction.

A laser beam focusing optical system 22a, the EUV focusing mirror 23, the target recovery unit 28, an EUV focusing mirror holder 81, and plates 82 and 83 are provided inside a chamber 2a. The target supply unit 26 is attached to the chamber 2a.

The laser apparatus 3, a first guide laser 3pg, a second guide laser 3mg, a laser beam traveling direction control unit 34a, and the EUV light generation control unit 5 are provided outside the chamber 2a. The EUV light generation control unit 5 includes a processor and a memory (not illustrated).

2.1.1 Target Supply Unit

The target supply unit 26 is disposed through a through hole 2b formed in the wall surface of the chamber 2a. A sealing means (not illustrated) is disposed between the wall surface of the chamber 2a around the through hole 2b and the target supply unit 26. The sealing means seals the gap between the wall surface of the chamber 2a around the through hole 2b and the target supply unit 26.

The target supply unit 26 stores inside a melted target substance. The target supply unit 26 includes an opening (not illustrated) positioned inside the chamber 2a. A vibration device (not illustrated) is disposed near the opening of the target supply unit 26.

The target supply unit 26 includes an XZ stage (not illustrated). The EUV light generation control unit 5 controls the XZ stage based on an output from the target sensor 4 described with reference to FIG. 1. The trajectory of the target 27 can be adjusted by controlling the XZ stage so that the target 27 passes through the plasma generation region 25.

2.1.2 Laser Apparatus

The laser apparatus 3 includes a prepulse laser 3p and a main pulse laser 3m. The prepulse laser 3p outputs a prepulse laser beam 31p. The main pulse laser 3m outputs a main pulse laser beam 31m. The prepulse laser 3p includes, for example, a YAG laser apparatus or a laser apparatus using Nd:YVO$_4$. The main pulse laser 3m includes, for example, a CO$_2$ laser apparatus. The prepulse laser 3p and the main pulse laser 3m each include a laser oscillator, and as necessary, a laser amplifier. The YAG laser apparatus uses YAG crystal as a laser medium for one or both of the laser oscillator and the laser amplifier. The CO$_2$ laser apparatus uses CO$_2$ gas as a laser medium for one or both of the laser oscillator and the laser amplifier. The prepulse laser 3p and the main pulse laser 3m each correspond to a drive laser in the present disclosure.

The first guide laser 3pg outputs a first guide laser beam G1. The second guide laser 3mg outputs a second guide laser beam G2. At least one of the first guide laser beam G1 and the second guide laser beam G2 may be a pulse laser beam having such a high repetition frequency that the pulse laser beam can be regarded as continuous light. Alternatively, at least one of the first guide laser beam G1 and the second guide laser beam G2 may be continuous light.

A high reflectance mirror 355 is disposed on the optical path of the first guide laser beam G1 output from the first guide laser 3pg. The high reflectance mirror 355 is supported by a holder 357. A beam combiner 365 is disposed on the optical path of the first guide laser beam G1 reflected by the high reflectance mirror 355. The beam combiner 365 is also positioned on the optical path of the prepulse laser beam 31p between the prepulse laser 3p and the laser beam traveling direction control unit 34a. The beam combiner 365 is supported by a holder 367. The beam combiner 365 transmits the prepulse laser beam 31p at high transmittance and reflects the first guide laser beam G1 at high reflectance. The beam combiner 365 substantially aligns optical path axes of the prepulse laser beam 31p and the first guide laser beam G1. An optical path axis means the central axis of an optical path.

A high reflectance mirror 356 is disposed on the optical path of the second guide laser beam G2 output from the second guide laser 3mg. The high reflectance mirror 356 is supported by a holder 358. A beam combiner 366 is disposed on the optical path of the second guide laser beam G2 reflected by the high reflectance mirror 356. The beam combiner 366 is also positioned on the optical path of the main pulse laser beam 31m between the main pulse laser 3m and the laser beam traveling direction control unit 34a. The beam combiner 366 is supported by a holder 368. The beam combiner 366 transmits the main pulse laser beam 31m at high transmittance and reflects the second guide laser beam G2 at high reflectance. The beam combiner 366 substantially aligns the optical path axes of the main pulse laser beam 31m and the second guide laser beam G2.

2.1.3 Laser Beam Traveling Direction Control Unit

The laser beam traveling direction control unit 34a includes high reflectance mirrors 341 and 342. The high reflectance mirrors 341 and 342 are disposed on the optical paths of the prepulse laser beam 31p and the first guide laser beam G1. The high reflectance mirror 341 is supported by a holder 343. The high reflectance mirror 342 is supported by a holder 344. An actuator P1 is attached to the holder 343. An actuator P2 is attached to the holder 344.

The laser beam traveling direction control unit 34a further includes high reflectance mirrors 345 and 346. The high reflectance mirrors 345 and 346 are disposed on the optical paths of the main pulse laser beam 31m and the second guide laser beam G2. The high reflectance mirror 345 is supported by a holder 347. The high reflectance mirror 346 is supported by a holder 348. An actuator M1 is attached to the holder 347. An actuator M2 is attached to the holder 348.

The laser beam traveling direction control unit 34a further includes a beam combiner module 40. The beam combiner module 40 includes high reflectance mirrors 401, 402, and 406, a beam splitter 405, a beam combiner 409, and a sensor 413. The high reflectance mirror 401 is disposed on the optical paths of the prepulse laser beam 31p and the first guide laser beam G1 reflected by the high reflectance mirror 342. The high reflectance mirror 401 is supported by a holder 403. The high reflectance mirror 402 is disposed on the optical paths of the prepulse laser beam 31p and the first guide laser beam G1 reflected by the high reflectance mirror 401. The high reflectance mirror 402 is supported by a holder 404.

The beam splitter 405 is disposed on the optical paths of the main pulse laser beam 31m and the second guide laser beam G2 reflected by the high reflectance mirror 346. The beam splitter 405 is supported by a holder 407. The beam splitter 405 reflects the main pulse laser beam 31m and the second guide laser beam G2 at high reflectance. The beam splitter 405 further transmits part of the main pulse laser beam 31m and the second guide laser beam G2 toward the sensor 413.

The beam combiner 409 is positioned on the optical paths of the prepulse laser beam 31p and the first guide laser beam G1 reflected by the high reflectance mirror 402. The beam combiner 409 is also positioned on the optical paths of the main pulse laser beam 31m and the second guide laser beam G2 reflected by the beam splitter 405. The beam combiner 409 is supported by a holder 410. The beam combiner 409 reflects the prepulse laser beam 31p and the first guide laser beam G1 at high reflectance and transmits the main pulse laser beam 31m and the second guide laser beam G2 at high transmittance. The beam combiner 409 substantially aligns the optical path axes of the prepulse laser beam 31p, the first guide laser beam G1, the main pulse laser beam 31m, and the second guide laser beam G2. The beam combiner 409 further transmits part of the prepulse laser beam 31p and the first guide laser beam G1 toward the sensor 413.

The high reflectance mirror 406 is disposed on the optical paths of the prepulse laser beam 31p and the first guide laser beam G1 reflected by the beam combiner 409 and the optical paths of the main pulse laser beam 31m and the second guide laser beam G2 having transmitted through the beam combiner 409. The high reflectance mirror 406 is supported by a holder 408. The high reflectance mirror 406 reflects the prepulse laser beam 31p, the first guide laser beam G1, the main pulse laser beam 31m, and the second guide laser beam G2 into the chamber 2a. In the present specification, for the purpose of description, the prepulse laser beam 31p, the first guide laser beam G1, the main pulse laser beam 31m, and the second guide laser beam G2 reflected by the high reflectance mirror 406 are also collectively referred to as the pulse laser beam 32. However, this does not necessarily prevent using of continuous light as the first guide laser beam G1 or the second guide laser beam G2.

2.1.4 Laser Beam Focusing Optical System and EUV Focusing Mirror

The plate 82 is fixed to the chamber 2a. The EUV focusing mirror 23 is fixed to the plate 82 through the EUV focusing mirror holder 81.

The plate 82 supports a plate 83 and a laser beam focusing optical system actuator 84. The laser beam focusing optical system 22a includes an off-axis parabolic convex mirror 221 and an elliptical concave mirror 222. The off-axis parabolic convex mirror 221 is supported by a holder 223. The elliptical concave mirror 222 is supported by a holder 224. The holders 223 and 224 are supported by the plate 83.

The reflection surface of the off-axis parabolic convex mirror 221 is a parabolic convex surface. The off-axis parabolic convex mirror 221 is disposed so that the axis of the parabolic surface is substantially parallel to the optical path axis of the pulse laser beam 32 incident on the off-axis parabolic convex mirror 221.

The reflection surface of the elliptical concave mirror 222 is a spheroidal concave surface. The elliptical concave mirror 222 has a first focal point and a second focal point. The elliptical concave mirror 222 is disposed so that the first focal point of the elliptical concave mirror 222 substantially coincides with the focal point of the off-axis parabolic convex mirror 221. The second focal point of the elliptical concave mirror 222 is positioned in the plasma generation region 25.

2.1.5 EUV Optical Sensor

As illustrated in FIG. 3, EUV optical sensors 70c to 70e are attached to the wall surface of the chamber 2a.

The EUV optical sensors 70c to 70e point to the plasma generation region 25. The EUV optical sensors 70c and 70d are disposed at positions symmetric to each other with respect to a virtual plane parallel to an XZ surface and passing through the plasma generation region 25. The EUV optical sensors 70d and 70e are disposed at positions symmetric to each other with respect to a virtual plane parallel to a YZ surface and passing through the plasma generation region 25.

The EUV optical sensor 70c includes an energy measurement unit 71c, an EUV light transmissive filter 72c, and a housing 73c. The energy measurement unit 71c and the EUV light transmissive filter 72c are housed in the housing 73c. The inside of the housing 73c and the inside of the chamber 2a are communicated with each other through an opening 21c of the chamber 2a. Components of the EUV optical sensors 70d and 70e are same as those of the EUV optical sensor 70c. Here, the reference sign of each component of the EUV optical sensor 70d ends with "d", and the reference sign of each component of the EUV optical sensor 70e ends with "e".

2.2 Operation 2.2.1 Target Outputting

The EUV light generation control unit 5 outputs a control signal to the target supply unit 26. The target substance stored inside the target supply unit 26 is maintained at a temperature equal to or higher than the melting point of the target substance by a heater (not illustrated). The target substance inside the target supply unit 26 is pressurized by inert gas supplied inside the target supply unit 26.

The target substance pressurized by the inert gas is output as jet through the opening. The jet of the target substance is separated into a plurality of droplets through vibration of at least a component around the opening of the target supply unit 26 by the vibration device. Each droplet is included in the target 27. The target 27 moves in the negative Y direction along Trajectory A from the target supply unit 26 to the plasma generation region 25.

The target recovery unit 28 collects the target 27 having passed through the plasma generation region 25.

2.2.2 Pulse Laser Beam Outputting

The EUV light generation control unit 5 outputs a first trigger signal to the prepulse laser 3p. The prepulse laser 3p outputs the prepulse laser beam 31p in accordance with the first trigger signal. After having output the first trigger signal, the EUV light generation control unit 5 outputs a second trigger signal to the main pulse laser 3m. The main pulse laser 3m outputs the main pulse laser beam 31m in accordance with the second trigger signal. In this manner, the laser apparatus 3 outputs the prepulse laser beam 31p and the main pulse laser beam 31m in the stated order. The prepulse laser beam 31p preferably has a pulse time width in the order of picoseconds. The order of picoseconds is equal to or longer than one ps and shorter than one ns.

The first guide laser 3pg outputs the first guide laser beam G1, and the second guide laser 3mg outputs the second guide laser beam G2.

2.2.3 Pulse Laser Beam Transmission

The prepulse laser beam 31p, the first guide laser beam G1, the main pulse laser beam 31m, and the second guide laser beam G2 are incident on the laser beam traveling direction control unit 34a.

In the laser beam traveling direction control unit 34a, the sensor 413 detects the prepulse laser beam 31p and the first guide laser beam G1 having transmitted through the beam combiner 409, and outputs a result of the detection to the EUV light generation control unit 5. The EUV light generation control unit 5 calculates the beam positions and pointing of the prepulse laser beam 31$p$ and the first guide laser beam G1 based on the output from the sensor 413.

The beam position and pointing represent the position and direction of a laser beam incident on the sensor 413, respectively. The EUV light generation control unit 5 controls the actuators P1 and P2 based on the beam positions and pointing of the prepulse laser beam 31$p$ and the first guide laser beam G1, respectively. The beam positions and pointing of the prepulse laser beam 31$p$ and the first guide laser beam G1 simultaneously change through the control of the actuators P1 and P2, respectively.

The sensor 413 detects the main pulse laser beam 31$m$ and the second guide laser beam G2 having transmitted through the beam splitter 405, and outputs a result of the detection to the EUV light generation control unit 5. The EUV light generation control unit 5 calculates the beam positions and pointing of the main pulse laser beam 31$m$ and the second guide laser beam G2 based on the output from the sensor 413.

The EUV light generation control unit 5 controls the actuators M1 and M2 based on the beam positions and pointing of the main pulse laser beam 31$m$ and the second guide laser beam G2, respectively. The beam positions and pointing of the main pulse laser beam 31$m$ and the second guide laser beam G2 simultaneously change through the control of the actuators M1 and M2, respectively.

2.2.4 Pulse Laser Beam Focusing

The prepulse laser beam 31$p$, the first guide laser beam G1, the main pulse laser beam 31$m$, and the second guide laser beam G2 are guided as the pulse laser beam 32 to the laser beam focusing optical system 22$a$ through the laser beam traveling direction control unit 34$a$.

The pulse laser beam 32 is subjected to beam expansion through reflection by the off-axis parabolic convex mirror 221 included in the laser beam focusing optical system 22$a$. The pulse laser beam 32 reflected by the off-axis parabolic convex mirror 221 is reflected by the elliptical concave mirror 222 and focused as the pulse laser beam 33 to the plasma generation region 25. For the purpose of description, the pulse laser beam 33 includes the prepulse laser beam 31$p$, the first guide laser beam G1, the main pulse laser beam 31$m$, and the second guide laser beam G2. However, this does not necessarily prevent using of continuous light as the first guide laser beam G1 or the second guide laser beam G2.

The laser beam focusing optical system actuator 84 adjusts the position of the plate 83 relative to the plate 82. The laser beam focusing optical system actuator 84 is controlled by a control signal output from the EUV light generation control unit 5. When the position of the plate 83 is adjusted, the positions of the off-axis parabolic convex mirror 221 and the elliptical concave mirror 222 are adjusted. The plate 83 and the laser beam focusing optical system actuator 84 serve as a stage configured to move the off-axis parabolic convex mirror 221 and the elliptical concave mirror 222. In the following description, the plate 83 and the laser beam focusing optical system actuator 84 are also simply collectively referred to as the stage. When the off-axis parabolic convex mirror 221 and the elliptical concave mirror 222 are moved, the optical path axes of the prepulse laser beam 31$p$, the first guide laser beam G1, the main pulse laser beam 31$m$, and the second guide laser beam G2 included in the pulse laser beam 33 are changed. As described above, the focusing point of the pulse laser beam 33 substantially coincides with the second focal point of the elliptical concave mirror 222. Accordingly, the movement direction and movement distance of the plate 83 by the laser beam focusing optical system actuator 84 substantially coincide with the movement direction and movement distance of the focusing point of the pulse laser beam 33, respectively.

At a timing at which the one target 27 has reached the plasma generation region 25, the target 27 is irradiated with the prepulse laser beam 31$p$. The target 27 irradiated with the prepulse laser beam 31$p$ becomes a secondary target through expansion or diffusion. At a timing at which the secondary target expands or diffuses to a desired size, the secondary target is irradiated with the main pulse laser beam 31$m$. Plasma is generated from the secondary target irradiated with the main pulse laser beam 31$m$, and the radiation light 251 including EUV light is radiated from the plasma.

The present disclosure is not limited to the above-described configuration, but the target may be irradiated with a second prepulse laser beam between the prepulse laser beam 31$p$ and the main pulse laser beam 31$m$.

2.2.5 Control of Laser Beam Optical Path Axis Based on EUV Barycenter Position

Problems such as EUV light energy decrease occur when the optical path axis of the pulse laser beam 33 focused on the plasma generation region 25 is shifted from the center of the target 27 in the droplet state. Thus, the optical path axis of the pulse laser beam 33 is desirably controlled to be close to the center of the target 27.

However, it is difficult to directly measure the shift between the optical path axis of the pulse laser beam 33 and the center of the target 27 in some cases. Thus, the EUV light generation control unit 5 controls the optical path axis of the pulse laser beam 33 according to the following principle with an EUV barycenter position as an index.

For example, when the optical path axis of the prepulse laser beam 31$p$ coincides with the center of the target 27, the secondary target isotropically diffuses around the optical path axis of the prepulse laser beam 31$p$. EUV light is isotropically radiated from plasma generated from such a secondary target irradiated with the main pulse laser beam 31$m$. When the optical path axis of the prepulse laser beam 31$p$ is shifted from the center of the target 27, the secondary target anisotropically diffuses around the optical path axis of the prepulse laser beam 31$p$. In this case, EUV light is radiated disproportionately in a direction in which the optical path axis of the prepulse laser beam 31$p$ is shifted.

The disproportion of EUV light emission can be detected by the EUV optical sensors 70$c$ to 70$e$. The EUV optical sensors 70$c$ to 70$e$ each detect the energy of EUV light radiated from the plasma and reaching the EUV optical sensor. When the EUV light is isotropically radiated, the EUV light energies detected by the EUV optical sensors 70$c$ to 70$e$ are substantially equal to each other. When the EUV light is disproportionately radiated, disproportion occurs to the EUV light energies detected by the EUV optical sensors 70$c$ to 70$e$. Specifically, among the EUV optical sensors 70$c$ to 70$e$, an EUV optical sensor disposed in the direction in which the optical path axis of the prepulse laser beam 31$p$ is shifted detects a relatively large EUV light energy. The magnitude of disproportion of the EUV light energies detected by the EUV optical sensors 70$c$ to 70$e$ depends on the magnitude of the shift between the center of the target 27 and the optical path axis of the prepulse laser beam 31$p$.

The EUV light energies detected by the EUV optical sensors 70$c$, 70$d$, and 70$e$ are represented by E1, E2, and E3, respectively. An EUV barycenter position in the Y direction is defined to be a value calculated by (E1−E2)/(E1+E2)

using the EUV light energies E1 and E2 detected by the EUV optical sensors 70c and 70d shifted from each other in the Y direction. An EUV barycenter position in the X direction is defined to be a value calculated by (E2−E3)/(E2+E3) using the EUV light energies E2 and E3 detected by the EUV optical sensors 70d and 70e shifted from each other in the X direction. The EUV barycenter positions change in accordance with the direction in which the optical path axis of the prepulse laser beam 31p is shifted relative to the center of the target 27 and the distance of the shift. Not only when the optical path axis of the prepulse laser beam 31p is shifted, but also when the optical path axis of the main pulse laser beam 31m is shifted, the EUV barycenter positions change in some cases.

The EUV light generation control unit 5 controls the optical path axis of the pulse laser beam 33 based on at least one of the EUV barycenter positions in the Y and X directions. For example, the EUV light generation control unit 5 controls the laser beam focusing optical system actuator 84 so that the EUV barycenter positions in the Y and X directions approach zero. Accordingly, the difference between the optical path axis of the pulse laser beam 33 focused on the plasma generation region 25 and the center of the target 27 in the droplet state is reduced.

2.3 Problem

Figure 4:
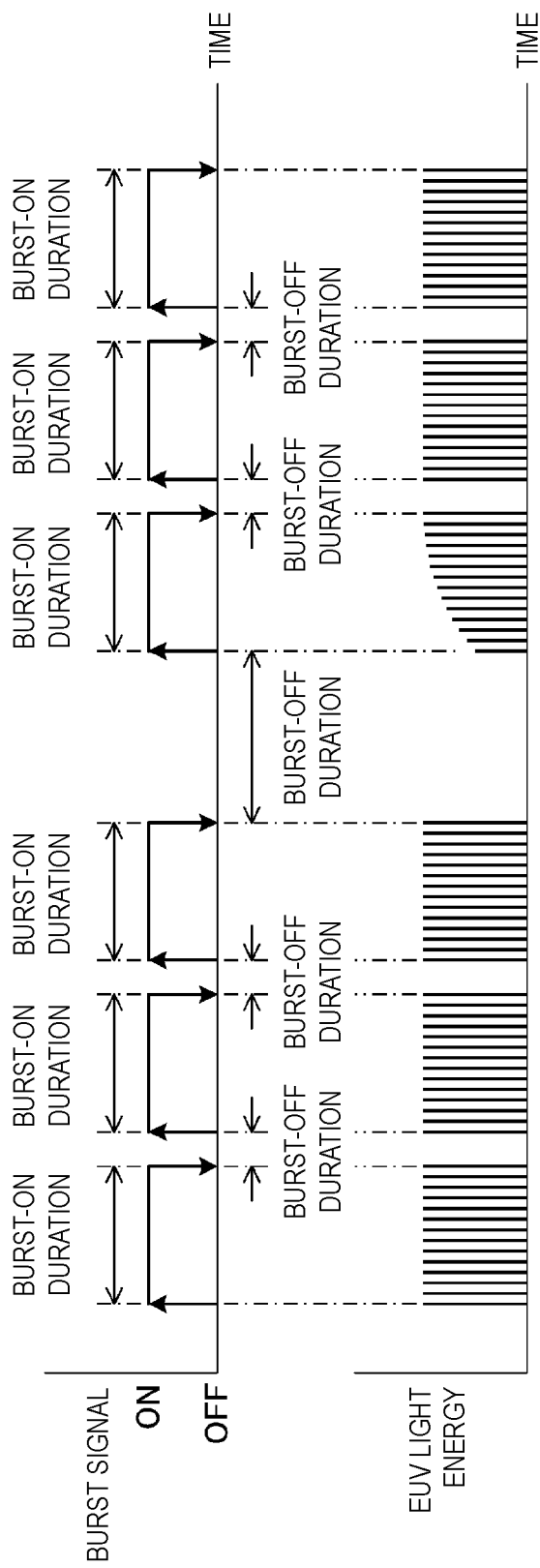
FIG. 4 illustrates temporal transition of a burst signal and EUV light energy in the EUV light generation system 11a illustrated in FIGS. 2 and 3.

FIG. 4 illustrates temporal transition of a burst signal and EUV light energy in the EUV light generation system 11a illustrated in FIGS. 2 and 3. The exposure apparatus 6 outputs the burst signal for instructing switching of EUV light outputting between on and off to the EUV light generation system 11a. The burst signal changes between a first state and a second state. In the first state, the burst signal has a first voltage, indicating a burst-on duration. In the second state, the burst signal has a second voltage, indicating a burst-off duration.

In the burst-on duration, the EUV light generation system 11a having received the burst signal outputs EUV light at high repetition frequency by outputting the prepulse laser beam 31p and the main pulse laser beam 31m from the laser apparatus 3. In the burst-off duration, the EUV light generation system 11a having received the burst signal stops outputting of EUV light by stopping outputting of the prepulse laser beam 31p and the main pulse laser beam 31m.

Each burst-on duration corresponds to, for example, a duration in which one of a plurality of chip regions included in a semiconductor wafer is exposed. Each burst-off duration corresponds to, for example, a duration in which a wafer stage (not illustrated) is driven to move the position of the semiconductor wafer from a position at which one chip region of the semiconductor wafer can be exposed to a position at which another chip region can be exposed. The burst-off duration also corresponds to, for example, a duration in which a semiconductor wafer set on the wafer stage is replaced with another semiconductor wafer.

In the LPP EUV light generation system illustrated in FIGS. 2 and 3, optical elements included in the laser beam traveling direction control unit 34a, the laser beam focusing optical system 22a, and the like are heated by the energy of a pulse laser beam. When heated, the optical elements deform and change the optical path of the pulse laser beam. When the optical path position of the pulse laser beam near the plasma generation region 25 changes, the irradiation position of the pulse laser beam on the target 27 changes. Accordingly, the position at which plasma is generated changes, and the EUV barycenter positions change. Thus, the laser beam focusing optical system actuator 84 is controlled based on the EUV barycenter positions to compensate the change of the optical path position of the pulse laser beam.

In the burst-on duration, the laser beam focusing optical system actuator 84 can be controlled based on the EUV barycenter positions. However, in the burst-off duration, no EUV light is generated, and thus the laser beam focusing optical system actuator 84 cannot be controlled based on the EUV barycenter positions in some cases.

In addition, in the burst-on duration, the energy of a pulse laser beam is supplied to an optical element in a substantially constant cycle, but in the burst-off duration, the energy of a pulse laser beam is not supplied to the optical element. Accordingly, in the burst-off duration, thermal energy is lost from the optical element, and the temperature of the optical element decreases. As the temperature decreases, the optical element deforms and changes the optical path of the pulse laser beam. When the burst-off duration is sufficiently short, the temperature change of the optical element is small, and the change of the optical path of the pulse laser beam is small. However, when the burst-off duration is long, the temperature change of the optical element is large, and the change of the optical path of the pulse laser beam is large in some cases.

Thus, for example, at the start of the burst-on duration following the long burst-off duration of several seconds or longer, the irradiation position of the pulse laser beam on the target 27 is shifted from a desired range in some cases. In this case, the EUV light energy at the start of the burst-on duration is lower than a desired EUV light energy, potentially adversely affecting exposure performance.

In the burst-off duration, the actuators P1, P2, M1, and M2 can be controlled based on results of the detection of the first guide laser beam G1 and the second guide laser beam G2 by the sensor 413. However, for example, change of the optical path axis of the pulse laser beam due to change of the temperature of the laser beam focusing optical system 22a cannot be compensated through control of the actuators based on results of the detection by the sensor 413.

In embodiments describes below, an optical sensor 80 is used to detect reflected light of the first guide laser beam G1 or the second guide laser beam G2 from the target 27. The irradiation position of the first guide laser beam G1 or the second guide laser beam G2 on the target 27 can be estimated based on a result of the detection of reflected light from the target 27. Thus, in the burst-off duration, the optical path axis of a pulse laser beam is controlled based on the result of the detection of reflected light from the target 27. Accordingly, any positional shift of the pulse laser beam at the start of the next burst-on duration can be reduced.

In particular, the EUV light energy can be stabilized by improving the accuracy of the irradiation position of the prepulse laser beam 31p on the target 27. The following describes a case in which the optical path axis of a pulse laser beam is controlled based on a result of detection of reflected light of the first guide laser beam G1 from the target 27. However, the problem of the present invention can be solved also by controlling the optical path axis of a pulse laser beam based on a result of detection of reflected light of the second guide laser beam G2 from the target 27.

3. EUV Light Generation System Including Optical Sensor 80

3.1 Configuration

Figure 5:
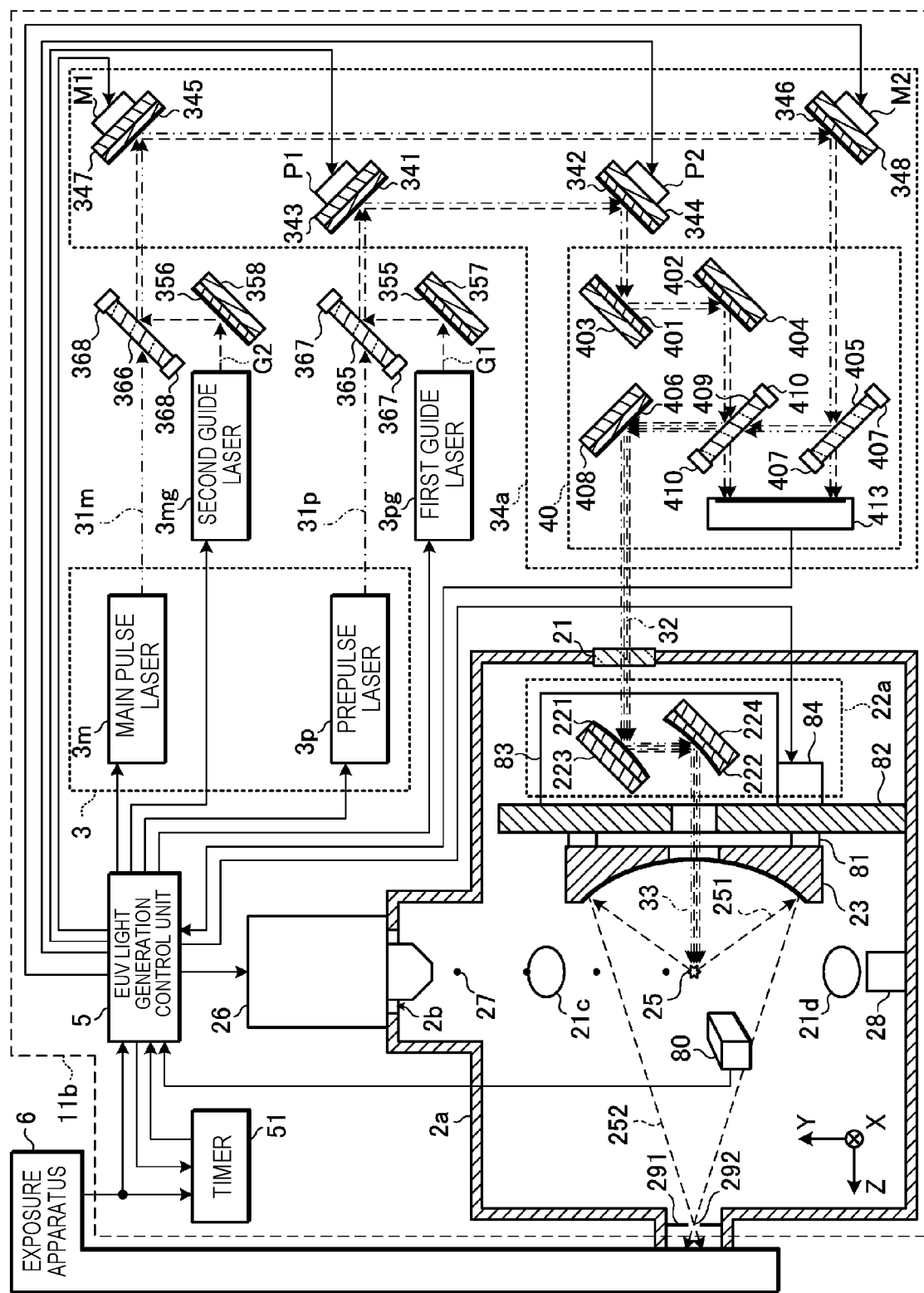
FIG. 5 is a partially cross-sectional view illustrating the configuration of an EUV light generation system 11b according to a first embodiment of the present disclosure.

FIG. 5 is a partially cross-sectional view illustrating the configuration of an EUV light generation system 11b according to a first embodiment of the present disclosure. In the first embodiment, the EUV light generation system 11b includes a timer 51 and the optical sensor 80 in addition to the configuration of the comparative example.

The optical sensor 80 is disposed at a predetermined position separated from the plasma generation region 25 substantially in the negative X direction. For example, the optical sensor 80 is positioned outside the chamber 2a, and a window (not illustrated) is positioned on the wall surface of the chamber 2a between the plasma generation region 25 and the optical sensor 80.

The optical sensor 80 includes, for example, a transfer optical system (not illustrated) and an image sensor (not illustrated). The image sensor includes, for example, a CCD sensor. The transfer optical system is disposed so that an image of the target 27 irradiated with the first guide laser beam G1 in the plasma generation region 25 is formed on a light-receiving surface of the image sensor. The optical sensor 80 outputs an image of the plasma generation region 25 and the vicinity thereof captured by the image sensor to the EUV light generation control unit 5 as a detection result.

Figure 6A:
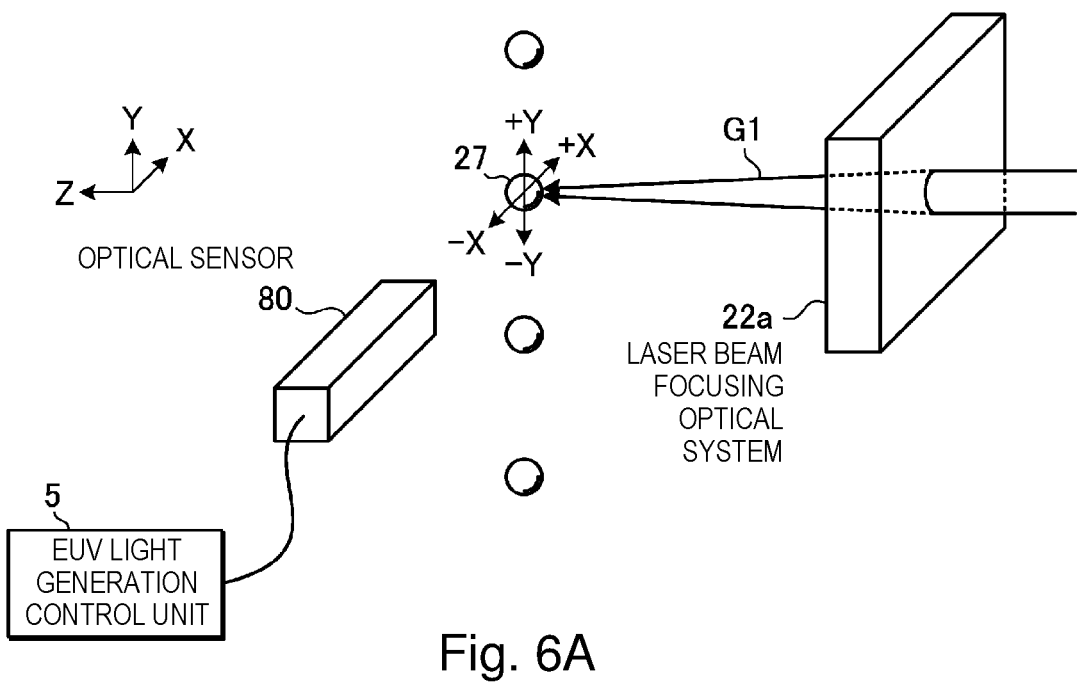
FIG. 6A illustrates the positional relation between a target 27 and an optical sensor 80.

FIG. 6A illustrates the positional relation between the target 27 and the optical sensor 80. The target 27 in the droplet state has a substantially spherical shape. When the first guide laser beam G1 is incident on the target 27 in the droplet state, the first guide laser beam G1 is reflected in a plurality of directions by the spherical surface of the target 27. When an image of the target 27 including the reflected light is captured by the optical sensor 80, the irradiation position of the first guide laser beam G1 on the target 27 can be estimated according to the following principle.

The target 27 moves in the negative Y direction along a trajectory parallel to the Y axis and passing through the plasma generation region 25. The target 27 having reached the plasma generation region 25 is irradiated with the first guide laser beam G1 in the Z direction. The optical sensor 80 may be disposed to capture an image of an object positioned in the plasma generation region 25 in a direction substantially orthogonal to both the trajectory of the target 27 and the optical path axis of the first guide laser beam G1. In the following description, an image of an object positioned in the plasma generation region 25 is captured by the optical sensor 80 at a position in the negative X direction, but the present disclosure is not limited to this disposition.

Figure 6B:
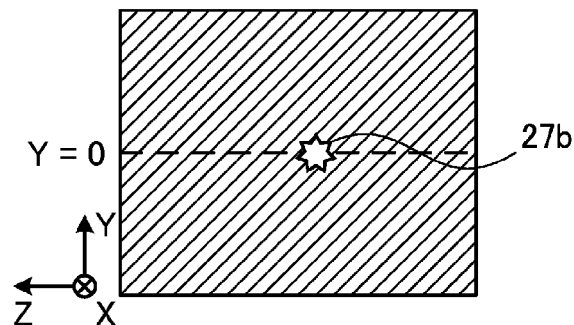
FIG. 6B illustrates an exemplary image captured by the optical sensor 80 when the optical path axis of a first guide laser beam G1 is adjusted to an ideal position.

FIG. 6B illustrates an exemplary image captured by the optical sensor 80 when the optical path axis of the first guide laser beam G1 is adjusted to an ideal position. The ideal position of the optical path axis of the first guide laser beam G1 is, for example, the position where Y is 0. When an inverted image of the target 27 through the transfer optical system is formed on the light-receiving surface of the image sensor included in the optical sensor 80, an image in each of FIG. 6B and FIGS. 6C and 6D to be described later corresponds to an image obtained by converting the inverted image to an erected image.

The first guide laser beam G1 is incident on a surface of the target 27 on the negative Z direction side. The first guide laser beam G1 is reflected in a plurality of directions by the spherical surface of the target 27, and part of the reflected light reaches the optical sensor 80. Accordingly, the image captured by the optical sensor 80 includes a bright image 27b corresponding to the irradiation position of the first guide laser beam G1. When the optical path axis of the first guide laser beam G1 is at the ideal position where Y is 0, the image 27b is formed at a position corresponding to the position where Y is 0.

Figure 6C:
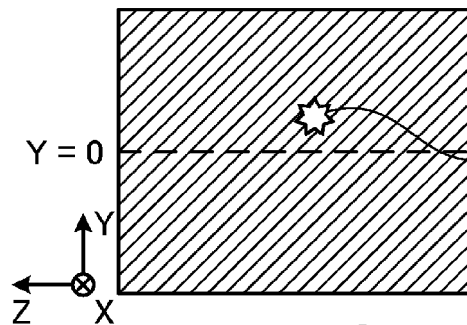
FIG. 6C illustrates an exemplary image captured by the optical sensor 80 when the optical path axis of the first guide laser beam G1 is shifted from the ideal position in the Y direction.

FIG. 6C illustrates an exemplary image captured by the optical sensor 80 when the optical path axis of the first guide laser beam G1 is shifted from the ideal position in the positive Y direction. When the optical path axis of the first guide laser beam G1 is shifted in the positive Y direction, the first guide laser beam G1 is incident on the target 27 at a position shifted to the positive Y direction side along the trajectory of the target 27. Accordingly, the image captured by the optical sensor 80 includes a bright image 27c at a position shifted in the positive Y direction from the position where Y is 0.

When the optical path axis of the first guide laser beam G1 is shifted from the ideal position in the negative Y direction, the image captured by the optical sensor 80 includes the bright image 27c at a position shifted in the negative Y direction from the position where Y is 0. Thus, it is possible to detect where the image 27c is formed in the Y direction and calculate how much the optical path axis of the first guide laser beam G1 is shifted in the positive Y direction or the negative Y direction based on a result of the detection.

Figure 6D:
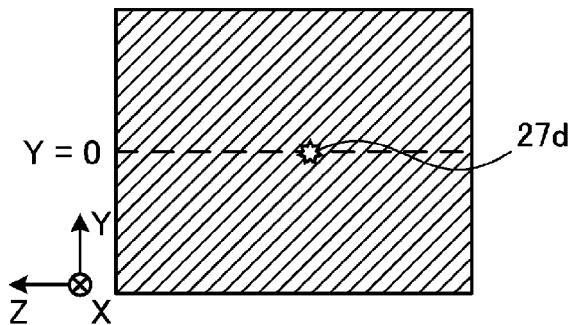
FIG. 6D illustrates an exemplary image captured by the optical sensor 80 when the optical path axis of the first guide laser beam G1 is shifted from the ideal position in the X direction.

FIG. 6D illustrates an exemplary image captured by the optical sensor 80 when the optical path axis of the first guide laser beam G1 is shifted from the ideal position in the positive X direction. When the optical path axis of the first guide laser beam G1 is shifted in the positive X direction, part of the first guide laser beam G1 misses the target 27 and passes nearby the target 27 in some cases. Accordingly, the light amount of the first guide laser beam G1 reflected at the surface of the target 27 and reaching the optical sensor 80 decreases in some cases. As a result, the image captured by the optical sensor 80 includes an image darker than the image 27b illustrated in FIG. 6B, or a smaller image 27d in some cases.

When the optical path axis of the first guide laser beam G1 is shifted from the ideal position in the negative X direction, too, the image captured by the optical sensor 80 includes an image darker than the image 27b illustrated in FIG. 6B, or the smaller image 27d in some cases.

Thus, it is possible to detect the light amount of the image 27d and calculate whether the optical path axis of the first guide laser beam G1 is shifted in the positive X direction or the negative X direction based on a result of the detection.

In this example, only one optical sensor 80 is used, but the present disclosure is not limited thereto. A plurality of optical sensors may be disposed to capture images of the plasma generation region 25 in a plurality of directions substantially orthogonal to the optical path axis of the first guide laser beam G1. Whether the optical path axis of the first guide laser beam G1 is shifted in the X direction can be detected based on the light amount of reflected light. The optical sensor 80 may include no image sensor when it is not to be detected whether the optical path axis of the first guide laser beam G1 is shifted in the Y direction.

As illustrated in FIG. 5, the timer 51 is controlled by the EUV light generation control unit 5. In the burst-on duration, the EUV light generation control unit 5 sets a count value T of the timer 51 to be zero. The EUV light generation control unit 5 starts time counting by the timer 51 when the fall of the burst signal output from the exposure apparatus 6 is detected, in other words, when the end of the burst-on duration or the start of the burst-off duration is detected. The count value T has an initial value of zero when the timer 51 starts the counting. The count value T of the timer 51 is output to the EUV light generation control unit 5. Each time the count value T of the timer 51 reaches a predetermined value K, the EUV light generation control unit 5 returns the count value T of the timer 51 to zero, and controls the laser beam focusing optical system actuator 84 based on a result of detection by the optical sensor 80.

3.2 Operation
3.2.1 Main Process

Figure 7:
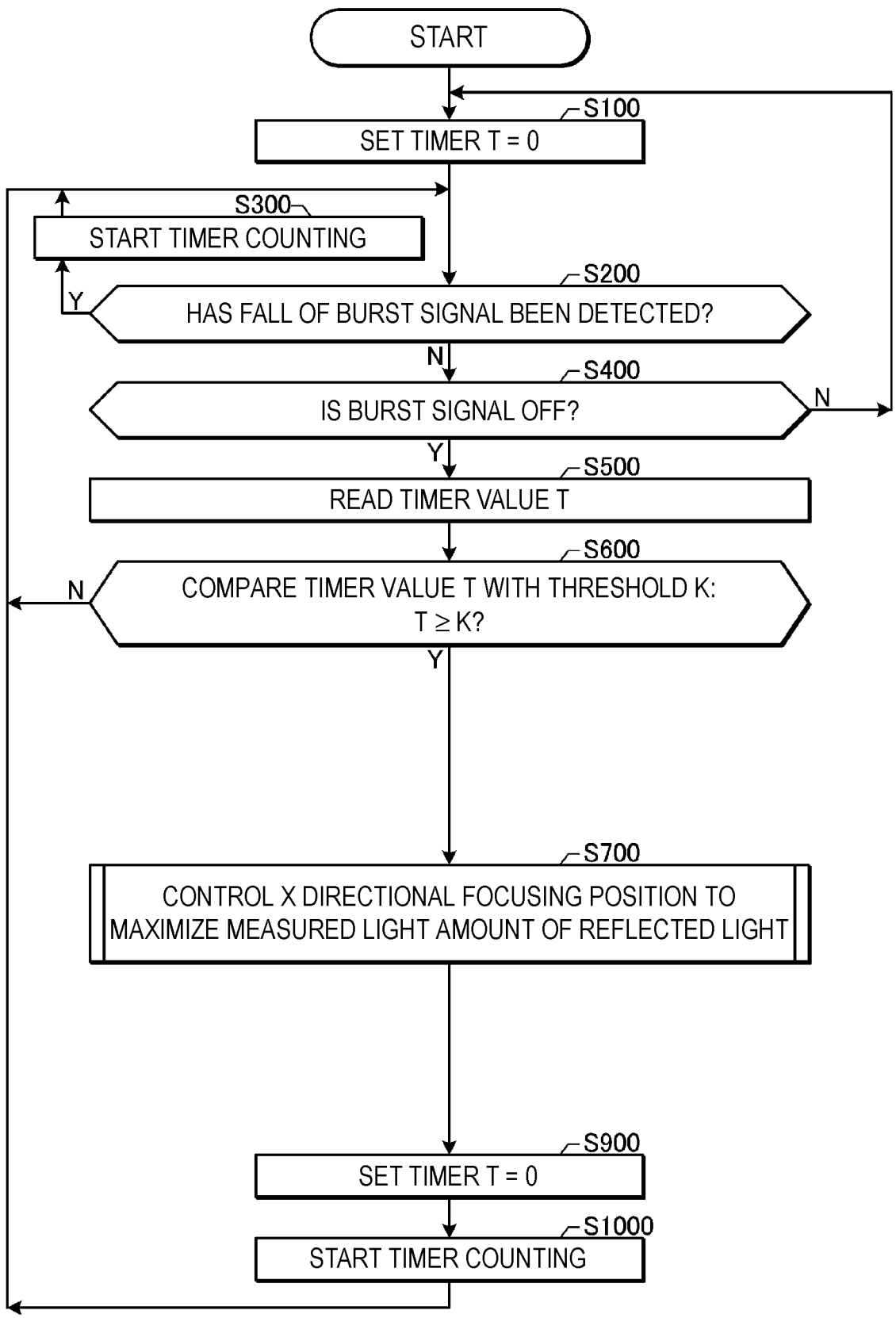
FIG. 7 is a flowchart illustrating the processing procedure of optical path axis adjustment in the first embodiment.

FIG. 7 is a flowchart illustrating the processing procedure of optical path axis adjustment in the first embodiment. The EUV light generation control unit 5 performs the optical path axis adjustment in the burst-off duration through processing described below. In the flowchart described below, "N" indicates a branch destination when determination is negative, and "Y" indicates a branch destination when determination is positive.

First at S100, the EUV light generation control unit 5 sets the count value T of the timer 51 to be zero.

Subsequently at S200, the EUV light generation control unit 5 determines whether the fall of the burst signal has been detected. When the EUV light generation control unit 5 has detected the rise of the burst signal or when the EUV light generation control unit 5 has not detected change of the burst signal, the determination at S200 is negative. When the EUV light generation control unit 5 has detected the end of the burst-on duration or the start of the burst-off duration, the determination at S200 is positive. When having detected the fall of the burst signal (YES at S200), the EUV light generation control unit 5 forwards the process to S300. When not having detected the fall of the burst signal (NO at S200), the EUV light generation control unit 5 forwards the process to S400.

At S300, the EUV light generation control unit 5 starts counting by the timer 51 from zero. After S300, the EUV light generation control unit 5 returns the process to S200.

At S400, the EUV light generation control unit 5 determines whether the burst signal indicates the burst-off duration. When the burst signal does not indicate the burst-off duration (NO at S400), the EUV light generation control unit 5 returns the process to S100. When the burst signal indicates the burst-off duration (YES at S400), the EUV light generation control unit 5 forwards the process to S500.

At S500, the EUV light generation control unit 5 reads the count value T of the timer 51 from the timer 51.

Subsequently at S600, the EUV light generation control unit 5 compares the count value T of the timer 51 with a threshold K. When the count value T of the timer 51 is smaller than the threshold K (NO at S600), the EUV light generation control unit 5 returns the process to S200. When the count value T of the timer 51 is equal to or larger than the threshold K (YES at S600), the EUV light generation control unit 5 forwards the process to S700.

At S700, the EUV light generation control unit 5 controls the focusing position in the X direction through the laser beam focusing optical system 22a to maximize the light amount of reflected light of the first guide laser beam G1 measured by the optical sensor 80. The focusing position in the X direction is controlled by, for example, controlling the stage including the laser beam focusing optical system actuator 84. The processing at S700 will be described later in detail with reference to FIGS. 9 and 10.

Subsequently at S900, the EUV light generation control unit 5 sets the count value T of the timer 51 to be zero.

Subsequently at S1000, the EUV light generation control unit 5 starts counting by the timer 51 from zero. After S1000, the EUV light generation control unit 5 returns the process to S200.

Figure 8:
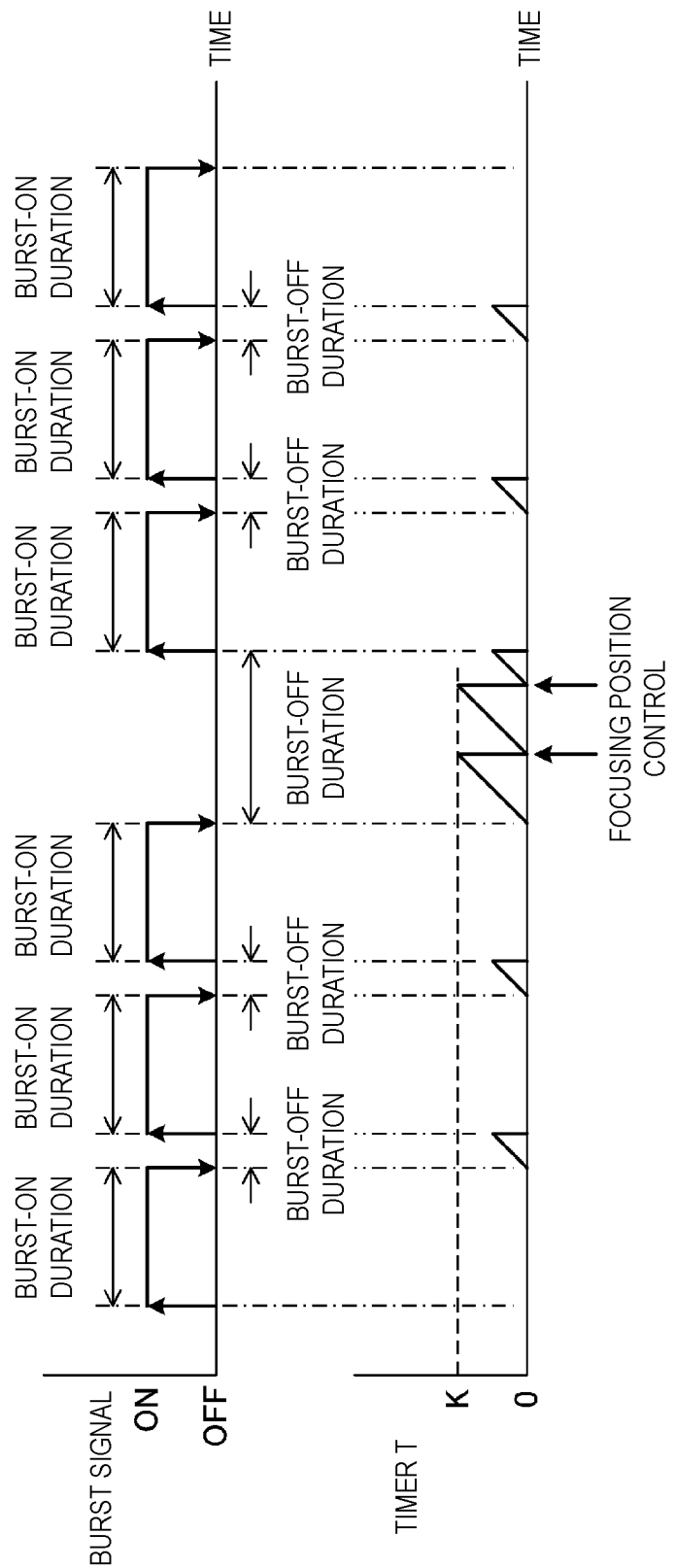
FIG. 8 is a timing chart of the optical path axis adjustment in the first embodiment.

FIG. 8 is a timing chart of the optical path axis adjustment in the first embodiment. The burst signal is as described with reference to FIG. 4. As illustrated in FIG. 8, when the burst signal switches from the burst-on duration to the burst-off duration (YES at S200 in FIG. 7), the timer 51 starts counting from zero (S300 in FIG. 7). After the timer 51 has started the counting, when the burst signal switches to the burst-on duration (NO at S400 in FIG. 7), the count value T of the timer 51 returns to zero (S100 in FIG. 7). In the burst-off duration (YES at S400 in FIG. 7), when the count value T of the timer 51 becomes equal to or larger than the threshold K (YES at S600 in FIG. 7), focusing position control is performed (S700 in FIG. 7), and thereafter, the timer 51 starts counting from zero (S900 and S1000 in FIG. 7).

In this manner, in the first embodiment, the focusing position control is performed in each constant period in which the count value T of the timer 51 reaches the threshold K in the burst-off duration.

In the first embodiment, the EUV light generation control unit 5 controls the start of counting by the timer 51 and the like based on the burst signal, but the present disclosure is not limited thereto. The timer 51 may start time counting from zero when having received the burst signal output from the exposure apparatus 6 and detected the fall of the burst signal.

Figure 9:
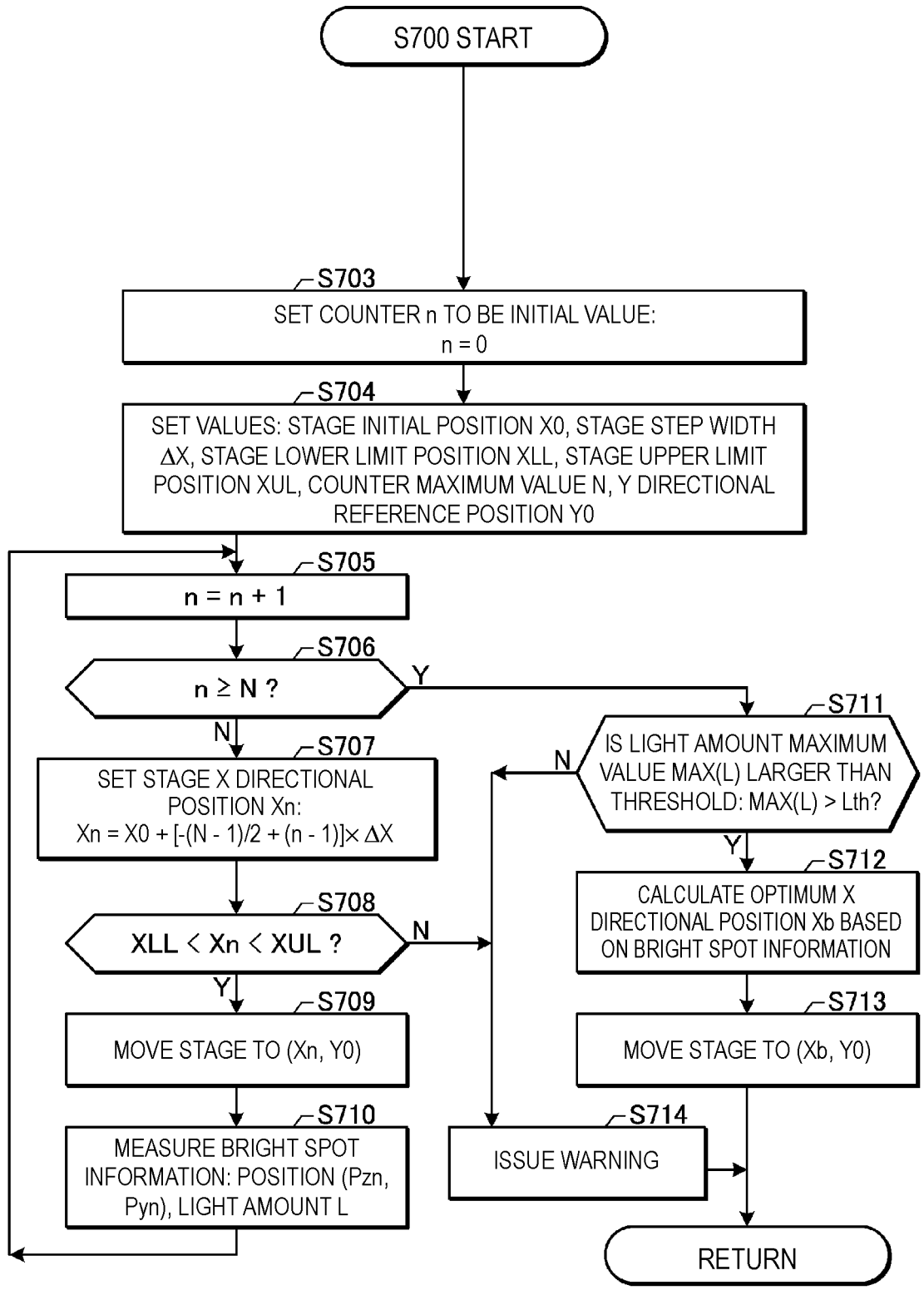
FIG. 9 is a flowchart illustrating details of processing of controlling a focusing position in the X direction to maximize the measured light amount of reflected light in the first embodiment.

3.2.2 Processing of Controlling Focusing Position in X Direction to Maximize Light Amount of Reflected Light FIG. 9 is a flowchart illustrating details of processing of controlling the focusing position in the X direction to maximize the measured light amount of reflected light in the first embodiment. The processing illustrated in FIG. 9 is performed as a subroutine of S700 in FIG. 7 by the EUV light generation control unit 5.

First at S703, the EUV light generation control unit 5 sets the value of a counter n (not illustrated) to be the initial value of zero. The counter n counts the number of times that the light amount of reflected light is measured by the optical sensor 80 to estimate the focusing position in the X direction at which the light amount of reflected light is maximized.

Subsequently at S704, the EUV light generation control unit 5 sets the values of parameters below for estimating the focusing position in the X direction at which the light amount of reflected light is maximized.

X0: stage initial position,
ΔX: stage step width,
XLL: stage lower limit position,
XUL: stage upper limit position,
N: counter maximum value,
Y0: Y directional reference position The stage is made of the plate 83 and the laser beam focusing optical system actuator 84 as described above with reference to FIG. 2. The maximum value N of the counter n corresponds to the number of times that the light amount of reflected light is to be measured by the optical sensor 80.

Subsequently at S705, the EUV light generation control unit 5 updates the value of n by adding one to the current value of the counter n.

Subsequently at S706, the EUV light generation control unit 5 determines whether the value of the counter n is equal to or larger than the counter maximum value N. When the value of the counter n is smaller than the counter maximum value N (NO at S706), the EUV light generation control unit 5 forwards the process to S707. When the value of the counter n is equal to or larger than the counter maximum value N (YES at S706), the EUV light generation control unit 5 forwards the process to S711.

At S707, the EUV light generation control unit 5 sets an X directional position Xn of the stage corresponding to the current value of the counter n as described below.

$$Xn = X0 + [-(N-1)/2 + (n-1)] \times \Delta X$$

For example, when the counter maximum value N is set to be five, the value of the counter n is sequentially counted up from one to five. The values of Xn corresponding to the counter n values of one, two, three, four, and five are X0−2ΔX, X0−ΔX, X0, X0+ΔX, and X0+2ΔX, respectively (refer to the horizontal axis in FIG. 10).

Subsequently at S708, the EUV light generation control unit 5 determines whether the X directional position Xn of the stage is between the stage lower limit position XLL and the stage upper limit position XUL. When the X directional position Xn of the stage is between the stage lower limit position XLL and the stage upper limit position XUL (YES at S708), the EUV light generation control unit 5 forwards the process to S709. When the X directional position Xn of the stage is not between the stage lower limit position XLL and the stage upper limit position XUL (NO at S708), the EUV light generation control unit 5 forwards the process to S714.

At S709, the EUV light generation control unit 5 controls the laser beam focusing optical system actuator 84 to move the stage position to coordinates (Xn, Y0).

Subsequently at S710, the EUV light generation control unit 5 receives image data from the optical sensor 80, and measures bright spot information based on the image data. The bright spot information includes coordinates (Pzn, Pyn) of a bright spot position of reflected light and a light amount L of reflected light. The coordinates (Pzn, Pyn) of the bright spot position of reflected light include the Z coordinate Pzn and the Y coordinate Pyn. The coordinates (Pzn, Pyn) of the bright spot position of reflected light can be calculated as the barycenter position of the bright spot included in the image data. The light amount L of reflected light can be calculated by integrating the luminance of each pixel included in the image data. After S710, the EUV light generation control unit 5 returns the process to S705 and repeats the processing at S705 to S710. Accordingly, the values of the coordinates (Pzn, Pyn) and the light amount L in numbers corresponding to the counter maximum value N are calculated at S710.

When it is determined at S706 that the value of the counter n is equal to or larger than the counter maximum value N, the EUV light generation control unit 5 determines whether the maximum value MAX(L) of the light amount L of reflected light is larger than a threshold Lth at S711. The maximum value MAX(L) is the maximum value among the N values of the light amount L. When the maximum value MAX(L) of the light amount L of reflected light is larger than the threshold Lth (YES at S711), the EUV light generation control unit 5 forwards the process to S712. When the maximum value MAX(L) of the light amount L of reflected light is equal to or smaller than the threshold Lth (NO at S711), the EUV light generation control unit 5 forwards the process to S714.

At S712, the EUV light generation control unit 5 calculates an optimum X directional position Xb of the stage based on the bright spot information measured at S710. The optimum X directional position Xb is the X directional position of the stage at which the measured light amount of reflected light is maximized.

Subsequently at S713, the EUV light generation control unit 5 controls the laser beam focusing optical system actuator 84 to move the stage position to the coordinates (Xb, Y0). When the X directional position of the stage is controlled in this manner, the X directional focusing position of the first guide laser beam G1 is controlled to an optimum position.

After S713, the EUV light generation control unit 5 ends the processing of the present flowchart, and returns to the processing illustrated in FIG. 7.

When determined the X directional position Xn of the stage is not between the stage lower limit position XLL and the stage upper limit position XUL at S708 described above, the process is forwarded to S714. When it is determined at S711 described above that the maximum value MAX(L) of the light amount L of reflected light is equal to or smaller than the threshold Lth, the process is forwarded to S714. At S714, the EUV light generation control unit 5 issues a warning to notify that the focusing position control is not appropriately performed. After S714, the EUV light generation control unit 5 ends the processing of the present flowchart, and returns to the processing illustrated in FIG. 7.

Figure 10:
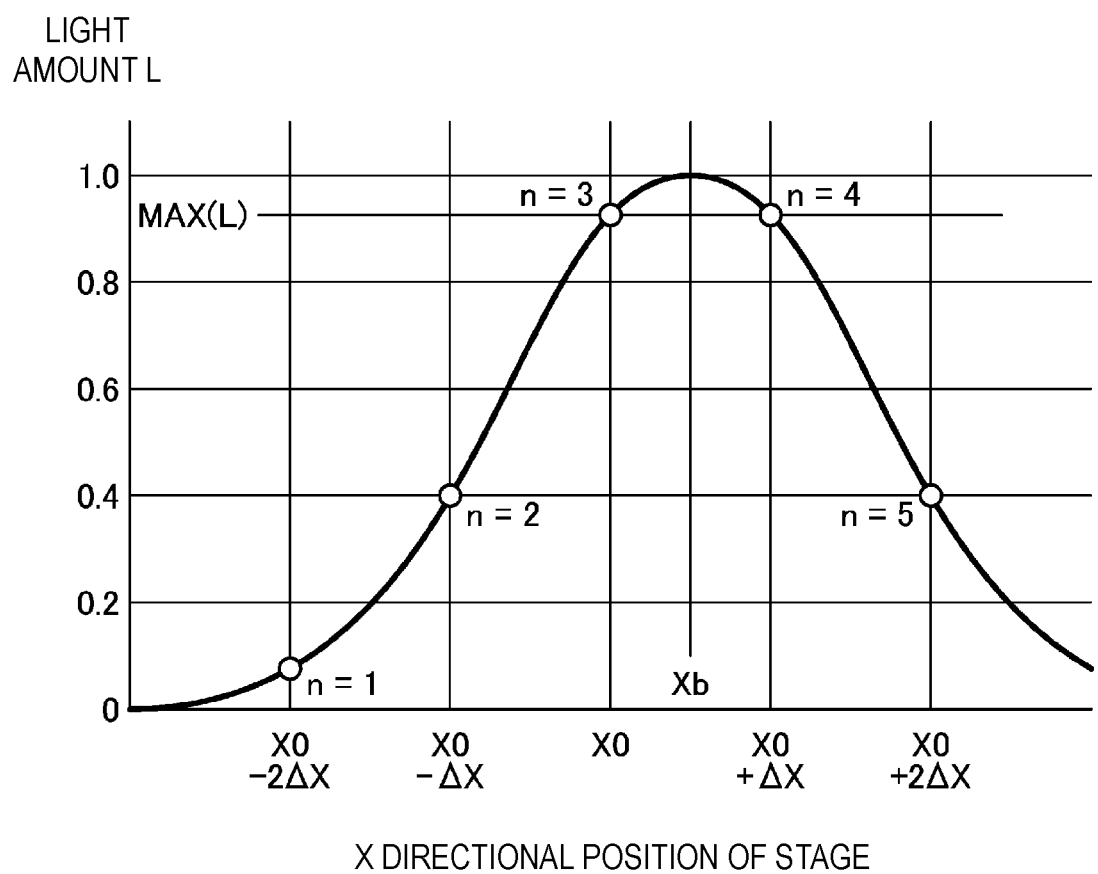
FIG. 10 is a diagram for description of a method of calculating the focusing position in the X direction to maximize the measured light amount of reflected light.

FIG. 10 is a diagram for description of a method of calculating the focusing position in the X direction at which the measured light amount of reflected light is maximized. In FIG. 10, the horizontal axis represents the X directional position of the stage, and the vertical axis represents the light amount L of reflected light. In FIG. 10, each small white circle indicates the relation between the X directional position of the stage and the light amount L of reflected light when the value of the counter n is one, two, three, four, or five.

At S712 described with reference to FIG. 9, the EUV light generation control unit 5 derives an approximate curve based on measurement data of the light amount represented by the small white circles illustrated in FIG. 10. The approximate curve is a curve fitted to the measurement data with small deviation. The approximate curve illustrated in FIG. 10 is derived by, for example, setting parameters of a quadratic function or a Gauss function.

The EUV light generation control unit 5 calculates the X directional position Xb of the stage at which the light amount L of reflected light is maximized based on the derived approximate curve.

3.3 Effect

According to the first embodiment, the focusing position in the X direction is controlled to maximize the light amount of reflected light of the first guide laser beam G1 in the burst-off duration. Accordingly, the prepulse laser beam 31p at the start of the next burst-on duration is incident at a desired position on the target 27. The EUV light energy at the start of the burst-on duration can be achieved in a desired range.

In addition, according to the first embodiment, the timer 51 counts elapsed time since the fall of the burst signal. Then, the focusing position is controlled each time the timer 51 reaches a certain value. Accordingly, the frequency of the focusing position control in the burst-off duration can be reduced.

In addition, according to the first embodiment, an approximate curve is used to calculate the focusing position in the X direction at which the light amount of reflected light is maximized. Accordingly, an appropriate focusing position can be calculated with a small number of times of measurement.

Figure 11:
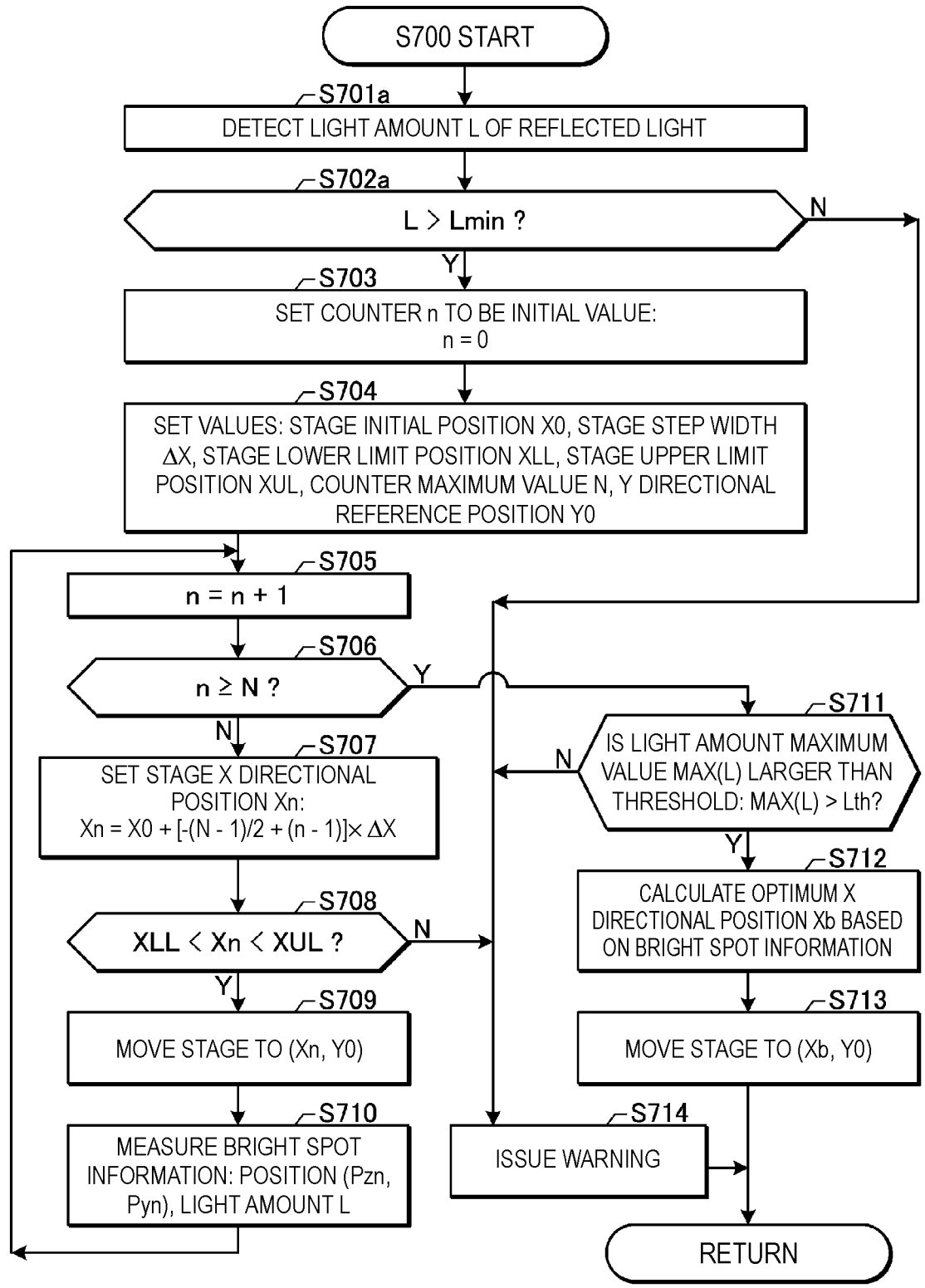
FIG. 11 is a flowchart illustrating details of processing of controlling the focusing position in the X direction to maximize the measured light amount of reflected light in a second embodiment of the present disclosure.

4. EUV Light Generation System in which Warning is Issued Early 4.1 Processing of Controlling Focusing Position in X Direction to Maximize Light Amount of Reflected Light FIG. 11 is a flowchart illustrating details of processing of controlling the focusing position in the X direction to maximize the measured light amount of reflected light in a second embodiment of the present disclosure. The second embodiment is different from the first embodiment in that processing illustrated in FIG. 11 is performed in place of the processing illustrated in FIG. 9. The other features of the second embodiment are same as those of the first embodiment.

First at S701a, the EUV light generation control unit 5 detects the light amount L of reflected light while maintaining the current focusing position of the first guide laser beam G1.

Subsequently at S702a, the EUV light generation control unit 5 determines whether the light amount L of reflected light is larger than a threshold Lmin. When the light amount L of reflected light is larger than the threshold Lmin (YES at S702a), the EUV light generation control unit 5 forwards the process to S703. The processing at S703 and later is same as that in the first embodiment. When the light amount L of reflected light is equal to or smaller than the threshold Lmin (NO at S702a), the EUV light generation control unit 5 forwards the process to S714. At S714, the EUV light generation control unit 5 issues a warning to notify that the focusing position control is not appropriately performed.

According to the second embodiment, when it is found that the light amount L of reflected light is insufficient before the laser beam focusing optical system actuator 84 is driven, a warning can be issued early.

Figure 12:
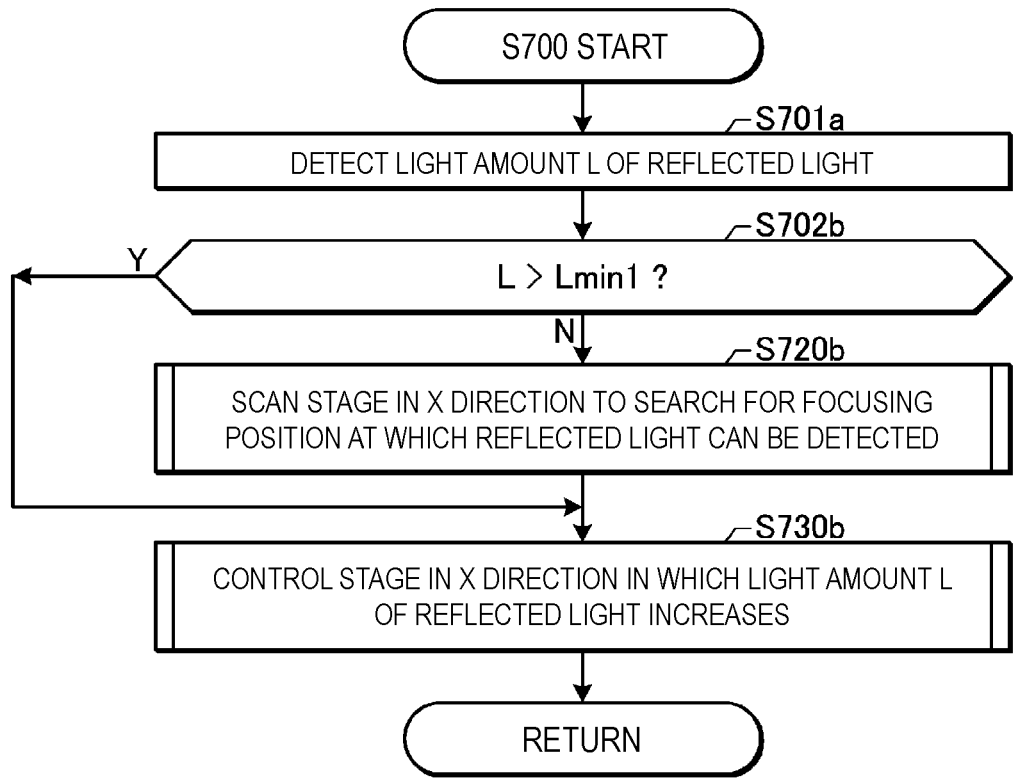
FIG. 12 is a flowchart illustrating details of processing of controlling the focusing position in the X direction to maximize the measured light amount of reflected light in a third embodiment of the present disclosure.
Figure 13:
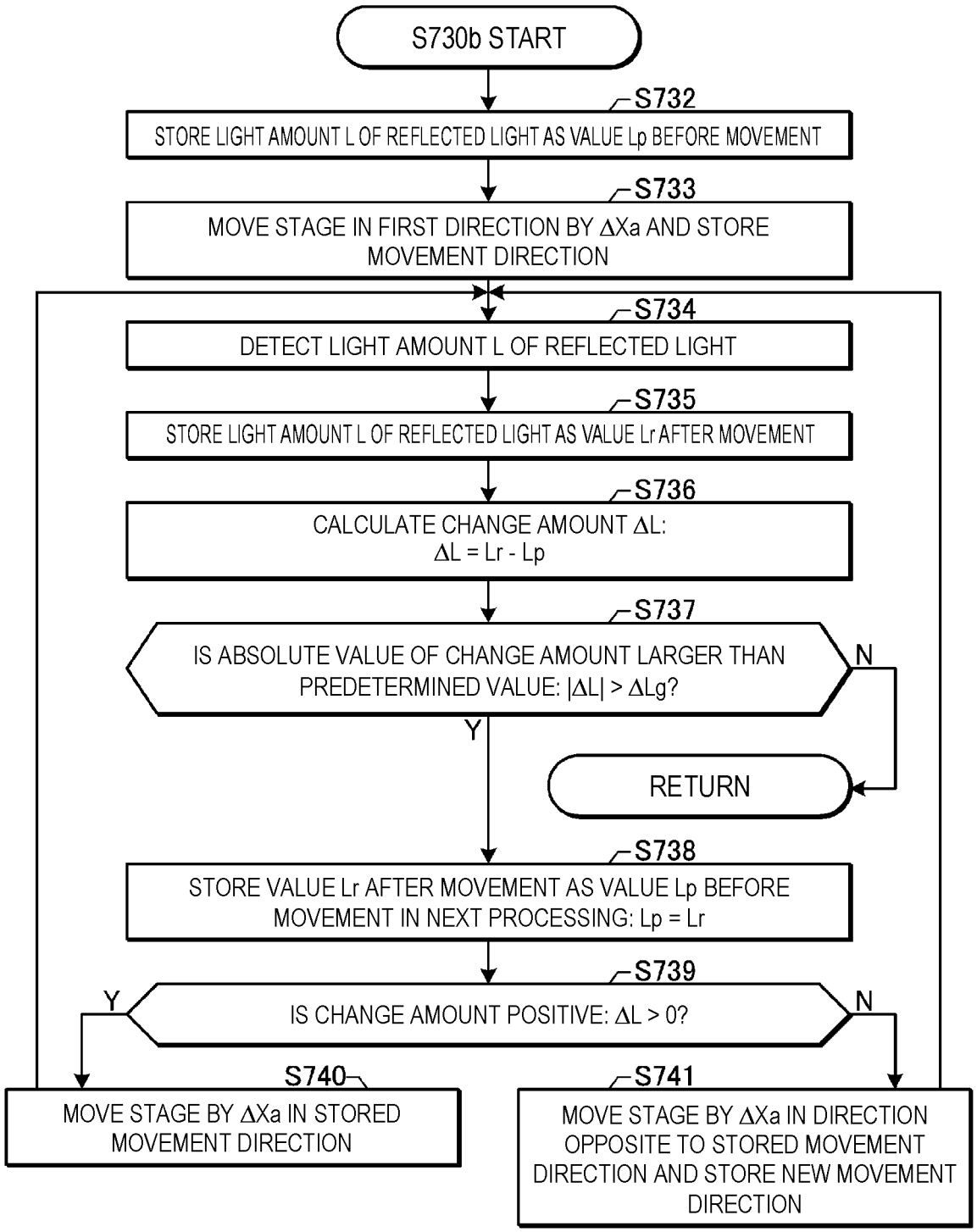
FIG. 13 is a flowchart illustrating details of processing of controlling a stage in the X direction in which a light amount L of reflected light increases.
Figure 14:
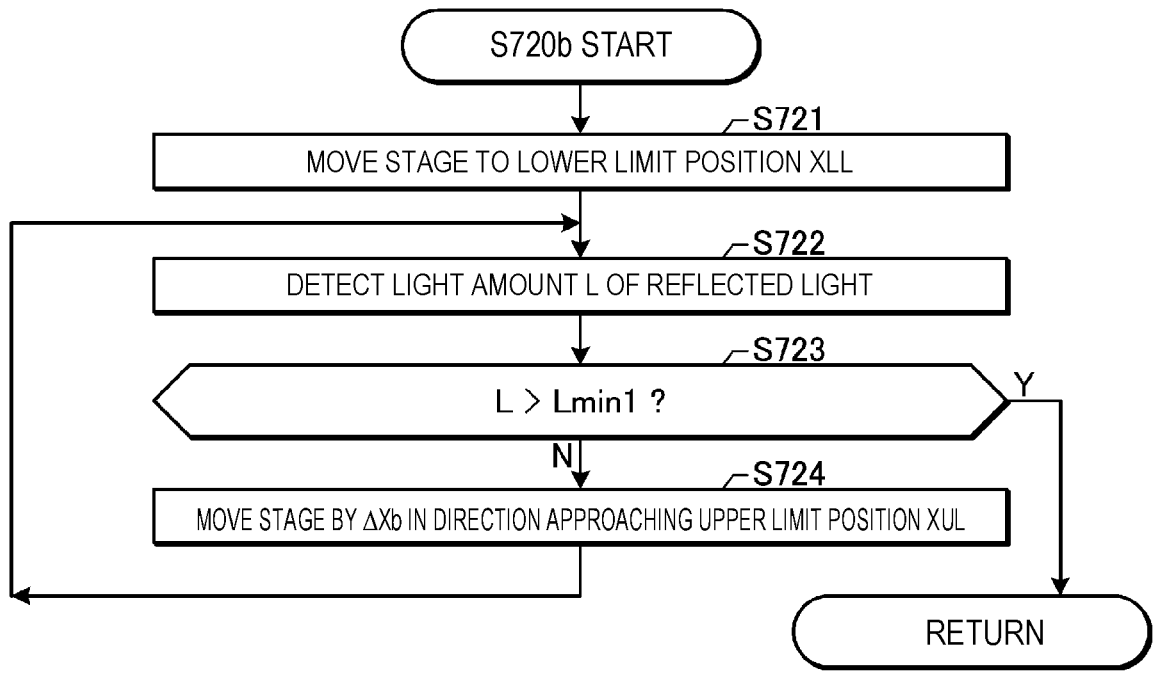
FIG. 14 is a flowchart illustrating details of processing of scanning the stage in the X direction to search for a focusing position at which reflected light can be detected.

5. EUV Light Generation System in which Stage Step Width is Changeable 5.1 Processing of Controlling Focusing Position in X Direction to Maximize Light Amount of Reflected Light FIG. 12 is a flowchart illustrating details of processing of controlling the focusing position in the X direction to maximize the measured light amount of reflected light in a third embodiment of the present disclosure. The third embodiment is different from the second embodiment in that processing illustrated in FIGS. 12 to 14 is performed in place of the processing illustrated in FIG. 11. The other features of the third embodiment are same as those of the second embodiment.

First at S701a, the EUV light generation control unit 5 detects the light amount L of reflected light while maintaining the current focusing position of the first guide laser beam G1. This is same as the corresponding processing in FIG. 11.

Subsequently at S702b, the EUV light generation control unit 5 determines whether the light amount L of reflected light is larger than a threshold Lmin1. When the light amount L of reflected light is larger than the threshold Lmin1 (YES at S702b), the EUV light generation control unit 5 forwards the process to S730b. When the light amount L of reflected light is equal to or smaller than the threshold Lmin1 (NO at S702b), the EUV light generation control unit 5 forwards the process to S720b.

At S720b, the EUV light generation control unit 5 scans the stage in the X direction to search for a focusing position at which reflected light can be detected. The processing at S720b will be described later in detail with reference to FIGS. 14 and 15. After S720b, the EUV light generation control unit 5 forwards the process to S730b.

At S730b, the EUV light generation control unit 5 controls the stage in one of the positive X direction and the negative X direction in which the light amount L of reflected light increases. The processing at S730b will be described later in detail with reference to FIG. 13. After S730b, the EUV light generation control unit 5 ends the processing of the present flowchart, and returns to the processing illustrated in FIG. 7.

5.1.1 Processing of Controlling Stage in X Direction in which Light Amount L of Reflected Light Increases FIG. 13 is a flowchart illustrating details of processing of controlling the stage in the X direction in which the light amount L of reflected light increases. The processing illustrated in FIG. 13 is performed as a subroutine of S730b in FIG. 12 by the EUV light generation control unit 5.

First at S732, the EUV light generation control unit 5 stores the light amount L of reflected light measured at S701a described above as a value Lp before movement in a storage unit (not illustrated).

Subsequently at S733, the EUV light generation control unit 5 moves the stage in a first direction by ΔXa, and stores the movement direction in the storage unit (not illustrated). The first direction may be the positive X direction or the negative X direction. The value ΔXa, which represents the movement distance of the stage, will be described later with reference to FIG. 15.

Subsequently at S734, the EUV light generation control unit 5 newly detects the light amount L of reflected light.

Subsequently at S735, the EUV light generation control unit 5 stores the newly detected light amount L of reflected light as a value Lr after movement in the storage unit (not illustrated).

Subsequently at S736, the EUV light generation control unit 5 calculates a change amount ΔL of the light amount due to the stage movement through an expression below.

$$\Delta L = Lr - Lp$$

Subsequently at S737, the EUV light generation control unit 5 determines whether the absolute value |ΔL| of the light amount change amount ΔL is larger than a predetermined value ΔLg. When the absolute value |ΔL| of the light amount change amount ΔL is equal to or smaller than the predetermined value ΔLg (NO at S737), it can be determined that the light amount L of reflected light is close to a local maximum value. In this case, the EUV light generation control unit 5 ends the processing of the present flowchart, and returns to the processing illustrated in FIG. 12. When the absolute value |ΔL| of the light amount change amount ΔL is larger than the predetermined value ΔLg (YES at S737), the EUV light generation control unit 5 forwards the process to S738.

At S738, the EUV light generation control unit 5 stores the value Lr after movement as the value Lp before movement in the next processing in the storage unit (not illustrated).

Subsequently at S739, the EUV light generation control unit 5 determines whether the light amount change amount ΔL is positive.

When the light amount change amount ΔL is positive (YES at S739), the EUV light generation control unit 5 forwards the process to S740. The positive light amount change amount ΔL indicates that the light amount L of reflected light has increased through the stage movement, and thus the light amount L of reflected light potentially further increases when the stage is moved in the same direction again. Thus, at S740, the EUV light generation control unit 5 moves the stage by ΔXa in a direction same as the stored movement direction. After S740, the EUV light generation control unit 5 returns the process to S734, and repeats the processing at S734 to S740 or S741.

When the light amount change amount ΔL is equal to or smaller than zero (NO at S739), the EUV light generation control unit 5 forwards the process to S741. The light amount change amount ΔL equal to or smaller than zero indicates that the light amount L of reflected light has not increased through the stage movement, and thus the light amount L of reflected light is not expected to increase when the stage is moved in the same direction again. Thus, at S741, the EUV light generation control unit 5 moves the stage by ΔXa in a direction opposite to the stored movement direction. In addition, at S741, the EUV light generation control unit 5 stores the new movement direction in the storage unit (not illustrated). After S741, the EUV light generation control unit 5 returns the process to S734, and repeats the processing at S734 to S740 or S741.

5.1.2 Processing of Scanning Stage in X Direction to Search for Focusing Position at which Reflected Light can be Detected FIG. 14 is a flowchart illustrating details of processing of scanning the stage in the X direction to search for a focusing position at which reflected light can be detected. The processing illustrated in FIG. 14 is performed as a subroutine of S720b in FIG. 12 by the EUV light generation control unit 5.

First at S721, the EUV light generation control unit 5 moves the stage to the lower limit position XLL.

Subsequently at S722, the EUV light generation control unit 5 detects the light amount L of reflected light.

Subsequently at S723, the EUV light generation control unit 5 determines whether the light amount L of reflected light is larger than the threshold Lmin1.

When the light amount L of reflected light is equal to or smaller than the threshold Lmin1 (NO at S723), the EUV light generation control unit 5 forwards the process to S724. At S724, the EUV light generation control unit 5 moves the stage by ΔXb in a direction approaching the upper limit position XUL of the stage. The value ΔXb, which represents the movement distance of the stage, is larger than ΔXa. After S724, the EUV light generation control unit 5 returns the process to S722, and repeats the processing at S722 to S724.

When the light amount L of reflected light has become larger than the threshold Lmin1 (YES at S723), the EUV light generation control unit 5 ends the processing of the present flowchart, and returns to the processing illustrated in FIG. 12. Thereafter, the processing at the EUV light generation control unit 5 transitions to processing illustrated in FIG. 13.

Figure 15:
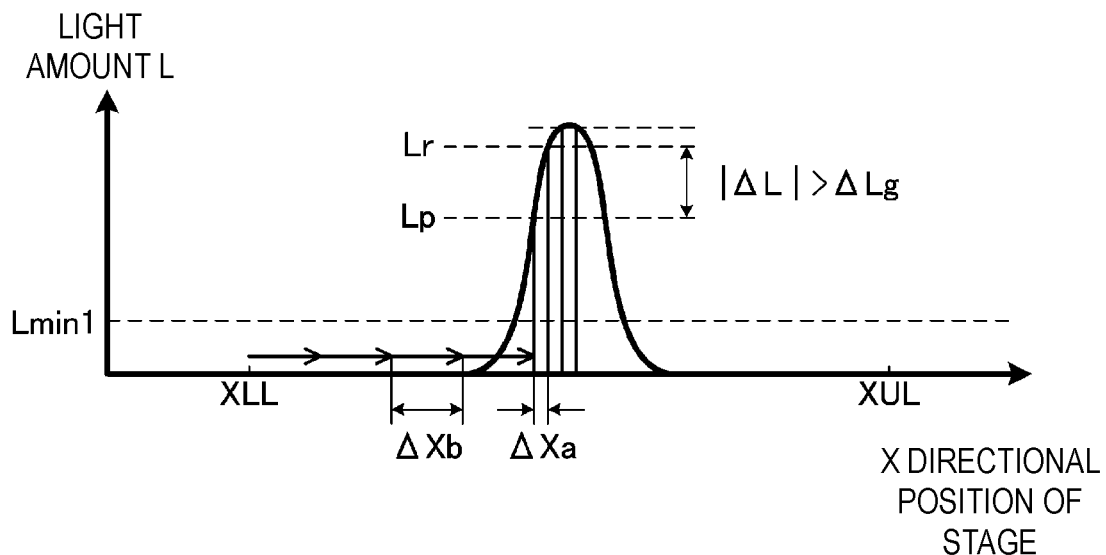
FIG. 15 is a diagram for description of processing of controlling the focusing position in the X direction.

FIG. 15 is a diagram for description of processing of controlling the focusing position in the X direction. In FIG. 15, the horizontal axis represents the X directional position of the stage, and the vertical axis represents the light amount L of reflected light.

When the light amount L of reflected light is larger than the threshold Lmin1 (YES at S702b in FIG. 12), the movement distance of the stage is set to be ΔXa (S733 in FIG. 13). When the absolute value |ΔL| of the light amount change amount through the stage movement is larger than the predetermined value ΔLg (YES at S737 in FIG. 13), the stage is further moved (S740 or S741 in FIG. 13). When the absolute value |ΔL| of the light amount change amount has become equal to or smaller than the predetermined value ΔLg (YES at S737 in FIG. 13), the focusing position control is completed.

When the light amount L of reflected light is equal to or smaller than the threshold Lmin1 (NO at S702b in FIG. 12), the stage is moved to the lower limit position XLL (S721 in FIG. 14), and the movement distance of the stage is set to be ΔXb (S724 in FIG. 14). When the light amount L of reflected light has become larger than the threshold Lmin1 (YES at S723 in FIG. 14), the processing at the EUV light generation control unit 5 transitions to processing in FIG. 13.

5.2 Effect

According to the processing illustrated in FIG. 14, when the light amount L of reflected light is equal to or smaller than the threshold Lmin1 and the light amount L is hardly detected, a focusing position at which reflected light can be detected can be searched. In this case, the number of times of repetitive processing to search for a focusing position at which reflected light can be detected can be reduced by setting the movement distance of the stage to be ΔXb.

According to the processing illustrated in FIG. 13, when the absolute value |ΔL| of the light amount change amount ΔL is equal to or smaller than the predetermined value ΔLg, it is determined that the light amount L of reflected light is close to the local maximum value, and the focusing position control is ended. Accordingly, the processing of controlling the focusing position in the X direction to maximize the light amount of reflected light can be ended early.

Figure 16:
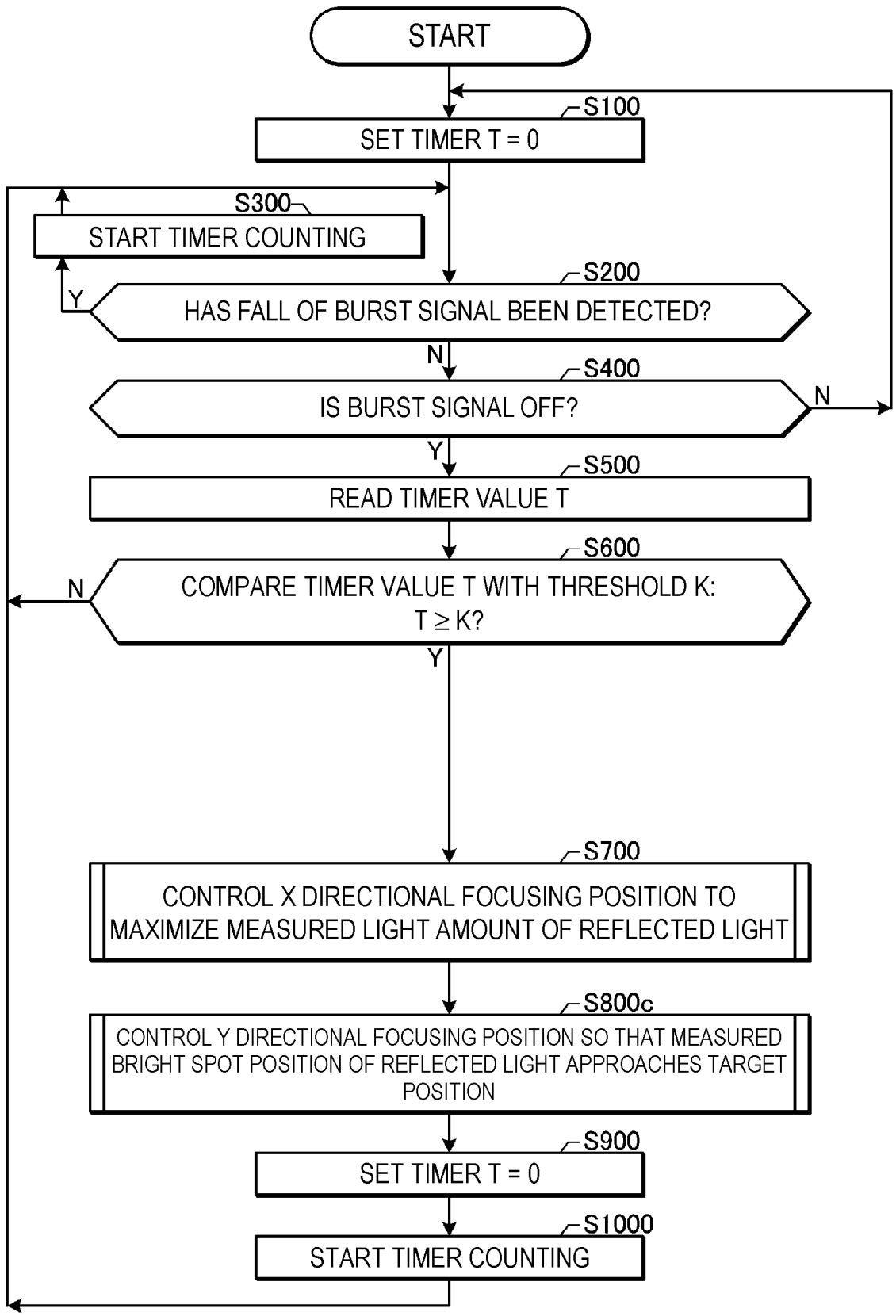
FIG. 16 is a flowchart illustrating the processing procedure of the optical path axis adjustment in a fourth embodiment.
Figure 17:
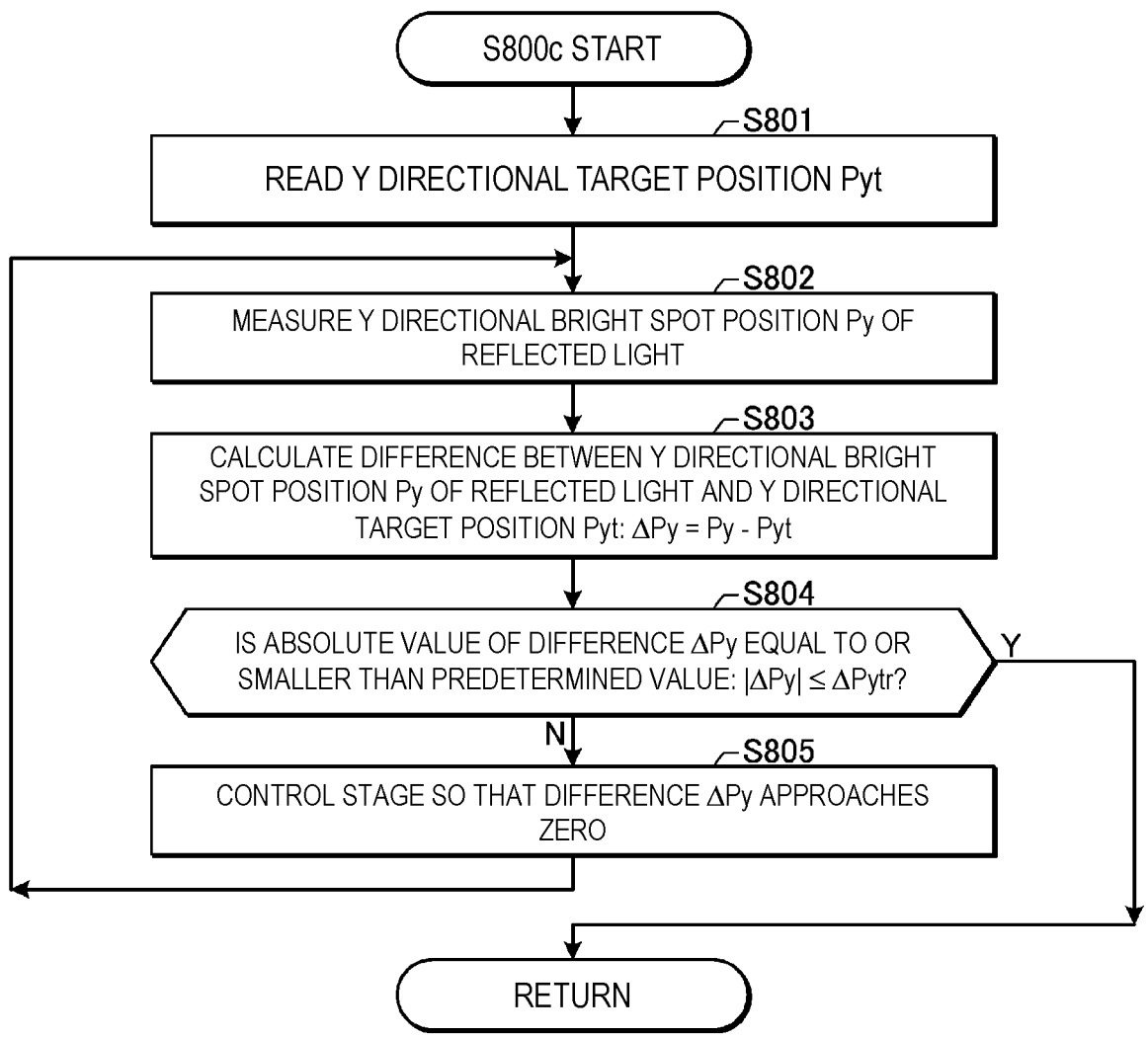
FIG. 17 is a flowchart illustrating details of processing of controlling a focusing position in the Y direction so that the FIG. 18 is a flowchart illustrating the processing procedure of the optical path axis adjustment in a fifth embodiment.

6. EUV Light Generation System in which Focusing Position in Y Direction is Controlled 6.1 Main Process FIG. 16 is a flowchart illustrating the processing procedure of the optical path axis adjustment in a fourth embodiment. The fourth embodiment is different from the first to third embodiments in that processing illustrated in FIGS. 16 and 17 is performed in place of the processing illustrated in FIG. 7. The other features of the fourth embodiment are same as those of optional one of the first to third embodiments.

In FIG. 16, processing at S100 to S700 is same as the processing illustrated in FIG. 7.

After S700, at S800c, the EUV light generation control unit 5 controls the focusing position in the Y direction through the laser beam focusing optical system 22a so that the bright spot position of reflected light of the first guide laser beam G1 measured by the optical sensor 80 approaches a target position. The focusing position in the Y direction is controlled, for example, when the bright spot position of reflected light is shifted in the Y direction as described with reference to FIG. 6C. The focusing position in the Y direction is controlled by, for example, controlling the stage including the laser beam focusing optical system actuator 84. The processing at S800c will be described later in detail with reference to FIG. 17. After S800c, the EUV light generation control unit 5 forwards the process to S900.

The processing at S900 and later is same as the processing illustrated in FIG. 7.

6.1.1 Processing of Controlling Focusing Position in Y Direction so that Bright Spot Position of Reflected Light Approaches Target Position FIG. 17 is a flowchart illustrating details of processing of controlling the focusing position in the Y direction so that the measured bright spot position of reflected light approaches the target position in the fourth embodiment. The processing illustrated in FIG. 17 is performed as a subroutine of S800c in FIG. 16 by the EUV light generation control unit 5.

First at S801, the EUV light generation control unit 5 reads data of a target position Pyt of the bright spot of reflected light in the Y direction from the storage unit (not illustrated).

Subsequently at S802, the EUV light generation control unit 5 measures the current Y directional position Py of the bright spot of reflected light. It is thought that the current Y directional position Py of the bright spot of reflected light indicates the focusing position of the first guide laser beam G1 in the Y direction.

Subsequently at S803, the EUV light generation control unit 5 calculates the difference ΔPy between the current Y directional position Py of the bright spot of reflected light and the target position Pyt of the bright spot of reflected light in the Y direction through an expression below.

$$\Delta Py = Py - Pyt$$

Subsequently at S804, the EUV light generation control unit 5 determines whether the absolute value |ΔPy| of the difference ΔPy is equal to or smaller than a predetermined value ΔPytr.

When the absolute value |ΔPy| is larger than the predetermined value ΔPytr (NO at S804), the EUV light generation control unit 5 forwards the process to S805.

At S805, the EUV light generation control unit 5 controls the stage so that the difference ΔPy approaches zero. After S805, the EUV light generation control unit 5 returns the process to S802 and repeats the processing at S802 to S805.

When the absolute value |ΔPy| is equal to or smaller than the predetermined value ΔPytr (YES at S804), it can be determined that the Y directional position of the bright spot of reflected light has approached the target position in the Y direction. Thus, the EUV light generation control unit 5 ends the processing of the present flowchart, and returns to the processing illustrated in FIG. 16.

6.2 Effect

According to the fourth embodiment, in the burst-off duration, the focusing position in the Y direction along the target trajectory is controlled in addition to the focusing position in the X direction across the target trajectory, which improves stability of the EUV light energy at the start of the next burst-on duration.

In the fourth embodiment, after the light amount L of reflected light becomes sufficiently large through control of the focusing position in the X direction at S700, the focusing position in the Y direction is controlled at S800c. Accordingly, the focusing position in the Y direction can be more precisely controlled.

Figure 18:
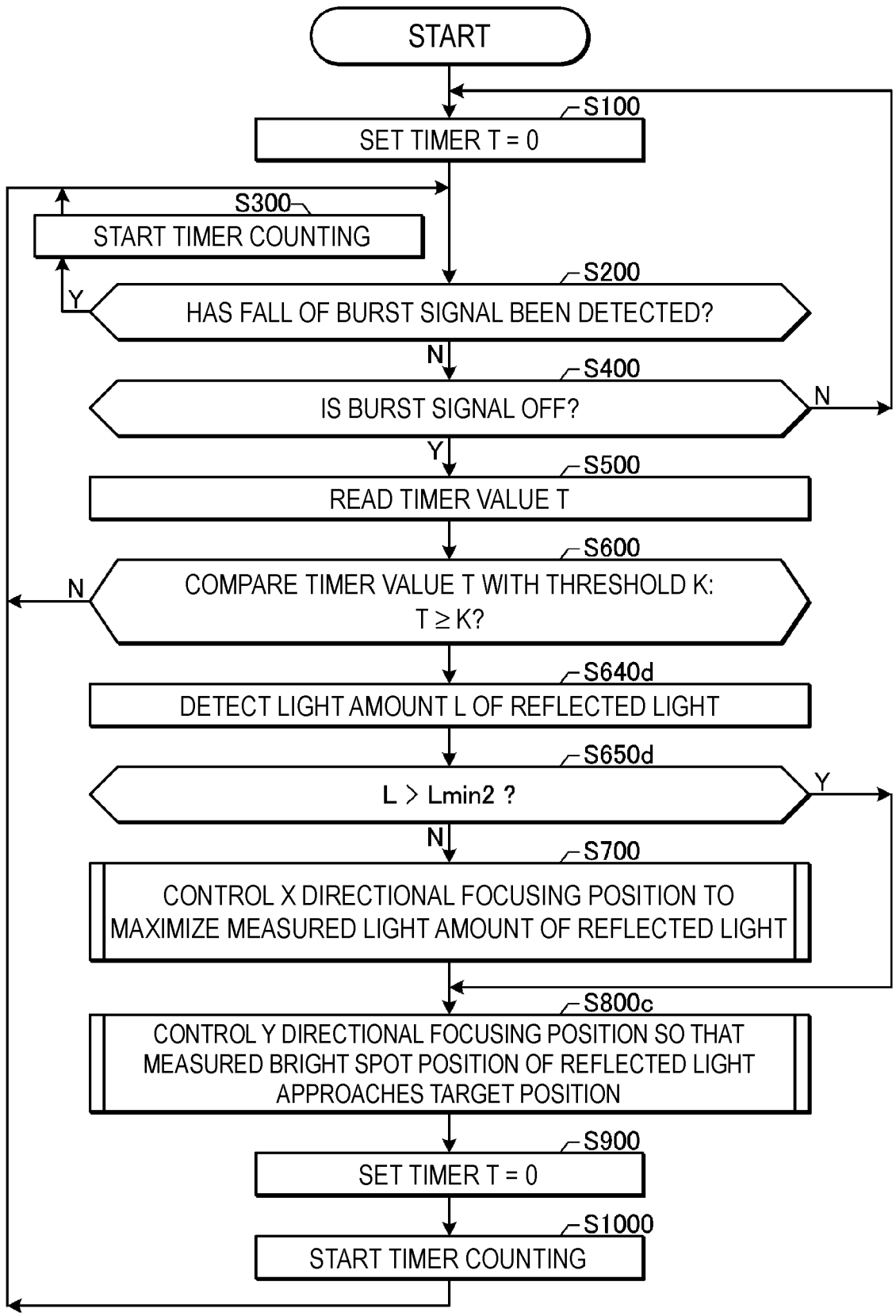

7. EUV Light Generation System in which Control of Focusing Position in X Direction is Skipped 7.1 Main Process FIG. 18 is a flowchart illustrating the processing procedure of the optical path axis adjustment in a fifth embodiment. The fifth embodiment is different from the fourth embodiment in that processing illustrated in FIG. 18 is performed in place of the processing illustrated in FIG. 16. The other features of the fifth embodiment are same as those of the fourth embodiment.

In FIG. 18, processing at S100 to S600 is same as the processing illustrated in FIG. 16.

After S600, at S640d, the EUV light generation control unit 5 detects the light amount L of reflected light while maintaining the current focusing position of the first guide laser beam G1.

Subsequently at S650d, the EUV light generation control unit 5 determines whether the light amount L of reflected light is larger than a threshold Lmin2.

When the light amount L of reflected light is equal to or smaller than the threshold Lmin2 (NO at S650d), the EUV light generation control unit 5 forwards the process to S700. The processing at S700 and later is same as the processing illustrated in FIG. 16. However, since the light amount L of reflected light is already detected at S640d, the processing at S701a illustrated in FIG. 11 or FIG. 12 may be omitted at S700.

When the light amount L of reflected light is larger than the threshold Lmin2 (YES at S650d), the EUV light generation control unit 5 skips the processing at S700 and forwards the process to S800c.

7.2 Effect

In the fifth embodiment, the processing at S700 is skipped when the light amount L of reflected light is larger than the threshold Lmin2 and the focusing position in the X direction is determined to be in a desired range. Accordingly, the optical path axis control can be speeded up.

Figure 19:
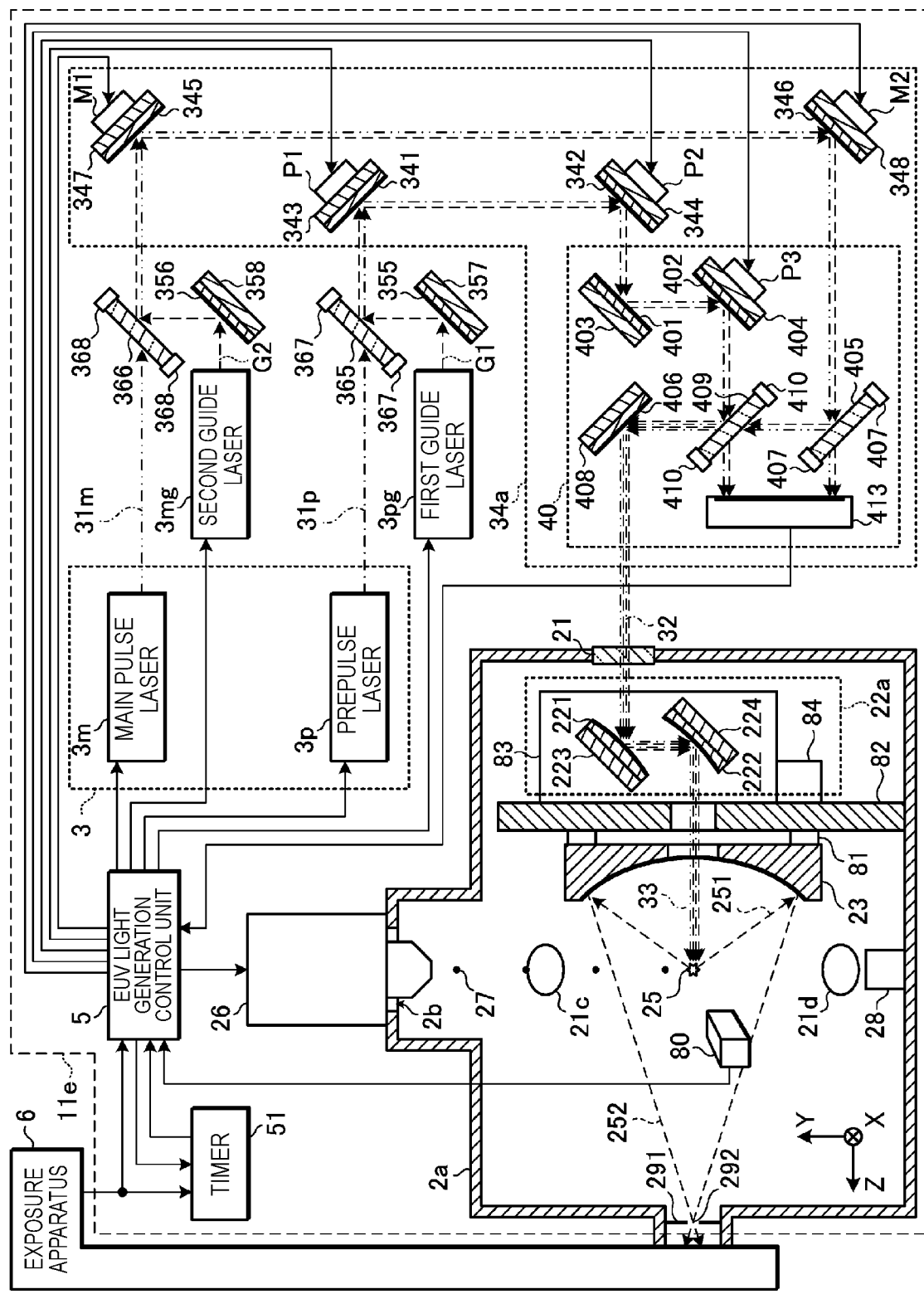
FIG. 19 is a partially cross-sectional view illustrating the configuration of an EUV light generation system 11e according to a sixth embodiment of the present disclosure.

8. EUV Light Generation System in which Mirror of Laser Beam Traveling Direction Control Unit is Controlled 8.1 Configuration FIG. 19 is a partially cross-sectional view illustrating the configuration of an EUV light generation system 11e according to a sixth embodiment of the present disclosure. In the sixth embodiment, the EUV light generation system 11e includes an actuator P3 in addition to the configuration of the first embodiment illustrated in FIG. 5. The actuator P3 is attached to the holder 404 of the high reflectance mirror 402. The actuator P3 changes the reflection directions of the prepulse laser beam 31p and the first guide laser beam G1 by changing the posture of the high reflectance mirror 402.

The sixth embodiment is different from the third embodiment in that the actuator P3 is controlled instead of the laser beam focusing optical system actuator 84 in the burst-off duration. The other features of the sixth embodiment are same as those of the third embodiment. In the first, second, fourth, and fifth embodiments, the same modification is possible with a configuration including the actuator P3.

In FIG. 19, illustration of a signal line from the EUV light generation control unit 5 to the laser beam focusing optical system actuator 84 is omitted to exaggerate difference from the third embodiment. However, this does not exclude control of the laser beam focusing optical system actuator 84 by the EUV light generation control unit 5 in the burst-on duration or the like.

The following describes, with reference to FIG. 19, a case in which the posture of the high reflectance mirror 402 is changed in the burst-off duration, but the present disclosure is not limited thereto. In the burst-off duration, the posture of the high reflectance mirror 342 may be changed by the actuator P2. The posture of the high reflectance mirror 346 may be changed by the actuator M2 to control the optical path axes of the main pulse laser beam 31m and the second guide laser beam G2. The posture of another mirror may be changed.

8.2 Operation

In the sixth embodiment, the main process of the processing procedure of the optical path axis adjustment is same as that in FIG. 7. In the sixth embodiment, the method of controlling the actuator P3 is employed at S700 in FIG. 7 as another exemplary method of controlling the focusing position in the X direction. Details of S700 will be described with reference to FIGS. 20 to 23 in a case in which the control of the laser beam focusing optical system actuator 84 in the third embodiment is replaced with control of the actuator P3. Here, the same replacement is possible in the first, second, fourth, and fifth embodiments.

Figure 20:
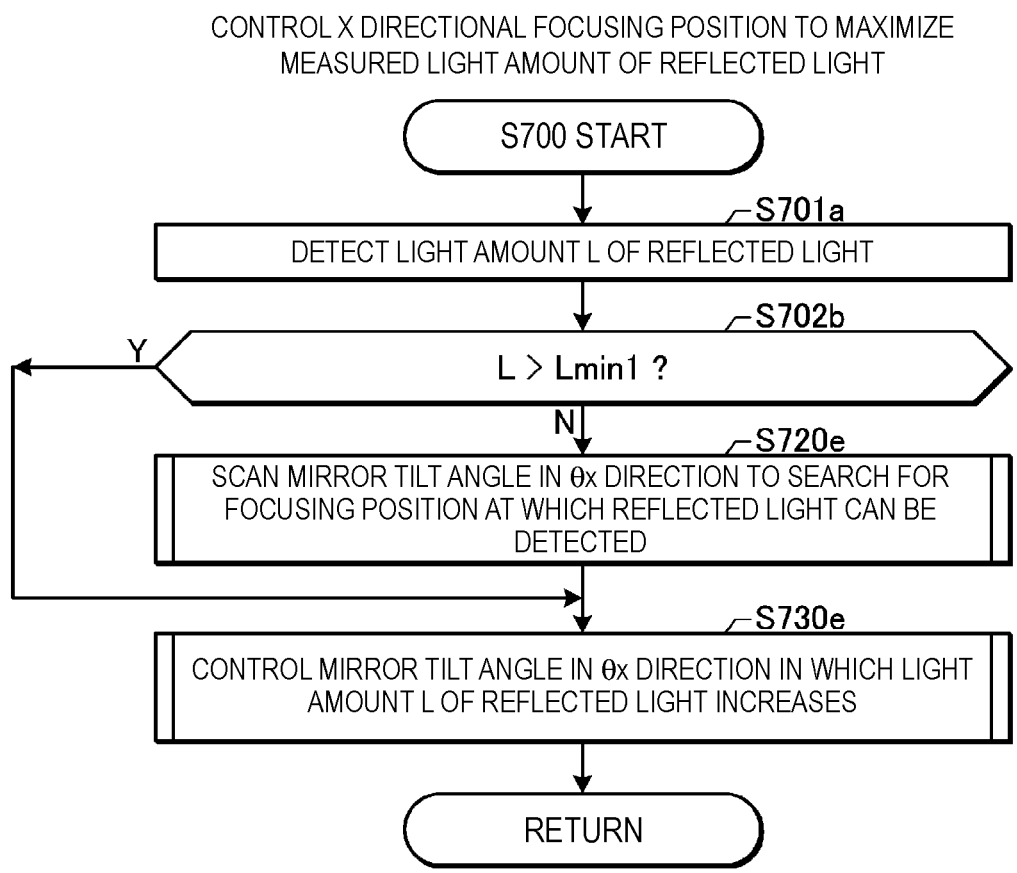
FIG. 20 is a flowchart illustrating exemplary processing of controlling the focusing position in the X direction to maximize the measured light amount of reflected light in the sixth embodiment.

8.2.1 Processing of Controlling Focusing Position in X Direction to Maximize Light Amount of Reflected Light FIG. 20 is a flowchart illustrating exemplary processing of controlling the focusing position in the X direction to maximize the measured light amount of reflected light in the sixth embodiment. The processing illustrated in FIG. 20 is performed as a subroutine of S700 in FIG. 7 by the EUV light generation control unit 5.

Processing at S701a and S702b are same as those described with reference to FIG. 12.

Subsequently at S720e, the EUV light generation control unit 5 scans the tilt angle of a mirror in a θx direction to search for a focusing position at which reflected light can be detected. The processing at S720e will be described later in detail with reference to FIGS. 22 and 23. After S720e, the EUV light generation control unit 5 forwards the process to S730e. The θx direction is the rotational direction of the mirror in which the position of the optical path axis of the first guide laser beam G1 near the plasma generation region 25 is moved in the X direction.

At S730e, the EUV light generation control unit 5 controls the mirror tilt angle in one of the positive θx direction and the negative θx direction in which the light amount L of reflected light increases. The processing at S730e will be described later in detail with reference to FIG. 21. After S730e, the EUV light generation control unit 5 ends the processing of the present flowchart, and returns to the processing illustrated in FIG. 7.

Figure 21:
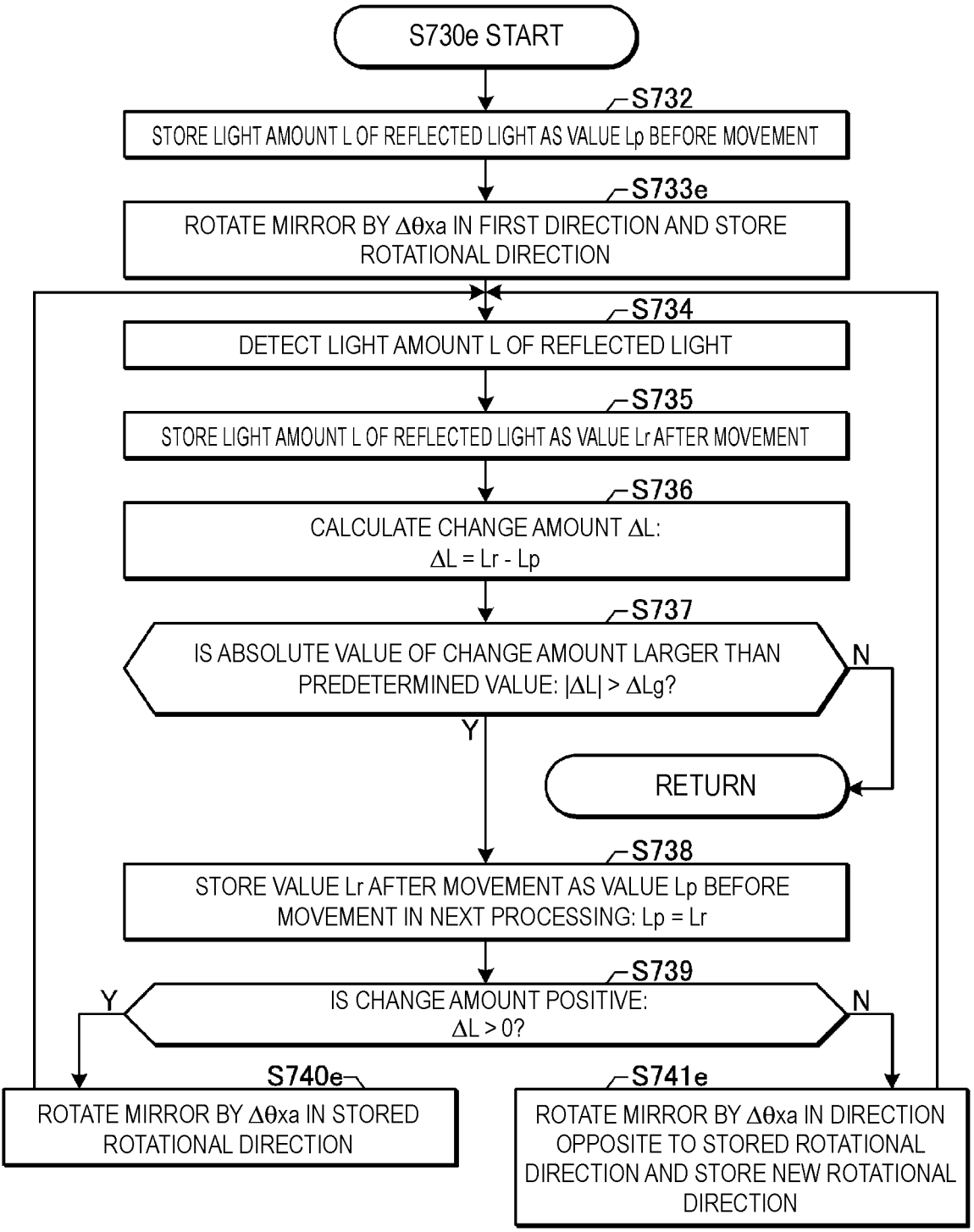
FIG. 21 is a flowchart illustrating details of processing of controlling a mirror tilt angle in a θx direction in which the light amount L of reflected light increases.

8.2.1.1 Processing of Controlling Mirror Tilt Angle in θx Direction in which Light Amount L of Reflected Light Increases FIG. 21 is a flowchart illustrating details of processing of controlling the mirror tilt angle in the θx direction in which the light amount L of reflected light increases. The processing illustrated in FIG. 21 is performed as a subroutine of S730e in FIG. 20 by the EUV light generation control unit 5.

Processing at S732 is same as that described with reference to FIG. 13.

Subsequently at S733e, the EUV light generation control unit 5 rotates the mirror in the first direction by $\Delta\theta xa$, and stores the rotational direction in the storage unit (not illustrated). The first direction may be the positive θx direction or the negative θx direction. The angle $\Delta\theta xa$ indicating the rotation angle of the mirror will be described later with reference to FIG. 23.

The subsequent processing at S734 to S739 is same as that described with reference to FIG. 13.

At S739, when the light amount change amount $\Delta L$ is positive (YES at S739), the EUV light generation control unit 5 forwards the process to S740e. The positive light amount change amount $\Delta L$ indicates that the light amount L of reflected light has increased through the mirror rotation, and thus the light amount L of reflected light is potentially further increased when the mirror is rotated in the same direction again. Thus, at S740e, the EUV light generation control unit 5 rotates the mirror by $\Delta\theta xa$ in a direction same as the stored movement direction. After S740e, the EUV light generation control unit 5 returns the process to S734, and repeats the processing at S734 to S740e or S741e.

When the light amount change amount $\Delta L$ is equal to or smaller than zero (NO at S739), the EUV light generation control unit 5 forwards the process to S741e. The light amount change amount $\Delta L$ equal to or smaller than zero indicates that the light amount L of reflected light has not increased through the mirror rotation, and thus the light amount L of reflected light is not expected to increase when the mirror is rotated in the same direction again. Thus, at S741e, the EUV light generation control unit 5 rotates the mirror by $\Delta\theta xa$ in a direction opposite to the stored movement direction. In addition, at S741e, the EUV light generation control unit 5 stores the new rotational direction in the storage unit (not illustrated). After S741e, the EUV light generation control unit 5 returns the process to S734, and repeats the processing at S734 to S740e or S741e.

Figure 22:
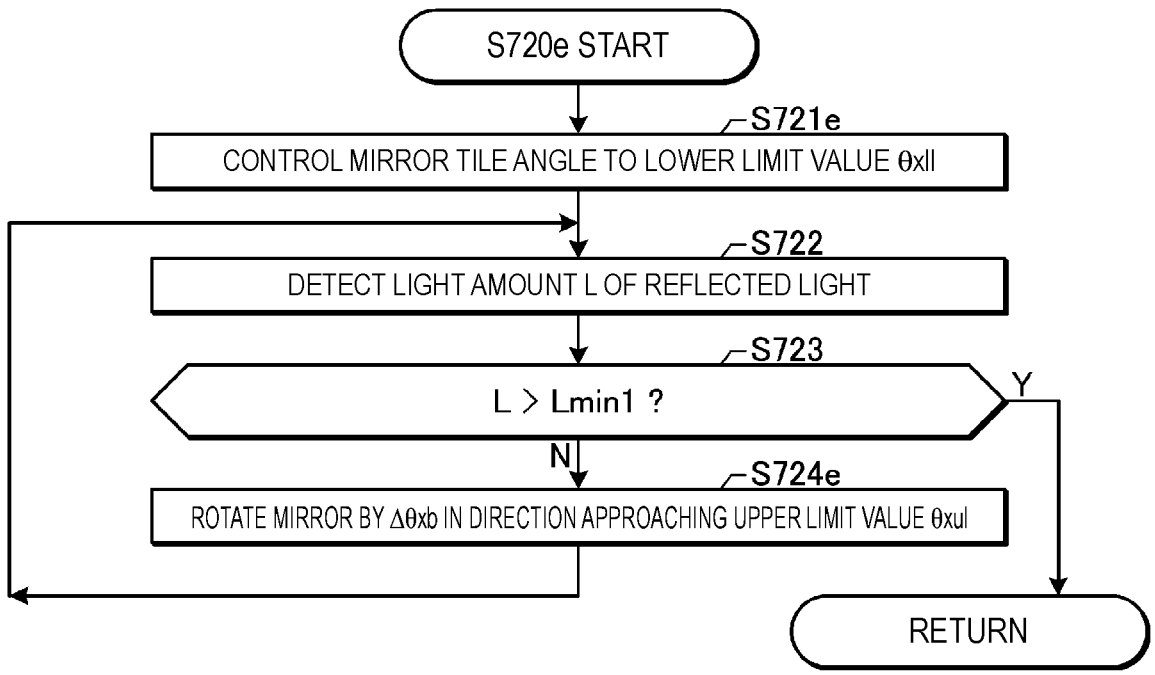
FIG. 22 is a flowchart illustrating details of processing of scanning the mirror tilt angle in the θx direction to search for a focusing position at which reflected light can be detected.

8.2.1.2 Processing of Scanning Mirror Tilt Angle in θx Direction to Search for Focusing Position at which Reflected Light can be Detected FIG. 22 is a flowchart illustrating details of processing of scanning the mirror tilt angle in the θx direction to search for a focusing position at which reflected light can be detected. The processing illustrated in FIG. 22 is performed as a subroutine of S720e in FIG. 20 by the EUV light generation control unit 5.

First at S721e, the EUV light generation control unit 5 controls the mirror tilt angle to a lower limit value $\theta x11$.

The subsequent processing at S722 and S723 is same as that described with reference to FIG. 14.

At S723, when the light amount L of reflected light is equal to or smaller than the threshold Lmin1 (NO at S723), the EUV light generation control unit 5 forwards the process to S724e. At S724e, the EUV light generation control unit 5 rotates the mirror by $\Delta\theta xb$ in a direction approaching an upper limit value $\theta xu1$ of the mirror tilt angle. The value $\Delta\theta xb$ indicating the rotation angle of the mirror is larger than $\Delta\theta xa$. After S724e, the EUV light generation control unit 5 returns the process to S722, and repeats the processing at S722 to S724e.

Figure 23:
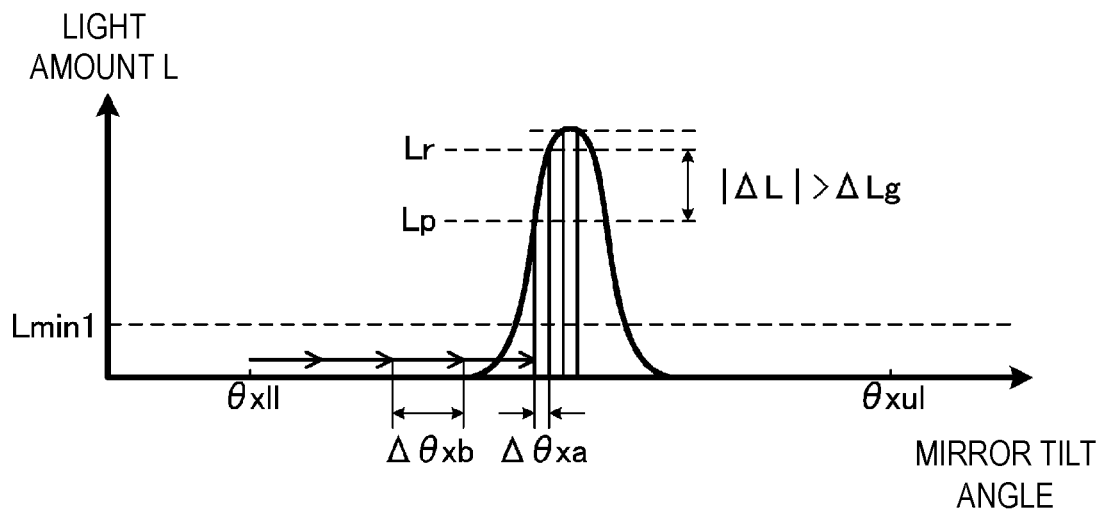
FIG. 23 is a diagram for description of processing of controlling the focusing position in the X direction.

FIG. 23 is a diagram for description of processing of controlling the focusing position in the X direction. In FIG. 23, the horizontal axis represents the X directional tilt angle of the mirror, and the vertical axis represents the light amount L of reflected light.

When the light amount L of reflected light is larger than the threshold Lmin1 (YES at S702b in FIG. 20), the rotation angle of the mirror is set to be $\Delta\theta xa$ (S733e in FIG. 21). When the absolute value $|\Delta L|$ of the light amount change amount through the mirror rotation is larger than the predetermined value $\Delta Lg$ (YES at S737 in FIG. 21), the mirror is further rotated (S740e or S741e in FIG. 21). When the absolute value $|\Delta L|$ of the light amount change amount has become equal to or smaller than the predetermined value $\Delta Lg$ (YES at S737 in FIG. 21), the focusing position control is completed.

When the light amount L of reflected light is equal to or smaller than the threshold Lmin1 (NO at S702b in FIG. 20), the mirror tilt angle is controlled to the lower limit value $\theta x11$ (S721e in FIG. 22), and the rotation angle of the mirror is set to be $\Delta\theta xb$ (S724e in FIG. 22). When the light amount L of reflected light has become larger than the threshold Lmin1 (YES at S723 in FIG. 22), the processing at the EUV light generation control unit 5 transitions to processing in FIG. 21.

8.3 Effect

According to the sixth embodiment, the position of the optical path axis of the first guide laser beam G1 near the plasma generation region 25 can be moved through rotation of the high reflectance mirror 402 by the actuator P3. The optical path axis control by the actuator P3 is expected to achieve responsiveness higher than the optical path axis control by the laser beam focusing optical system actuator 84. According to the sixth embodiment, the optical path axis control can be performed at high speed.

9. EUV Light Generation System in which Focusing Position in Y Direction is Controlled by Mirror of Laser Beam Traveling Direction Control Unit The following describes a seventh embodiment of the present disclosure with reference to FIG. 24. The configuration of an EUV light generation system according to the seventh embodiment is same as that of the EUV light generation system 11e described with reference to FIG. 19, and thus includes the actuator P3.

9.1 Operation

In the seventh embodiment, the main process of the processing procedure of the optical path axis adjustment is same as that illustrated in FIG. 16 or FIG. 18. In the seventh embodiment, the method of controlling the actuator P3 is employed at S800c in FIG. 16 or FIG. 18 as another exemplary method of controlling the focusing position in the Y direction.

In the seventh embodiment, similarly to the sixth embodiment, the method of controlling the actuator P3 may be employed at S700 in FIG. 16 or FIG. 18 as another exemplary method of controlling the focusing position in the X direction. This description is made above in the sixth embodiment and thus is omitted here.

Figure 24:
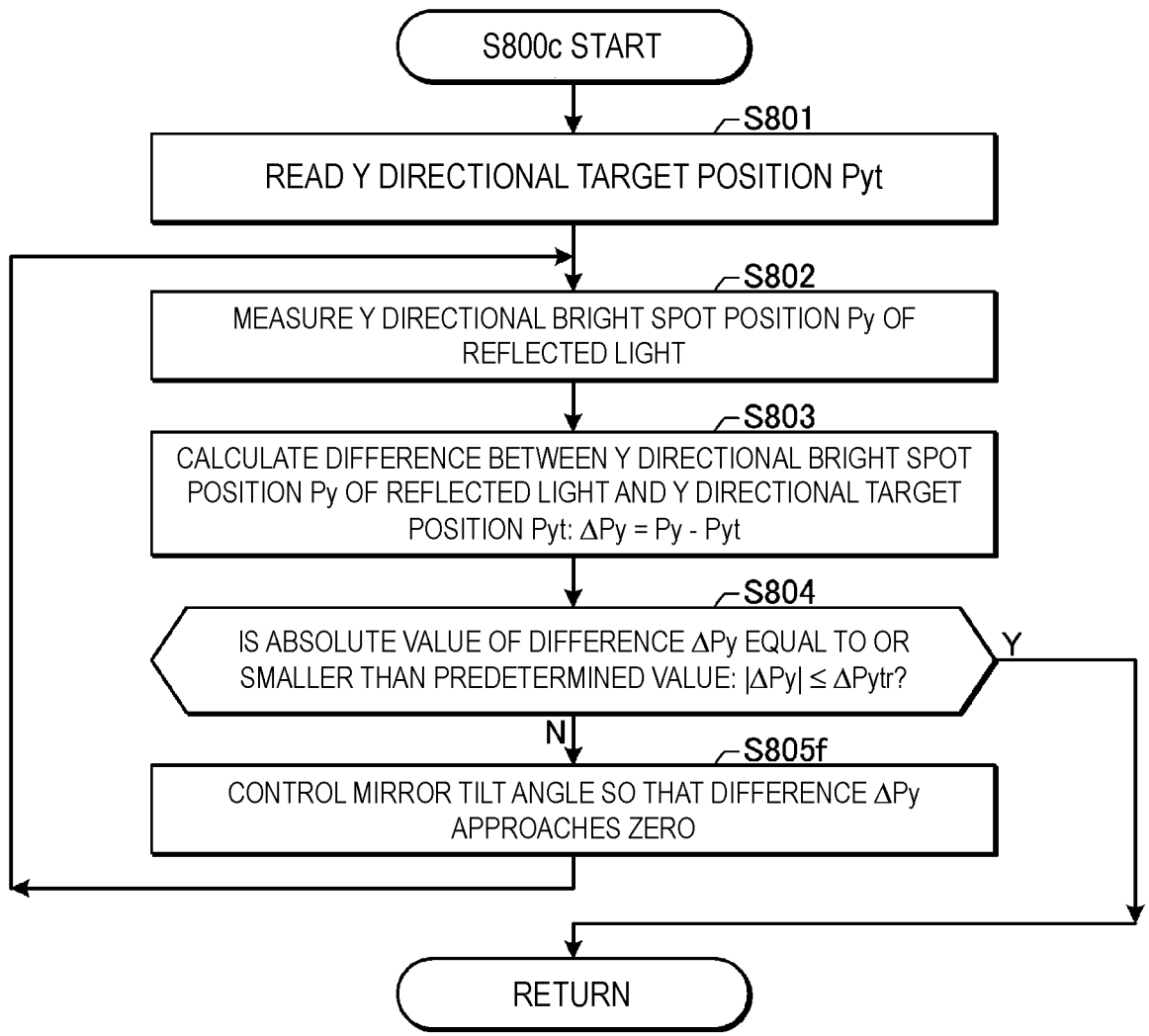
FIG. 24 is a flowchart illustrating details of processing of controlling the focusing position in the Y direction so that a measured position of a bright spot of reflected light approaches a target position in a seventh embodiment.

9.1.1 Processing of Controlling Focusing Position in Y Direction so that Bright Spot Position of Reflected Light Approaches Target Position FIG. 24 is a flowchart illustrating details of processing of controlling the focusing position in the Y direction so that the measured bright spot position of reflected light approaches the target position in the seventh embodiment.

Processing at S801 to S804 is same as the corresponding processing in FIG. 17.

At S804, when the absolute value |ΔPy| of the difference ΔPy is larger than the predetermined value ΔPytr (NO at S804), the EUV light generation control unit 5 forwards the process to S805f.

At S805f, the EUV light generation control unit 5 controls the mirror tilt angle so that the difference ΔPy approaches zero. After S805f, the EUV light generation control unit 5 returns the process to S802 and repeats the processing at S802 to S805f.

Figure 25:
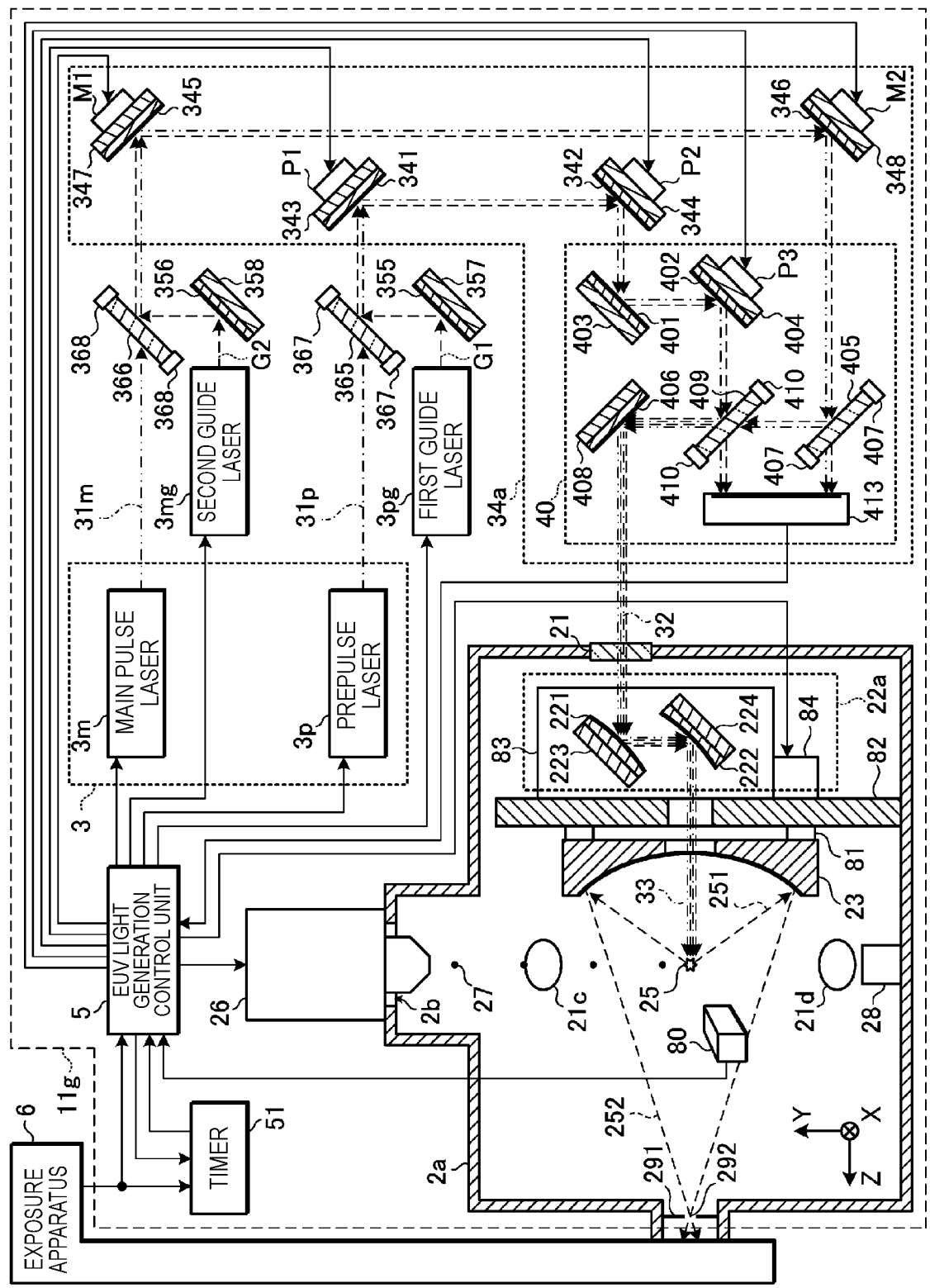
FIG. 25 is a partially cross-sectional view illustrating the configuration of an EUV light generation system 11g according to an eighth embodiment of the present disclosure.

10. EUV Light Generation System in which Stage of Laser Beam Focusing Optical System and Mirror of Laser Beam Traveling Direction Control Unit are Controlled 10.1 Configuration FIG. 25 is a partially cross-sectional view illustrating the configuration of an EUV light generation system 11g according to an eighth embodiment of the present disclosure. In the eighth embodiment, the signal line from the EUV light generation control unit 5 to the laser beam focusing optical system actuator 84 is illustrated in the EUV light generation system 11g in addition to the configuration of the sixth embodiment illustrated in FIG. 19. The other features are same as those described with reference to FIG. 19.

10.2 Operation

In the eighth embodiment, the actuator P3 and the laser beam focusing optical system actuator 84 are both controlled in the burst-off duration.

In the eighth embodiment, the main process of the processing procedure of the optical path axis adjustment is same as that in FIG. 7. In the eighth embodiment, the method of controlling both the actuator P3 and the laser beam focusing optical system actuator 84 is employed at S700 in FIG. 7 as another exemplary method of controlling the focusing position in the X direction. Details of S700 will be described with reference to FIGS. 26 to 28 in a case in which the control of the laser beam focusing optical system actuator 84 in the third embodiment is replaced with the control of both the actuator P3 and the laser beam focusing optical system actuator 84. Here, the same replacement is possible in the first, second, fourth, and fifth embodiments.

Figure 26:
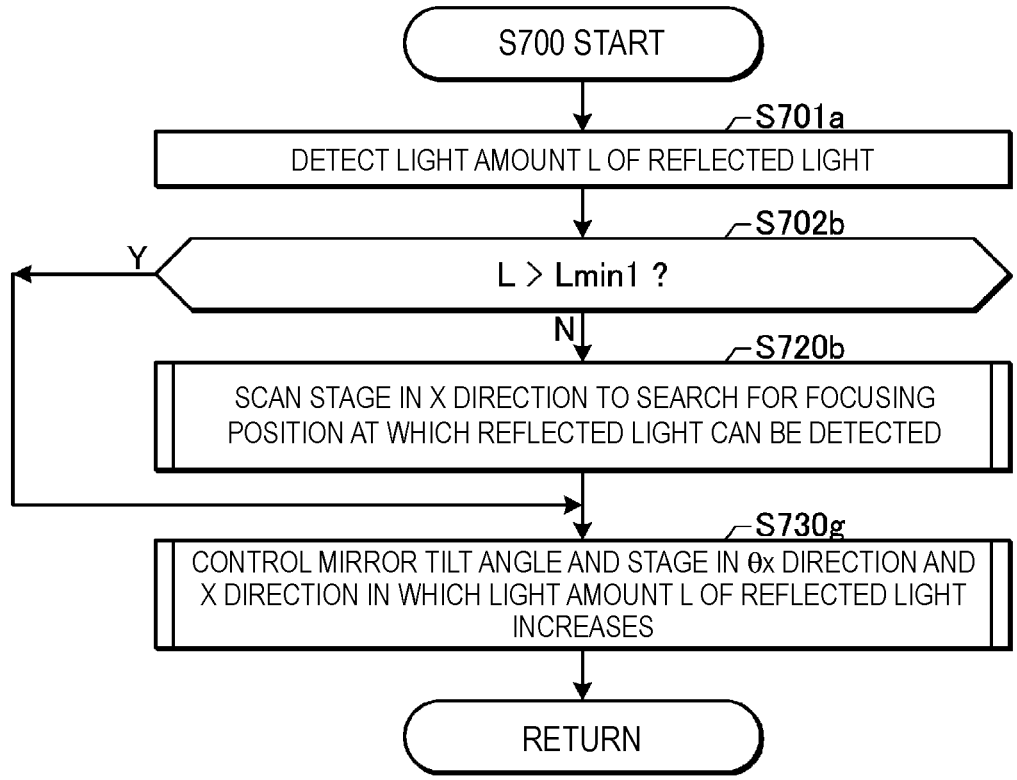
FIG. 26 is a flowchart illustrating exemplary processing of controlling the focusing position in the X direction to maximize the measured light amount of reflected light in the eighth embodiment.

10.2.1 Processing of Controlling Focusing Position in X Direction to Maximize Light Amount of Reflected Light FIG. 26 is a flowchart illustrating exemplary processing of controlling the focusing position in the X direction to maximize the measured light amount of reflected light in the eighth embodiment. The processing illustrated in FIG. 26 is performed as a subroutine of S700 in FIG. 7 by the EUV light generation control unit 5.

Processing at S701a, S702b, and S720b is same as that described with reference to FIG. 12.

Subsequently at S730g, the EUV light generation control unit 5 controls the mirror tilt angle in one of the positive θx direction and the negative θx direction in which the light amount L of reflected light increases, and thereafter controls the stage in the X direction. The processing at S730g will be described later in detail with reference to FIG. 27. After S730g, the EUV light generation control unit 5 ends the processing of the present flowchart, and returns to the processing illustrated in FIG. 7.

Figure 27:
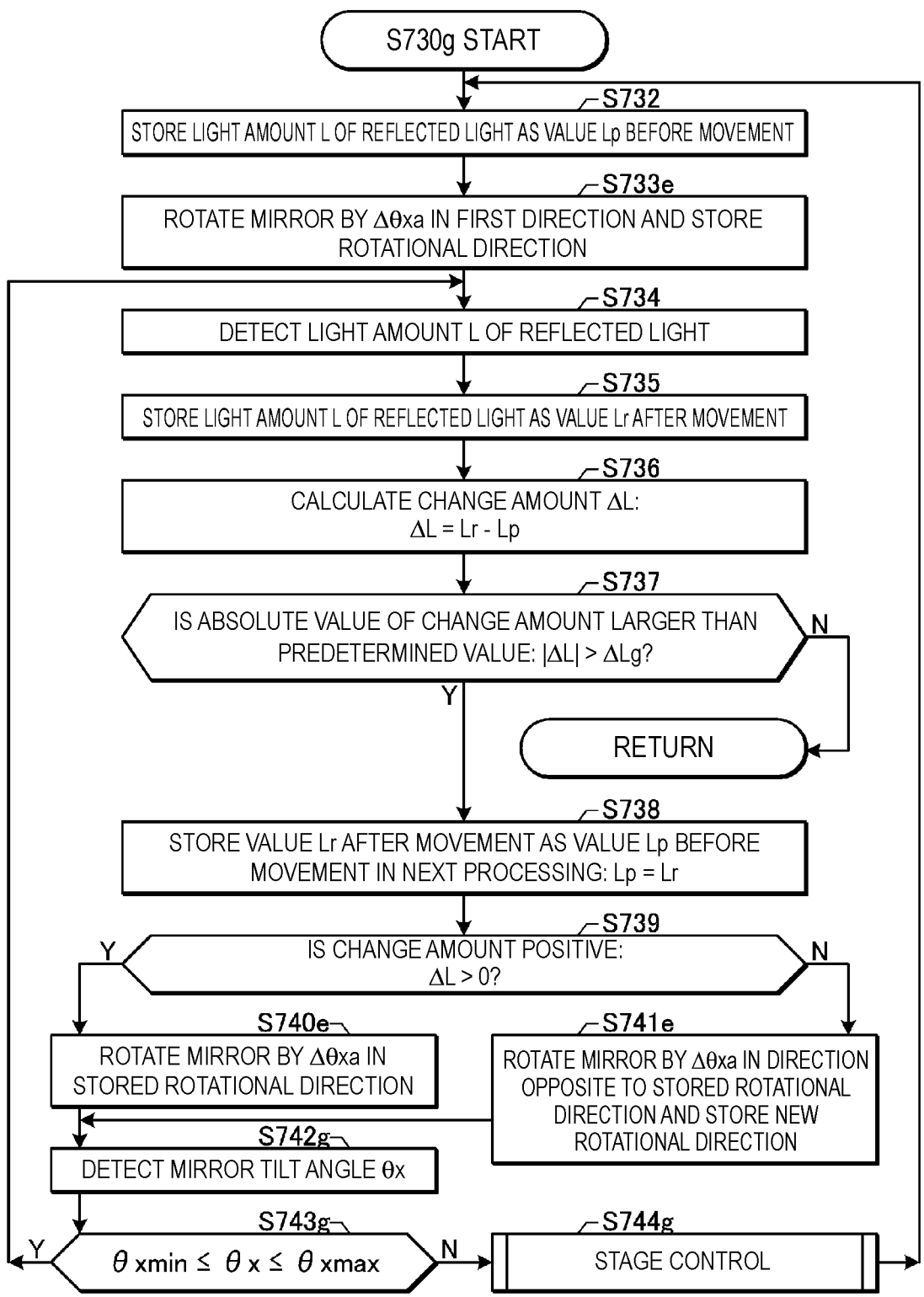
FIG. 27 is a flowchart illustrating details of processing of controlling the mirror tilt angle in the θx direction in which the light amount L of reflected light increases and then controlling the stage in the X direction.

10.2.1.1 Processing of Controlling Mirror Tilt Angle in θx Direction in which Light Amount L of Reflected Light Increases and then Controlling Stage in X Direction FIG. 27 is a flowchart illustrating details of processing of controlling the mirror tilt angle in the θx direction in which the light amount L of reflected light increases, and thereafter controlling the stage in the X direction. The processing illustrated in FIG. 27 is performed as a subroutine of S730g in FIG. 26 by the EUV light generation control unit 5.

Processing at S732 to S740e or S741e is same as that described with reference to FIG. 21.

In FIG. 27, the EUV light generation control unit 5 forwards the process to S742g after S740e or S741e.

At S742g, the EUV light generation control unit 5 detects the current mirror tilt angle θx.

Subsequently at S743g, the EUV light generation control unit 5 determines whether the current mirror tilt angle θx is in the range of a first value θxmin to a second value θxmax inclusive. The first value θxmin and the second value θxmax are set to be values in a range in which aberration due to change of the mirror tilt angle is negligible.

When the current mirror tilt angle θx is in the range of the first value θxmin to the second value θxmax inclusive (YES at S743g), the EUV light generation control unit 5 returns the process to S734 and repeats the processing at S734 to S743g.

When the current mirror tilt angle θx is out of the range of the first value θxmin to the second value θxmax inclusive (NO at S743g), the EUV light generation control unit 5 forwards the process to S744g.

At S744g, the EUV light generation control unit 5 executes a stage control subroutine. The stage control subroutine will be described later with reference to FIG. 28.

After S744g, the EUV light generation control unit 5 returns the process to S732.

10.2.1.1.1 Stage Control Subroutine

Figure 28:
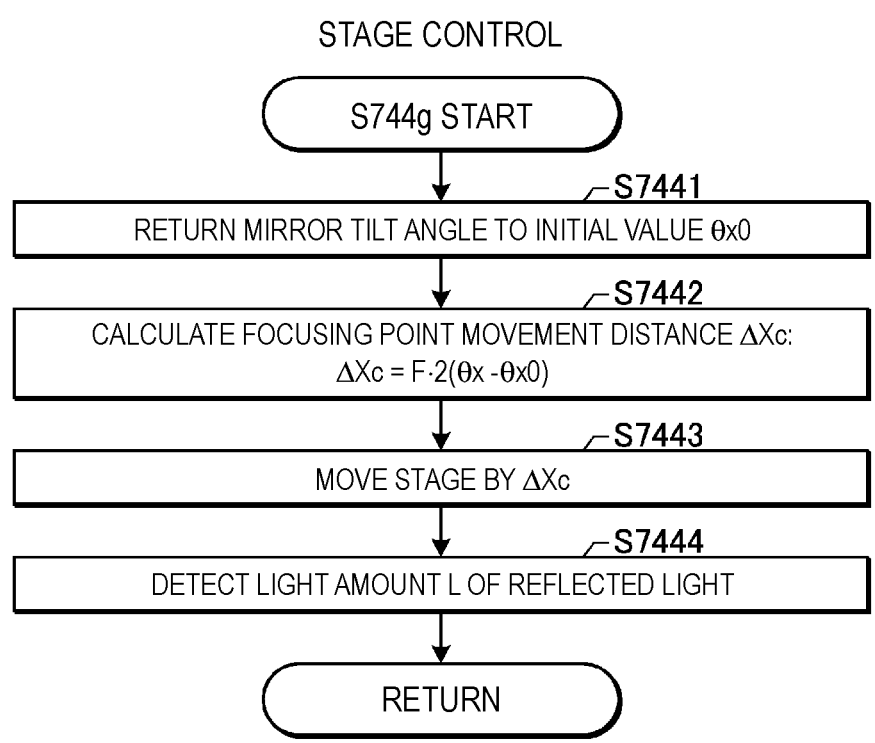
FIG. 28 is a flowchart illustrating details of a stage control subroutine.

FIG. 28 is a flowchart illustrating details of the stage control subroutine.

First at S7441, the EUV light generation control unit 5 returns the mirror tilt angle from the current mirror tilt angle θx to an initial value θx0.

Subsequently at S7442, the EUV light generation control unit 5 calculates a movement distance ΔXc of the focusing point when the mirror tilt angle is moved from the initial value θx0 to θx through an expression below.

$$\Delta Xc = F \cdot 2(\theta x - \theta x0)$$

In the expression, F represents distance along the laser beam optical path from the high reflectance mirror 402, which is rotated, to the plasma generation region 25. In this case, ΔXc is expressed by $\sin(F \cdot 2(\theta x - \theta x0))$. However, when the absolute value of $F \cdot 2(\theta x - \theta x0)$ is sufficiently small, $\sin(F \cdot 2(\theta x - \theta x0))$ can be approximated to $F \cdot 2(\theta x - \theta x0)$.

Subsequently at S7443, the EUV light generation control unit 5 moves the stage by ΔXc. When the stage is moved by ΔXc, the focusing point is moved by ΔXc, which compensates the focusing point change of −ΔXc due to the return of the mirror tilt angle to the initial value θx0.

Subsequently at S7444, the EUV light generation control unit 5 detects the light amount L of reflected light.

After S7444, the EUV light generation control unit 5 ends the processing of the present flowchart, and returns to the processing illustrated in FIG. 27. The light amount L of reflected light detected at S7444 is stored as the value Lp before movement in the storage unit (not illustrated) at S732 in FIG. 27.

10.3 Effect

According to the eighth embodiment, similarly to the sixth embodiment, the optical path axis control can be performed at high speed through rotation of the high reflectance mirror 402 by the actuator P3. However, when the optical path axis control is performed through rotation of the high reflectance mirror 402, aberration occurs at the focusing point and adversely affects focusing performance in some cases. Thus, when the tilt angle θx of the high reflectance mirror 402 exceeds a certain range, the tilt angle of the high reflectance mirror 402 is returned to the initial value θx0, and change of the focusing point due to the return of the tilt angle of the high reflectance mirror 402 to the initial value θx0 is compensated by stage control.

Figure 29:
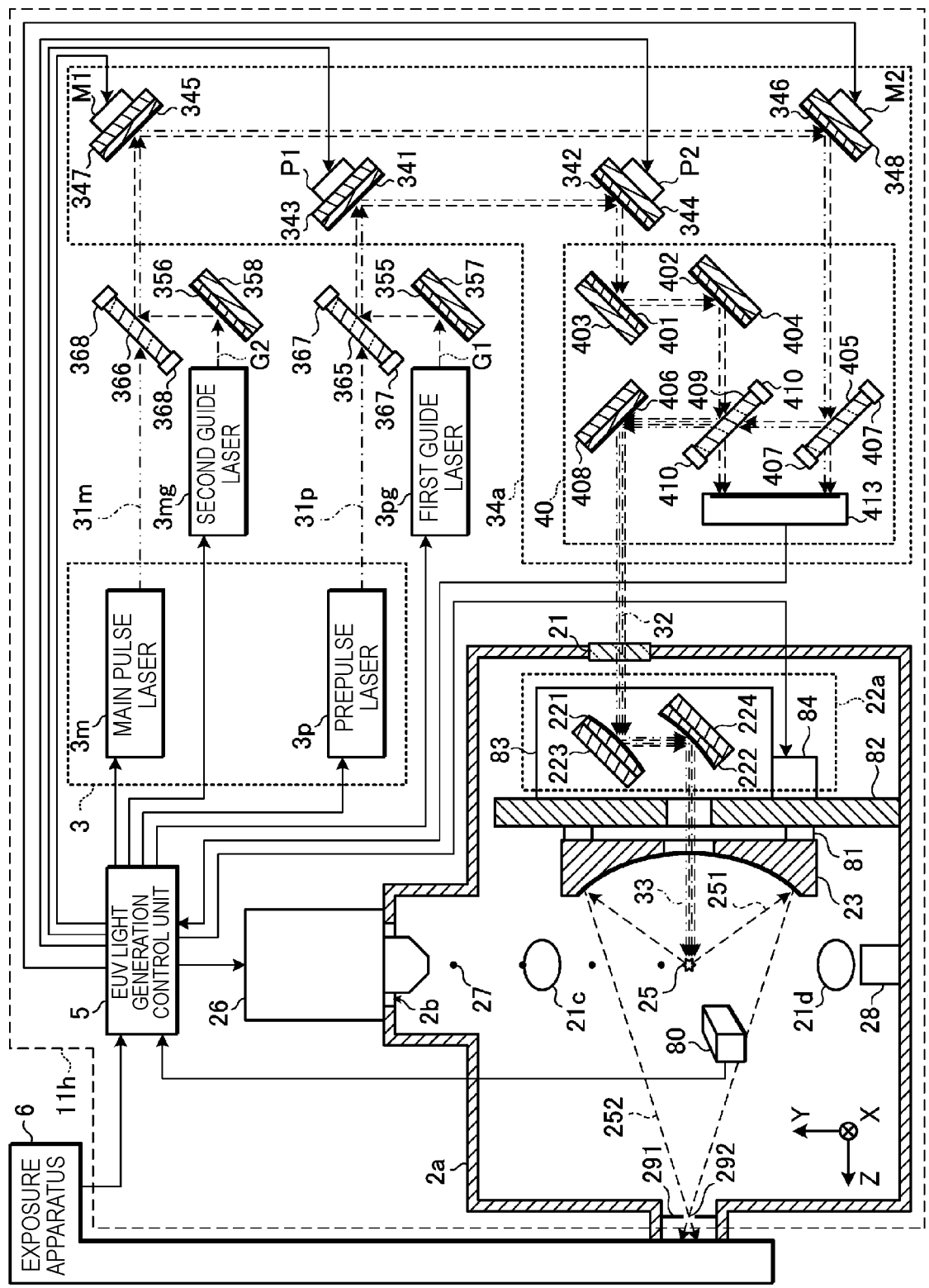
FIG. 29 is a partially cross-sectional view illustrating the configuration of an EUV light generation system 11h according to a ninth embodiment of the present disclosure.

11. EUV Light Generation System in which Decrease of Light Amount L of Reflected Light is Monitored 11.1 Configuration FIG. 29 is a partially cross-sectional view illustrating the configuration of an EUV light generation system 11h according to a ninth embodiment of the present disclosure. The ninth embodiment is different from the first embodiment in that the EUV light generation system 11h does not include the timer 51 in the configuration illustrated in FIG. 5. The other features of the ninth embodiment are same as those of the first embodiment. In the second to eighth embodiments, the same modification is possible with a configuration not including the timer 51.

11.2 Operation

Figure 30:
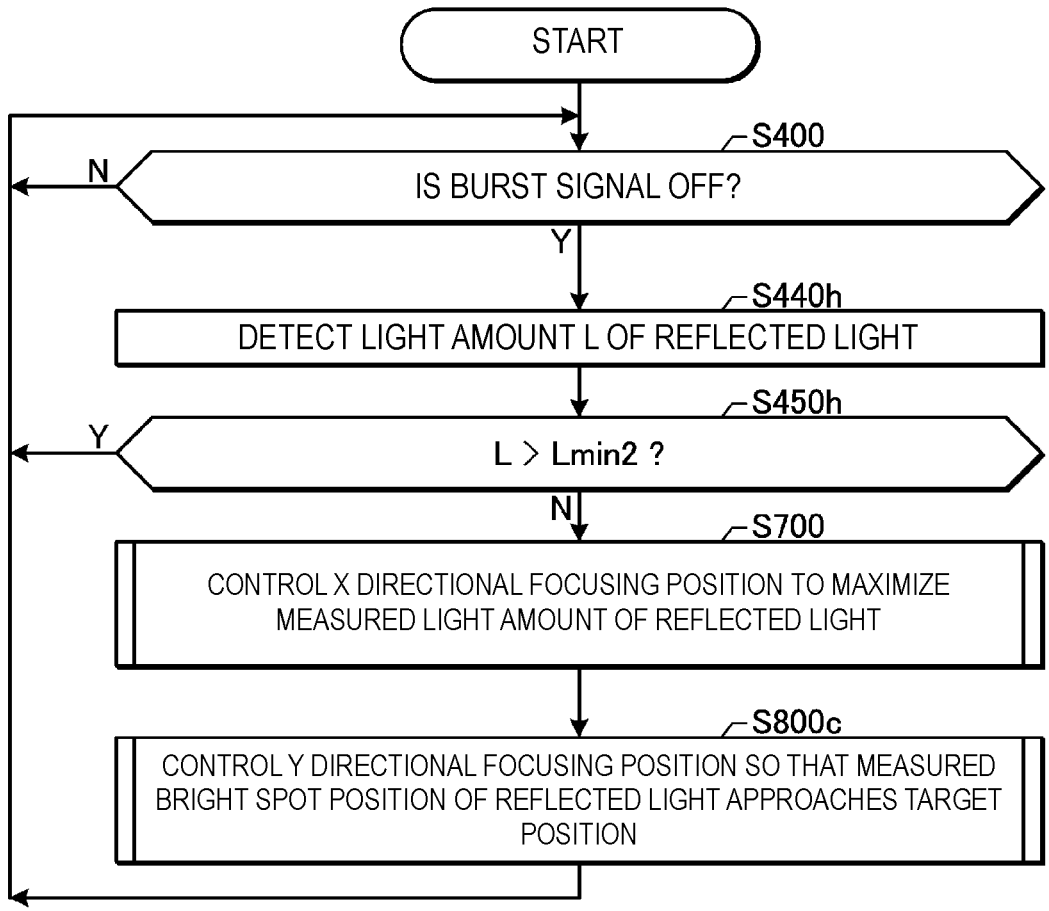
FIG. 30 is a flowchart illustrating the processing procedure of the optical path axis adjustment in the ninth embodiment.

FIG. 30 is a flowchart illustrating the processing procedure of the optical path axis adjustment in the ninth embodiment. The ninth embodiment is different from the first embodiment in that processing illustrated in FIG. 30 is performed in place of the processing illustrated in FIG. 7. The other features of the ninth embodiment are same as those of the first embodiment. In the second to eighth embodiments, the same modification is possible.

As illustrated in FIG. 30, first at S400, the EUV light generation control unit 5 determines whether the burst signal indicates the burst-off duration. When the burst signal does not indicate the burst-off duration (NO at S400), the EUV light generation control unit 5 waits for the burst-off duration. When the burst signal indicates the burst-off duration (YES at S400), the EUV light generation control unit 5 forwards the process to S440h.

At S440h, the EUV light generation control unit 5 detects the light amount L of reflected light. This processing is performed irrespective of elapsed time from the fall of the burst signal.

Subsequently at S450h, the EUV light generation control unit 5 determines whether the light amount L of reflected light is larger than the threshold Lmin2.

When the light amount L of reflected light is larger than the threshold Lmin2 (YES at S450h), the EUV light generation control unit 5 returns the process to S400.

When the light amount L of reflected light is equal to or smaller than the threshold Lmin2 (NO at S450h), the EUV light generation control unit 5 forwards the process to S700.

The processing at S700 is same as the corresponding processing in FIG. 7. However, since the light amount L of reflected light is already detected at S440h, the processing at S701a illustrated in FIG. 11 or FIG. 12 may be omitted at S700.

After S700, the EUV light generation control unit 5 forwards the process to S800c. The processing at S800c is same as that described with reference to FIG. 16 or FIG. 18.

After S800c, the EUV light generation control unit 5 returns the process to S400.

Alternatively, similarly to FIG. 7, the processing at S800c may be omitted. In this case, after S700, the EUV light generation control unit 5 returns the process to S400.

Figure 31:
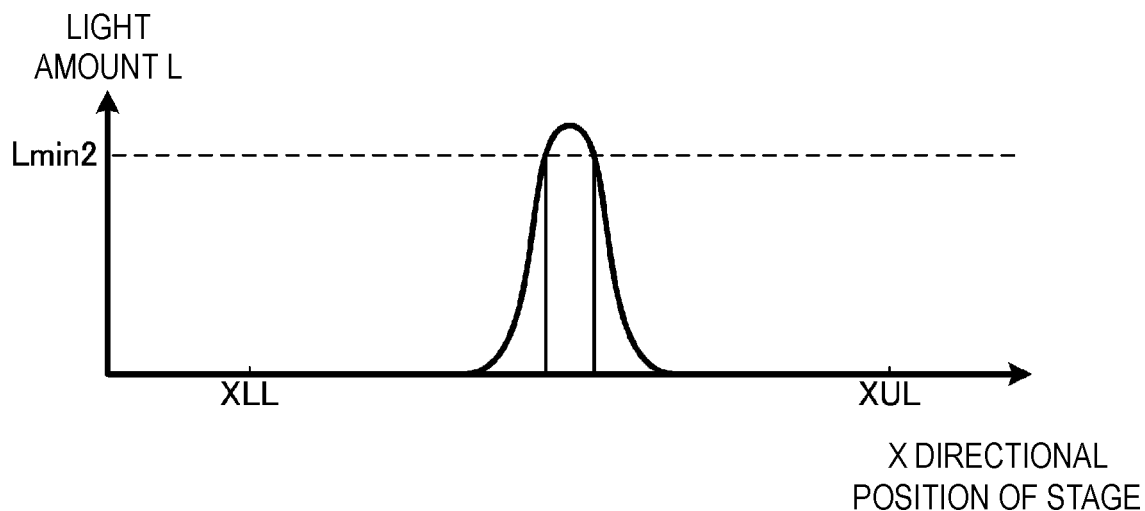
FIG. 31 is a diagram for description of processing of controlling the focusing position in the X direction in the ninth embodiment.

FIG. 31 is a diagram for description of processing of controlling the focusing position in the X direction in the ninth embodiment. In FIG. 31, the horizontal axis represents the X directional position of the stage, and the vertical axis represents the light amount L of reflected light.

When the light amount L of reflected light is larger than the threshold Lmin2 (YES at S450h in FIG. 30), the focusing position control is not performed, and monitoring of the light amount L of reflected light is continued.

When the light amount L of reflected light has become equal to or smaller than the threshold Lmin2 (NO at S450h in FIG. 30), the stage is controlled to maximize the light amount of reflected light (S700 in FIG. 30).

Figure 32:
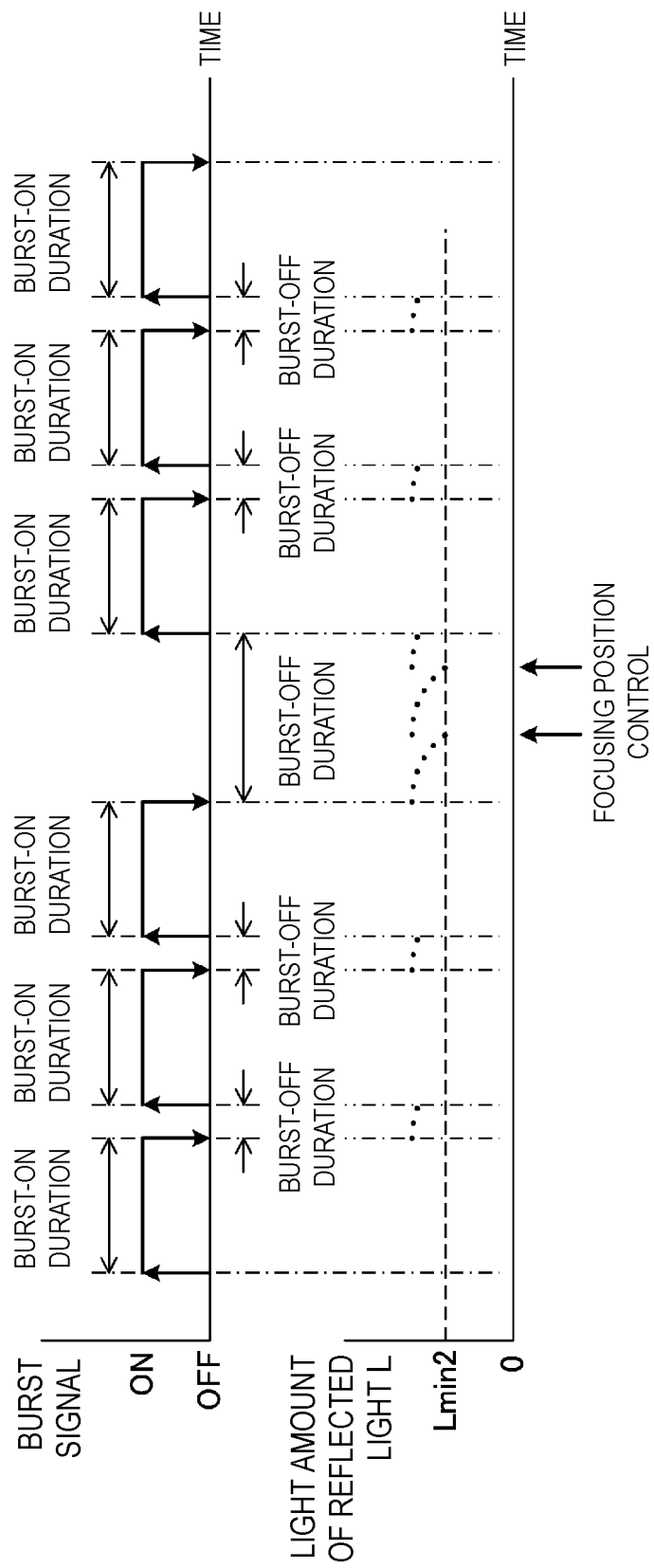
FIG. 32 is a timing chart of the optical path axis adjustment in the ninth embodiment.

FIG. 32 is a timing chart of the optical path axis adjustment in the ninth embodiment. The burst signal is same as that described with reference to FIG. 4. As illustrated in FIG. 32, when the burst signal switches to the burst-off duration (YES at S400 in FIG. 30), reflected light measurement is started. The light amount L of reflected light gradually decreases. When the burst-off duration is short, the burst-off duration ends before the light amount L of reflected light significantly decreases. When the burst-off duration is long, the light amount L of reflected light decreases to a value equal to or smaller than the threshold Lmin2 before the burst-off duration ends in some cases. When the light amount L of reflected light has become equal to or smaller than the threshold Lmin2 (S450h in FIG. 30), the focusing position control is performed (S700 in FIG. 30). The monitoring of the light amount L of reflected light is continued still after the focusing position control is performed. Each time the light amount L of reflected light becomes equal to or smaller than the threshold Lmin2 (S450h in FIG. 30), the focusing position control is performed (S700 in FIG. 30).

11.3 Effect

According to the ninth embodiment, in the burst-off duration, the focusing position control is performed each time the light amount L of reflected light becomes equal to or smaller than the threshold Lmin2, and thus the optical path axis is adjusted before the light amount L of reflected light significantly decreases. In addition, in the burst-off duration, the focusing position control is performed each time the light amount L of reflected light becomes equal to or smaller than the threshold Lmin2, and thus the optical path axis adjustment can be omitted when the light amount L of reflected light only slightly changes.

Figure 33:
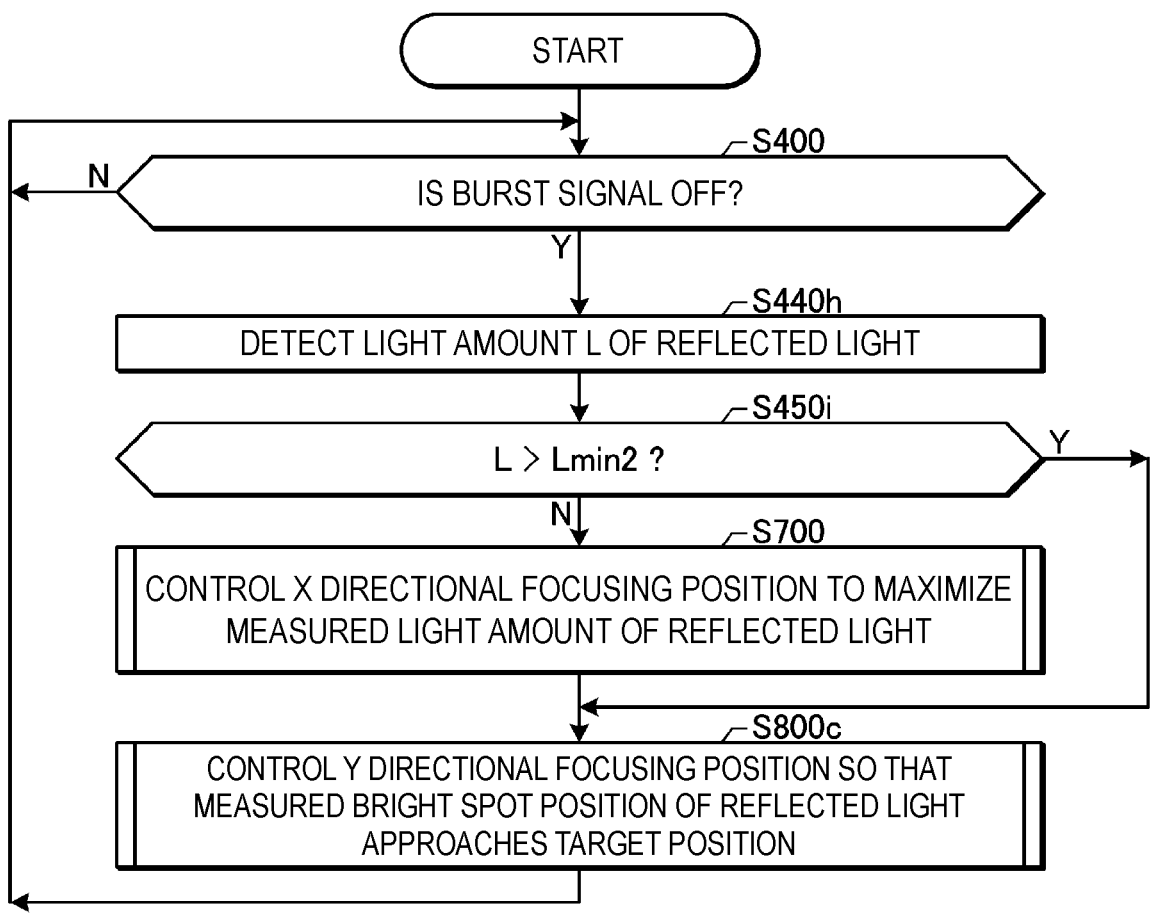
FIG. 33 is a flowchart illustrating the processing procedure of the optical path axis adjustment in a tenth embodiment.

12. EUV Light Generation System in which Focusing Position in Y Direction is Controlled when Control of Focusing Position in X Direction is Skipped 12.1 Main Process FIG. 33 is a flowchart illustrating the processing procedure of the optical path axis adjustment in a tenth embodiment. The tenth embodiment is different from the ninth embodiment in that processing illustrated in FIG. 33 is performed in place of the processing illustrated in FIG. 30.

The other features of the tenth embodiment are same as those of the ninth embodiment.

In FIG. 33, the contents of processing at steps S400 to S800c are same as the contents of processing at the steps in FIG. 30. However, at S450i in FIG. 33, when the light amount L of reflected light is larger than the threshold Lmin2 (YES at S450i), the EUV light generation control unit 5 forwards the process to S800c, instead of returning the process to S400.

12.2 Effect

According to the tenth embodiment, when the light amount L of reflected light is larger than the threshold Lmin2 and it is determined that the focusing position in the X direction is in a desired range, the process is forwarded to S800c to control the focusing position in the Y direction.

Figure 34:
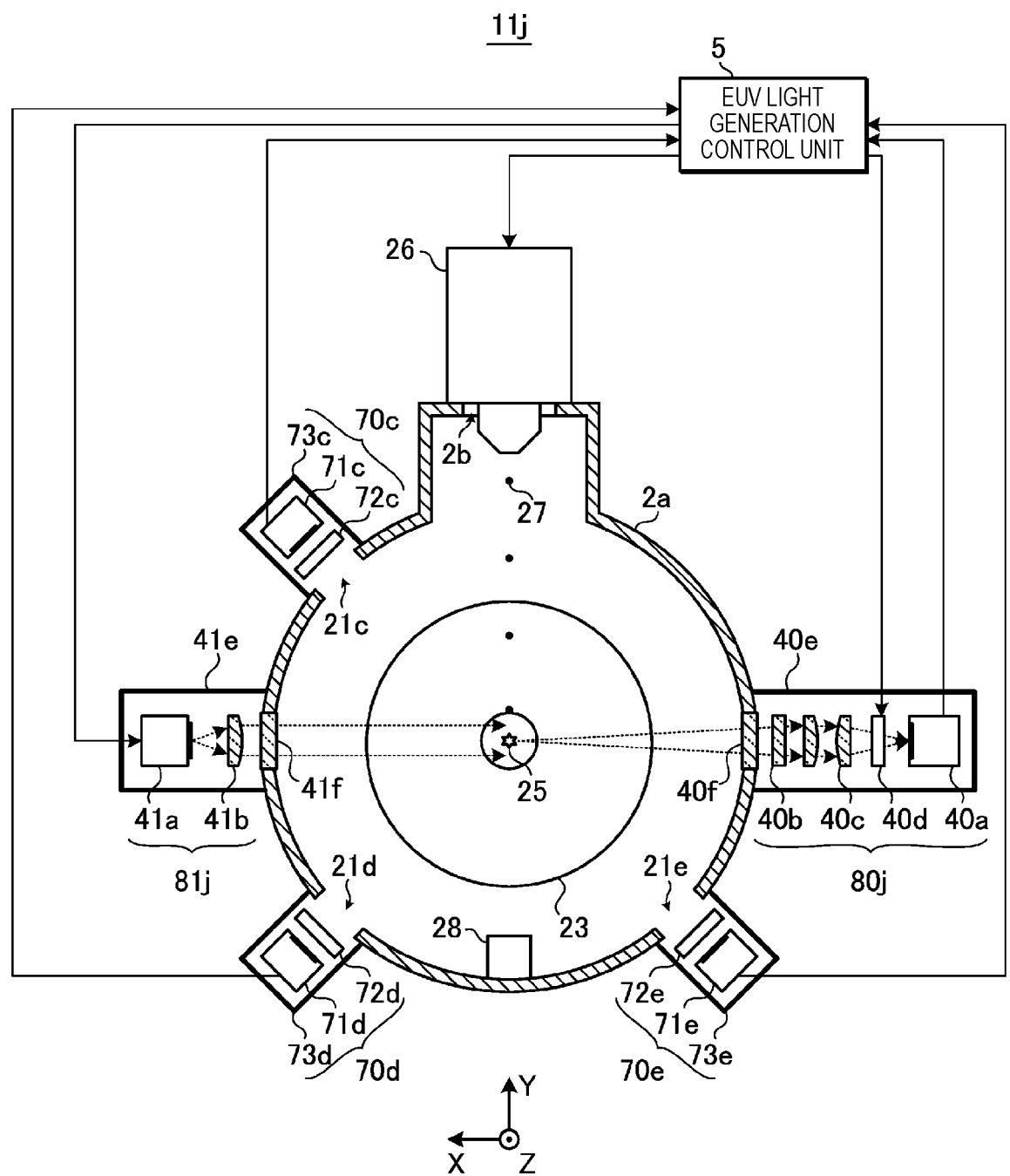
FIG. 34 is a partially cross-sectional view illustrating the configuration of an EUV light generation system 11j according to an eleventh embodiment of the present disclosure.

13. EUV Light Generation System in which Target Sensor Used in Burst-on Duration is Also Used as Optical Sensor Used in Burst-Off Duration 13.1 Configuration FIG. 34 is a partially cross-sectional view illustrating the configuration of an EUV light generation system 11j according to an eleventh embodiment of the present disclosure. In the eleventh embodiment, the EUV light generation system 11j includes an optical sensor 80j also used as a target sensor, and a light source unit 81j in addition to the configuration illustrated in FIG. 3. The other features of the eleventh embodiment are same as those of the ninth embodiment. In the first to eighth embodiments and the tenth embodiment, the same modification is possible with a configuration including the optical sensor 80j also used as a target sensor and the light source unit 81j.

The optical sensor 80j and the light source unit 81j are disposed on sides substantially opposite to each other with the plasma generation region 25 interposed therebetween.

The optical sensor 80j includes an image sensor 40a, an optical filter 40b, a transfer optical system 40c, an optical shutter 40d, and a housing 40e. The image sensor 40a, the optical filter 40b, the transfer optical system 40c, and the optical shutter 40d are housed in the housing 40e. A window 40f is disposed through the wall surface of the chamber 2a between the housing 40e and the chamber 2a.

The light source unit 81j includes a flash lamp 41a, an illumination optical system 41b, and a housing 41e. The flash lamp 41a and the illumination optical system 41b are housed in the housing 41e. A window 41f is disposed through the wall surface of the chamber 2a between the housing 41e and the chamber 2a.

13.2 Operation

In the light source unit 81j, the flash lamp 41a emits visible light based on a control signal from the EUV light generation control unit 5. The light emitted from the flash lamp 41a reaches the plasma generation region 25 through the illumination optical system 41b.

In the optical sensor 80j, the transfer optical system 40c forms an image of an object in the plasma generation region 25 on a light-receiving surface of the image sensor 40a. The image sensor 40a outputs data indicating light intensity distribution of the image formed on the light-receiving surface to the EUV light generation control unit 5 as image data. The optical shutter 40d opens and closes based on a control signal from the EUV light generation control unit 5.

In the burst-on duration, the optical sensor 80j can capture an image of the target 27 right before the target 27 having reached the plasma generation region 25 is irradiated with the prepulse laser beam 31p. In this case, the opening time of the optical shutter 40d is set to be, for example, in the order of nanoseconds. The flash lamp 41a is turned on at a timing overlapping with a timing at which the optical shutter 40d is opened.

Alternatively, the optical sensor 80j may capture an image of the secondary target before the target 27 having reached the plasma generation region 25 is irradiated with the main pulse laser beam 31m after irradiated with the prepulse laser beam 31p. In this case, too, the opening time of the optical shutter 40d is set to be, for example, in the order of nanoseconds.

Alternatively, the optical sensor 80j may capture an image of plasma after the secondary target in the plasma generation region 25 is irradiated with the main pulse laser beam 31m. In this case, too, the opening time of the optical shutter 40d is set to be, for example, in the order of nanoseconds.

In the burst-off duration, the optical sensor 80j can capture an image of the target 27 having reached the plasma generation region 25. In this case, the opening time of the optical shutter 40d is set to be, for example, in the order of microseconds. The flash lamp 41a is not turned on, and the optical sensor 80j detects reflected light of the first guide laser beam G1.

13.2.1 Main Process

Figure 35:
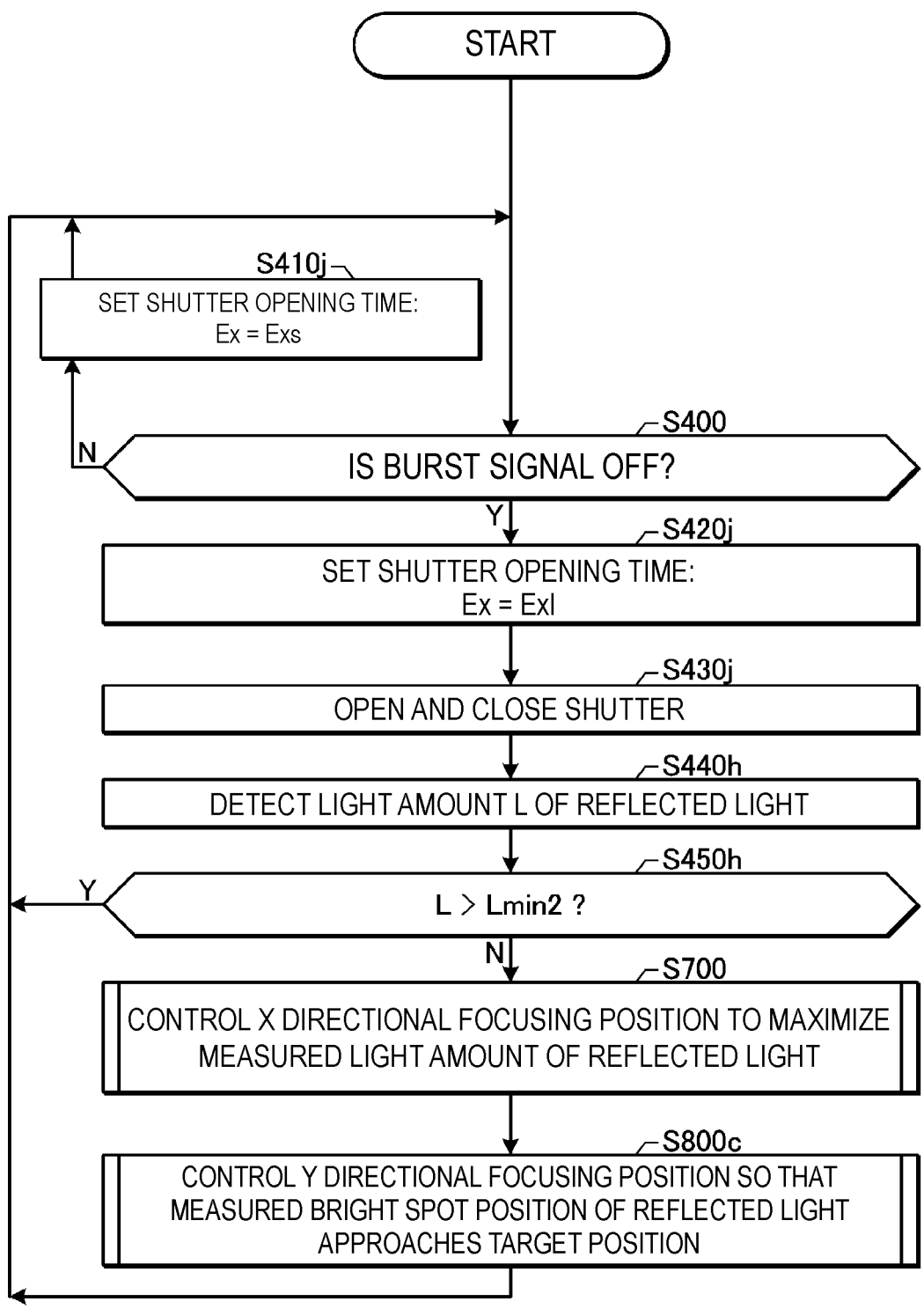
FIG. 35 is a flowchart illustrating the processing procedure of the optical path axis adjustment in the eleventh embodiment.

FIG. 35 is a flowchart illustrating the processing procedure of the optical path axis adjustment in the eleventh embodiment. The eleventh embodiment is different from the ninth embodiment in that processing illustrated in FIG. 35 is performed in place of the processing illustrated in FIG. 30. In the eleventh embodiment, a target image is captured in a short exposure time in the burst-on duration, and a target image is captured in a long exposure time in the burst-off duration. The other features of the eleventh embodiment are same as those of the ninth embodiment. In the first to eighth embodiments and the tenth embodiment, the same modification is possible with a changeable opening time of the optical shutter 40d.

In FIG. 35, processing at S400 is same as that described with reference to FIG. 30. At S400, when the burst signal does not indicate the burst-off duration (NO at S400), the EUV light generation control unit 5 forwards the process to S410j. When the burst signal indicates the burst-off duration (YES at S400), the EUV light generation control unit 5 forwards the process to S420j.

At S410j, the EUV light generation control unit 5 sets a shutter opening time Ex to be a shutter opening time Exs for the burst-on duration. After S410j, the EUV light generation control unit 5 returns the process to S400.

At S420j, the EUV light generation control unit 5 sets the shutter opening time Ex to be a shutter opening time Exl for the burst-off duration. The shutter opening time Exl is longer than the shutter opening time Exs. After S420j, the EUV light generation control unit 5 forwards the process to S430j.

At S430j, the EUV light generation control unit 5 opens and closes the optical shutter 40d in accordance with the setting of the shutter opening time Exl. Since the shutter opening time Exl is set to be long, weak reflected light of the first guide laser beam G1 can be detected by the image sensor 40a.

Processing at S440h and later after S430j is same as the corresponding processing in FIG. 30.

13.3 Effect

According to the eleventh embodiment, the target sensor used in the burst-on duration is also used as the optical sensor used in the burst-off duration, and thus the number of sensors attached to the wall surface of the chamber 2a is reduced. In addition, the opening time of the optical shutter is switchable, and thus different opening times can be appropriately used between the burst-on duration and the burst-off duration.

14. Supplementation

The above descriptions are intended to be illustrative only and not restrictive. Thus, it will be apparent to those skilled in the art that modifications may be made in the embodiments of the present disclosure without departing from the scope of the appended claims.

The terms used throughout the specification and the appended claims should be interpreted as "non-limiting." For example, the term "comprising" or "comprised" should be interpreted as "not limited to what has been described as being comprised." The term "having" should be interpreted as "not limited to what has been described as having". Further, the modifier "a/an" described in the specification and the appended claims should be interpreted to mean "at least one" or "one or more".

What is claimed is:

1. An extreme ultraviolet light generation system comprising:
    a target supply unit configured to output a target toward a predetermined region;
    a drive laser configured to output a drive laser beam in a duration in which a burst signal input from an external device is in a first state;
    a guide laser configured to output a guide laser beam;
    a beam combiner configured to substantially align an optical path axis of the drive laser beam output from the drive laser and an optical path axis of the guide laser beam output from the guide laser, and output the drive laser beam and the guide laser beam;
    a laser beam focusing optical system configured to focus the drive laser beam and the guide laser beam output from the beam combiner to the predetermined region;
    an actuator configured to change the focusing positions of the drive laser beam and the guide laser beam through the laser beam focusing optical system;
    an optical sensor configured to detect reflected light of the guide laser beam from the target; and
    a control unit configured to control the actuator so that the light amount of the reflected light detected by the optical sensor increases in a duration in which the burst signal is in a second state different from the first state.

2. The extreme ultraviolet light generation system according to claim 1, wherein the optical sensor detects the reflected light reflected in a direction different from the optical path axis of the guide laser beam output from the laser beam focusing optical system.

3. The extreme ultraviolet light generation system according to claim 1, wherein the control unit controls the actuator to move the focusing positions of the drive laser beam and the guide laser beam in a direction across a trajectory of the target.

4. The extreme ultraviolet light generation system according to claim 3, wherein
    the optical sensor includes a transfer optical system and an image sensor, and
    the control unit detects a light emission position of the reflected light based on a result of detection by the image sensor and controls the actuator based on the light emission position.

5. The extreme ultraviolet light generation system according to claim 4, wherein the control unit controls the actuator to move the focusing positions of the drive laser beam and the guide laser beam in a direction along the trajectory of the target based on the light emission position.

6. The extreme ultraviolet light generation system according to claim 1, wherein
    the optical sensor includes a transfer optical system and an image sensor, and
    the control unit
        controls the actuator so that the light amount of the reflected light detected by the image sensor increases, and then
        detects a light emission position of the reflected light based on a result of detection by the image sensor, and controls the actuator based on the light emission position.

7. The extreme ultraviolet light generation system according to claim 1, wherein the control unit
    controls the actuator to move, in a direction across a trajectory of the target, the optical path axis of the drive laser beam output from the laser beam focusing optical system and the optical path axis of the guide laser beam output from the laser beam focusing optical system, and then
    controls the actuator to move, in a direction along the trajectory of the target, the optical path axis of the drive laser beam output from the laser beam focusing optical system and the optical path axis of the guide laser beam output from the laser beam focusing optical system.

8. The extreme ultraviolet light generation system according to claim 1, wherein the actuator is configured to change the optical path axis of the drive laser beam emitted from the laser beam focusing optical system and the optical path axis of the guide laser beam emitted from the laser beam focusing optical system.

9. The extreme ultraviolet light generation system according to claim 1, wherein the actuator includes a stage configured to move a position of the laser beam focusing optical system.

10. The extreme ultraviolet light generation system according to claim 1, wherein the actuator is configured to change the optical path axis of the drive laser beam incident on the laser beam focusing optical system and the optical path axis of the guide laser beam incident on the laser beam focusing optical system.

11. The extreme ultraviolet light generation system according to claim 1, wherein the actuator is configured to change posture of mirrors disposed on an optical path of the drive laser beam and an optical path of the guide laser beam between the beam combiner and the laser beam focusing optical system.

12. The extreme ultraviolet light generation system according to claim 1, wherein the control unit controls the actuator a plurality of times until the burst signal returns to the first state after the burst signal comes into the second state from the first state.

13. The extreme ultraviolet light generation system according to claim 1, wherein the control unit controls the actuator in a predetermined cycle until the burst signal returns to the first state after the burst signal comes into the second state from the first state.

14. The extreme ultraviolet light generation system according to claim 1, wherein the control unit controls the actuator each time the light amount of the reflected light detected by the optical sensor becomes smaller than a predetermined value until the burst signal returns to the first state after the burst signal comes into the second state from the first state.

15. The extreme ultraviolet light generation system according to claim 1, wherein the optical sensor includes a transfer optical system and an image sensor, and the optical sensor captures an image of the target in a first exposure time in a duration in which the burst signal is in the first state, and captures an image of the target in a second exposure time longer than the first exposure time in a duration in which the burst signal is in the second state.

* * * * *